US011616498B2

United States Patent
Cohen et al.

(10) Patent No.: US 11,616,498 B2
(45) Date of Patent: Mar. 28, 2023

(54) SOFTWARE-DEFINED PULSE ORCHESTRATION PLATFORM

(71) Applicant: Quantum Machines, Tel Aviv (IL)

(72) Inventors: Yonatan Cohen, Tel Aviv (IL); Nissim Ofek, Tel Aviv (IL); Itamar Sivan, Tel Aviv (IL); Tal Shani, Tel Aviv (IL)

(73) Assignee: Quantum Machines

( * ) Notice: Subject to any disclaimer, the term of this patent is extended or adjusted under 35 U.S.C. 154(b) by 0 days.

(21) Appl. No.: 17/575,862

(22) Filed: Jan. 14, 2022

(65) Prior Publication Data

US 2022/0140820 A1    May 5, 2022

Related U.S. Application Data

(63) Continuation of application No. 17/227,881, filed on Apr. 12, 2021, now Pat. No. 11,245,390, which is a
(Continued)

(51) Int. Cl.
*H03K 3/38* (2006.01)
*G06N 3/04* (2023.01)
(Continued)

(52) U.S. Cl.
CPC .............. *H03K 3/38* (2013.01); *G06N 3/04* (2013.01); *G06N 10/00* (2019.01); *H03K 19/195* (2013.01)

(58) Field of Classification Search
CPC ........ H03K 3/38; H03K 19/195; G06N 10/00; G06N 3/04
See application file for complete search history.

(56) References Cited

U.S. PATENT DOCUMENTS 4,875,484 A    10/1989  Anzai et al.
6,993,108 B1    1/2006  Chi et al.
(Continued)

FOREIGN PATENT DOCUMENTS

CN    105281886 A    1/2016
CN    105912070 A    8/2016
(Continued)

OTHER PUBLICATIONS

Int'l Search Report and Written Opinion Appln No. PCT/IB2022/000059 dated Jul. 7, 2022.
(Continued)

*Primary Examiner* — Jung Kim
(74) *Attorney, Agent, or Firm* — McAndrews Held & Malloy, Ltd.

(57) ABSTRACT

A system comprises pulse program compiler circuitry operable to analyze a pulse program that includes a pulse operation statement, and to generate, based on the pulse program, machine code that, if loaded into a pulse generation and measurement circuit, configures the pulse generation and measurement circuit to generate one or more pulses and/or process one or more received pulses. The pulse operation statement may specify a first pulse to be generated, and a target of the first pulse. The pulse operation statement may specify parameters to be used for processing of a return signal resulting from transmission of the first pulse. The pulse operation statement may specify an expression to be used for processing of the first pulse by the pulse generation and measurement circuit before the pulse generation and measurement circuit sends the first pulse to the target.

40 Claims, 20 Drawing Sheets

Related U.S. Application Data continuation-in-part of application No. 17/095,944, filed on Nov. 12, 2020, now Pat. No. 11,115,012, which is a continuation of application No. 16/777,480, filed on Jan. 30, 2020, now Pat. No. 10,958,253.

(60) Provisional application No. 62/894,905, filed on Sep. 2, 2019.

(51) Int. Cl.
*G06N 10/00* (2022.01)
*H03K 19/195* (2006.01)

(56) References Cited

U.S. PATENT DOCUMENTS

| | | |
|---|---|---|
| 7,451,292 B2 | 11/2008 | Routt |
| 7,627,126 B1 | 12/2009 | Pikalo |
| 8,315,969 B2 | 11/2012 | Roetteler |
| 8,385,878 B2 | 2/2013 | Rao |
| 8,750,717 B1 | 6/2014 | Yap et al. |
| 9,207,672 B2 | 12/2015 | Williams |
| 9,400,499 B2 | 7/2016 | Williams |
| 9,509,324 B2 | 11/2016 | McDonald et al. |
| 9,692,423 B2 | 6/2017 | McDermott, III |
| 9,847,121 B2 | 12/2017 | Frank |
| 9,858,531 B1 | 1/2018 | Monroe |
| 9,892,365 B2 | 2/2018 | Rigetti |
| 9,978,020 B1 | 5/2018 | Gambetta |
| 9,979,400 B1 | 5/2018 | Sete |
| 9,996,801 B2 | 6/2018 | Shim |
| 10,063,228 B2 | 8/2018 | Deurloo et al. |
| 10,122,351 B1 | 11/2018 | Naaman |
| 10,127,499 B1 | 11/2018 | Rigetti |
| 10,192,168 B2 | 1/2019 | Rigetti |
| 10,223,643 B1 | 3/2019 | Bishop et al. |
| 10,333,503 B1 | 6/2019 | Cohen et al. |
| 10,454,459 B1 | 10/2019 | Cohen |
| 10,496,069 B2 | 12/2019 | Nazarathy et al. |
| 10,505,524 B1 | 12/2019 | Cohen |
| 10,560,076 B1 | 2/2020 | Cohen |
| 10,637,449 B1 | 4/2020 | Cohen et al. |
| 10,659,018 B1 | 5/2020 | Cohen |
| 10,666,238 B1 | 5/2020 | Cohen |
| 10,958,253 B1 | 3/2021 | Cohen et al. |
| 10,985,739 B2 | 4/2021 | Cohen et al. |
| 11,010,145 B1 | 5/2021 | Smith et al. |
| 2004/0266084 A1 | 12/2004 | Fujishima et al. |
| 2005/0180575 A1 | 8/2005 | Maeda et al. |
| 2006/0093376 A1 | 5/2006 | Mitchell et al. |
| 2016/0125311 A1 | 5/2016 | Fuechsle et al. |
| 2016/0267032 A1 | 9/2016 | Rigetti et al. |
| 2016/0292586 A1 | 10/2016 | Rigetti et al. |
| 2017/0214410 A1 | 7/2017 | Hincks et al. |
| 2017/0364796 A1 | 12/2017 | Wiebe |
| 2018/0013426 A1 | 1/2018 | Deurloo et al. |
| 2018/0032893 A1 | 2/2018 | Epstein |
| 2018/0091244 A1 | 3/2018 | Abdo |
| 2018/0123597 A1 | 5/2018 | Sete |
| 2018/0260245 A1 | 9/2018 | Smith |
| 2018/0260730 A1 | 9/2018 | Reagor |
| 2018/0260732 A1 | 9/2018 | Bloom |
| 2018/0308007 A1 | 10/2018 | Amin |
| 2018/0322409 A1 | 11/2018 | Barends |
| 2018/0365585 A1 | 12/2018 | Smith |
| 2018/0373995 A1 | 12/2018 | Tomaru et al. |
| 2018/0375650 A1 | 12/2018 | Legre |
| 2019/0042964 A1 | 2/2019 | Elsherbini et al. |
| 2019/0042965 A1 | 2/2019 | Clarke |
| 2019/0042970 A1 | 2/2019 | Zou |
| 2019/0042971 A1 | 2/2019 | Zou |
| 2019/0042972 A1 | 2/2019 | Zou |
| 2019/0042973 A1 | 2/2019 | Zou |
| 2019/0049495 A1 | 2/2019 | Ofek |
| 2019/0251478 A1 | 8/2019 | Bishop et al. |
| 2019/0385088 A1 | 12/2019 | Naaman et al. |
| 2020/0364602 A1 | 11/2020 | Niu et al. |
| 2021/0004707 A1 | 1/2021 | Gambetta et al. |
| 2021/0103847 A1 | 4/2021 | Akzam |

FOREIGN PATENT DOCUMENTS

| | | |
|---|---|---|
| CN | 108111306 A | 6/2018 |
| CN | 110085094 A | 8/2019 |
| CN | 111464154 | 7/2020 |
| CN | 111767055 A | 10/2020 |
| CN | 112019193 | 12/2020 |
| CN | 112149832 A | 12/2020 |
| JP | 2011175078 A | 9/2011 |
| WO | 2015178991 A2 | 11/2015 |
| WO | 2015178992 A2 | 11/2015 |
| WO | 2017078735 A1 | 5/2017 |
| WO | 2017139683 A1 | 8/2017 |
| WO | 2018062991 A1 | 4/2018 |
| WO | 2019063117 A1 | 4/2019 |
| WO | 2020033807 A1 | 2/2020 |
| WO | 2020231795 A1 | 11/2020 |

OTHER PUBLICATIONS

Moreira, "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).

Int'l Preliminary Report on Patentability Appln No. PCT/IB2020/001004 dated Jun. 30, 2022.

Int'l Preliminary Report on Patentability Appln No. PCT/IB2020/000555 dated Feb. 10, 2022.

Int'l Preliminary Report on Patentability Appln No. PCT/IB2020/000707 dated Mar. 17, 2022.

Int'l Preliminary Report on Patentability Appln No. PCT/IB2020/000704 dated Mar. 17, 2022.

Int'l Preliminary Report on Patentability Appln No. PCT/IB2020/000760 dated Apr. 7, 2022.

Int'l Search Report and Written Opinion Appln No. PCT/IB2022/050190 dated Apr. 11, 2022.

Int'l Search Report and Written Opinion Appln No. PCT/IB2022/000024 dated Jul. 18, 2022.

Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).

Int'l Search Report and Written Opinion Appln No. PCT/IB2022/000068 dated Jul. 17, 2022.

D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).

U.S. Appl. No. 62/294,966, filed Feb. 12, 2016.

Int'l Search Report and Written Opinion Appln No. PCT/IB2019/001410 dated Jun. 10, 2020.

Int'l Search Report and Written Opinion Appln No. PCT/IB2019/001394 dated Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.

Int'l Search Report and Written Opinion Appln No. PCT/IB2020/000218 dated Aug. 11, 2020.

Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).

(56) References Cited

OTHER PUBLICATIONS

Int'l Search Report and Written Opinion Appln No. PCT/IB2020/000376 dated Sep. 17, 2020.
Breitfelder et al. eds., IEEE 100: The Authoritative Dictionary of IEEE Standards Terms 1247, definition 2 of "variable" (7th ed. 2000) (Year: 2000).
Int'l Search Report and Written Opinion Appln No. PCT/IB2020/000707 dated Jan. 12, 2021.
National Academies of Sciences, Engineering, and Medicine. "Quantum Computing: Progress and Prospects", eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4 , pp. 30, 57.
IBM Research. "Qiskit Backend Specifications for OpenQASM and OpenPulse Experiments". eprint arXiv:1809.03452v1 (Sep. 10, 2018) [online], [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 dated Jan. 17, 2021.
Wolfowicz, et al. Pulse Techniques for Quantum Information Processing University of Chicago, University College London, eMagRes, 2016, vol. 5: 1515-1528. DOI 10.1002/9780470034590.emrstm1521.
Int'l Search Report and Written Opinion Appln No. PCT/IB2020/000555 dated Dec. 27, 2020.
Int'l Search Report and Written Opinion Appln No. PCT/IB2020/000760 dated Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: <https://arxiv.org/pdf/1710.04645.pdf> McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 dated May 13, 2021.
Int'l Preliminary Report on Patentability Appln No. PCT/IB2019/001410 dated Jun. 10, 2021.
Int'l Search Report and Written Opinion Appln No. PCT/IB2021/000067 dated Jun. 21, 2021.
Int'l Preliminary Report on Patentability Appln No. PCT/IB2019/001394 dated Jul. 29, 2021.
Int'l Preliminary Report on Patentability Appln No. PCT/IB2020/000218 dated Sep. 16, 2021.
Int'l Preliminary Report on Patentability Appln No. PCT/IB2020/000376 dated Nov. 12, 2021.
Int'l Search Report and Written Opinion Appln No. PCT/IB2021/056254 dated Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).

```
config = {
  'version': 1,

'controllers': {
    'con1': {
      'type': 'opx1',
      'analog': {
        1: {'offset': 0.032},
        2: {'offset': 0.041},
        3: {'offset': -0.024},
        4: {'offset': 0.115},
      }
    }
  }, 'elements': {
    'qubit': {
      'mixInputs': {
        'I': ('con1', 1),
        'Q': ('con1', 2),
        'lo_frequency': 5.10e9,
        'mixer': 'mixer_qubit'
      },
      'frequency': 5.15e9,
      'operations': {
        'gauss_pulse': 'gauss_pulse_in'
      },
    },
    'RR': {
      'mixInputs': {
        'I': ('con1', 3),
        'Q': ('con1', 4),
        'lo_frequency': 6.00e9,
        'mixer': 'mixer_res'
      },
      'frequency': 6.12e9,
      'operations': {
        'meas_pulse': 'meas_pulse_in',
      },
      'time_of_flight': 180,
      'smearing': 0,
      'outputs': {
        'out1': ('con1', 1)
      }
    },
  },
```

FIG. 10A (continued on 10B)

(continued from FIG. 10A)

○
○
○

```
'pulses': {
  'meas_pulse_in': {
    'operation': 'measurement',
    'length': 200,
    'waveforms': {
      'I': 'exc_wf',
      'Q': 'zero_wf'
    },
    'integration_weights': {
      'integW1': 'integW1',
      'integW2': 'integW2',
    },
    'digital_marker': 'marker1'
  },
  'gauss_pulse_in': {
    'operation': 'control',
    'length': 20,
    'waveforms': {
      'I': 'gauss_wf',
      'Q': 'zero_wf'
    },
  }
}, 'waveforms': {
  'zero_wf': {
    'type': 'constant',
    'sample': 0.0
  },
  'gauss_wf': {
    'type': 'arbitrary',
    'samples':
[0.005387955348880817, 0.0132192340838949 3,
    0.029354822126316085, 0.05899983936462147,
    0.1073243676380 2927, 0.1767030571463228,
    0.2633180579359862, 0.3551469410699 4277,
    0.4335372000145 3067, 0.479, 0.479,
    0.4335372000145308, 0.3551469410699429,
    0.2633180579359864 5, 0.1767030571463229 2,
    0.10732436763802936, 0.05899983936462152,
    0.029354822126316085, 0.01321923408389493,
    0.005387955348880817]
  }
},
```

FIG. 10B (continued from FIG. 10B)

⋮

```
'digital_waveforms': {
    'marker1': {
        'samples': [(1, 4), (0, 2), (1, 1), (1, 0)]
    }
}, 'integration_weights': {
    'integW1': {
        'cosine': [4.0, 4.0, 4.0, 4.0, 4.0, 4.0, 4.0,
                   4.0, 4.0, 4.0, 4.0, 4.0, 4.0, 4.0,
                   4.0, 4.0, 4.0, 4.0, 4.0, 4.0, 4.0,
                   4.0, 4.0, 4.0, 4.0, 4.0, 4.0],
        'sine': [0.0, 0.0, 0.0, 0.0, 0.0, 0.0, 0.0,
                 0.0, 0.0, 0.0, 0.0, 0.0, 0.0, 0.0,
                 0.0, 0.0, 0.0, 0.0, 0.0, 0.0, 0.0,
                 0.0, 0.0, 0.0, 0.0, 0.0, 0.0]
    },
    'integW2': {
        'cosine': [0.0, 0.0, 0.0, 0.0, 0.0, 0.0, 0.0,
                   0.0, 0.0, 0.0, 0.0, 0.0, 0.0, 0.0,
                   0.0, 0.0, 0.0, 0.0, 0.0, 0.0, 0.0,
                   0.0, 0.0, 0.0, 0.0, 0.0, 0.0],
        'sine': [4.0, 4.0, 4.0, 4.0, 4.0, 4.0, 4.0,
                 4.0, 4.0, 4.0, 4.0, 4.0, 4.0, 4.0,
                 4.0, 4.0, 4.0, 4.0, 4.0, 4.0, 4.0,
                 4.0, 4.0, 4.0, 4.0, 4.0, 4.0]
    }
}, 'mixers': {
    'mixer_res': [
        {'freq': 6.12e9, 'lo_freq': 6.00e9, 'correction': [1.0, 0.0, 0.0, 1.0]}
    ],
    'mixer_qubit': [
        {'freq': 5.15e9, 'lo_freq': 5.10e9, 'correction': [1.0, 0.0, 0.0, 1.0]}
    ]
}
}
```

FIG. 10C

SOFTWARE-DEFINED PULSE ORCHESTRATION PLATFORM

PRIORITY CLAIM

The present application is a continuation of U.S. application Ser. No. 17/227,881, filed Apr. 12, 2021, which is a continuation-in-part of U.S. application Ser. No. 17/095,944, filed Nov. 12, 2020, now U.S. Pat. No. 11,115,012, which is a continuation of U.S. application Ser. No. 16/777,480, filed Jan. 30, 2020, now U.S. Pat. No. 10,958,253, which makes reference to, claims priority to, and claims benefit from provisional patent application 62/894,905 filed Sep. 2, 2019. The aforementioned applications are hereby incorporated herein by reference in their entirety.

BACKGROUND

Limitations and disadvantages of conventional approaches to pulse generation systems will become apparent to one of skill in the art, through comparison of such approaches with some aspects of the present method and system set forth in the remainder of this disclosure with reference to the drawings.

BRIEF SUMMARY

Methods and systems are provided for a software-defined pulse orchestration platform, substantially as illustrated by and/or described in connection with at least one of the figures, as set forth more completely in the claims.

BRIEF DESCRIPTION OF THE DRAWINGS

FIGS. 10A-10C show an example quantum machine specification.

DETAILED DESCRIPTION

Figure 1:
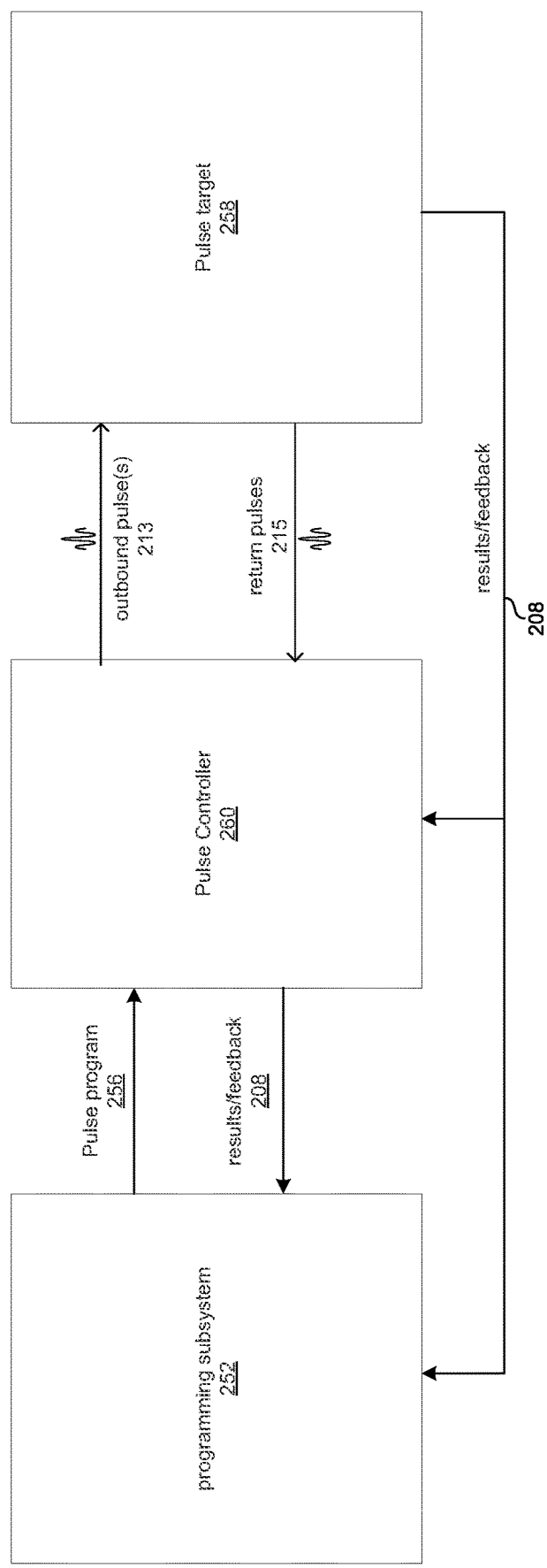
FIG. 1 shows an example pulse orchestration platform.

FIG. 1 shows a pulse orchestration platform. The system comprises a programming subsystem 252, a pulse controller 260, and a pulse target 258.

The programming subsystem 252 comprises circuitry operable to generate pulse program description 256 which configures the pulse controller 260 and includes instructions the pulse controller 260 can execute to carry out the pulse program (i.e., generate the necessary outbound pulse(s) 253, process feedback generated in response to the pulse(s) and received via channel 208, and/or process inbound pulses 215) with little or no human intervention during runtime. In an example implementation, the programming subsystem 252 is a personal computer comprising a processor, memory, and other associated circuitry (e.g., an x86 or x64 chipset) having installed on it a pulse orchestration software development kit (SDK) that enables creation (e.g., by a user via a text editor, integrated development environment (IDE), and/or by automated pulse program description generation circuitry) of a high-level (as opposed to binary or "machine code") pulse program description 256. In an example implementation, the high-level pulse program description uses a high-level programming language (e.g., Python, R, Java, Matlab, etc.) simply as a "host" programming language in which are embedded the programming constructs for generating the pulse program description to be loaded into pulse controller 260.

The high-level pulse program description 256 may comprise a specification (an example of which is shown in FIGS. 10A-10C) and a program (an example program for a Power Rabi calibration is discussed below). Although the specification and program may be part of one or more larger databases and/or contained in one or more files, and one or more formats, the remainder of this disclosure will, for simplicity of description, assume the configuration data structure and the program data structure each takes the form of a plain-text file recognizable by an operating system (e.g., windows, Linux, Mac, or another OS) on which programming subsystem 252 runs. The programming subsystem 252 then compiles the high-level pulse program description 256 to a machine code version of the pulse program description 256 (i.e., series of binary vectors that represent instructions that the hardware of the pulse controller 260 can interpret and execute directly).

The programming subsystem 252 communicates with the pulse controller 260 using, for example, utilize universal serial bus (USB), peripheral component interconnect (PCIe) bus, wired or wireless Ethernet, or any other suitable communication protocol. The pulse controller 260 comprises circuitry operable to load the machine code pulse program description 256 from the programming subsystem 252. Then, execution of the machine code by the pulse controller 260 causes the pulse controller 260 to generate the corresponding outbound pulse(s) 213 and/or process return pulses 215. Depending on the pulse program to be performed, characteristics of generated outbound pulse(s) 213, and/or of processing to be performed on return pulses 215, may be predetermined at design time and/or may be determined during runtime. The runtime determination of the outbound pulses characteristics and/or inbound pulse processing may comprise performance of calculations and processing in the pulse controller 260 and/or the programing subsystem 252 during runtime of the pulse program (e.g., runtime analysis of inbound pulses 215 and/or feedback/results information received from the pulse target 258).

During runtime and/or upon completion of a pulse program performed by the pulse controller 260, the pulse controller 260 may output data/results 208 to the programming subsystem 252. In an example implementation, these results may be used to generate a new pulse program description 256 for a subsequent run of the pulse program and/or update the pulse program description during runtime.

The pulse controller 260 may comprise a plurality of interconnected, but physically distinct pulse control modules (e.g., each module being a desktop or rack mounted device) such that pulse control systems requiring relatively fewer resources can be realized with relatively fewer pulse control modules, and pulse control systems requiring relatively more resources can be realized with relatively more pulse control modules.

The target 258 can be any system with which it is desired to interact via one or more pulses. One example is where the pulse target 258 is a quantum processor. But of course there are many other types of systems where generation and processing of pulses, as enabled by the programming subsystem 252 and pulse controller 260, is advantageous.

Another example is where the pulses 213 are radar pulses, the return pulses 215 are reflections of the pulses 213, and the target 258 is an object or environment to be characterized based on characteristics of reflections 215.

Another example is where the pulse target 258 is a device or a system whose response to a pulse or series of pulses is to be tested. For example, the pulse target 258 may be a wired, wireless, or optical receiver and it is desired to test the receiver's response/performance for various pulses or pulse sequences (e.g., the pulses could be representative of desired signals and/or undesired interferers the receiver may encounter in operation). In this case, the results/feedback channel 208 may provide (to the programming subsystem 252 and/or pulse controller 260) information about the response/performance of the pulse target 258 to the pulse(s) 213, and further pulses/testing may take such feedback into account.

For clarity of description, the quantum computing use case is the one primarily used in the remainder of this disclosure. But the use of quantum-specific terminology does not limit the applicability of the concepts described in this disclosure to other use cases such as the radar and device test use cases described above. For example, references to "a quantum element" could be replaced with references to "a target," references to a "quantum machine specification" could be replaced with "machine specification," references to a "quantum controller" could be replaced with references to a "pulse controller", references to "a quantum programming subsystem" could be replaced with references to a "programming subsystem," and so on.

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Figure 2A:
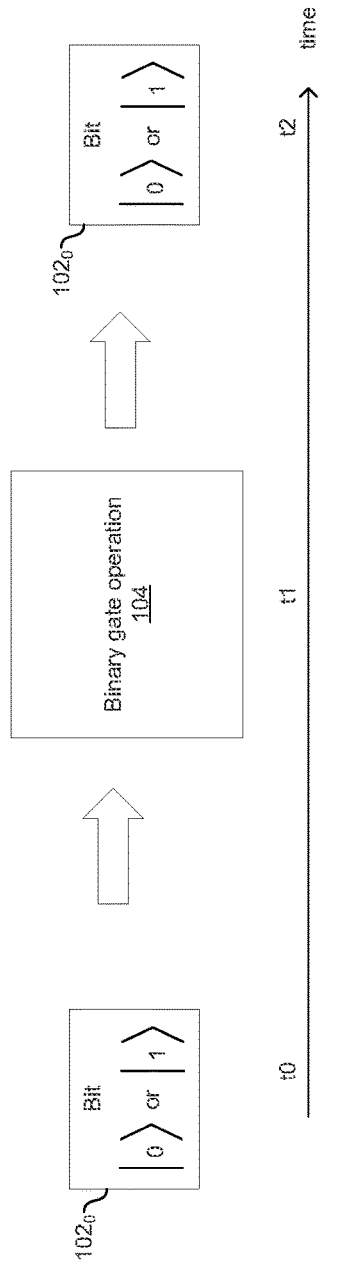
FIGS. 2A and 2B compare some aspects of classical (binary) computing and quantum computing.

Shown in FIG. 2A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1 Vdc or 0 Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle + \beta|1\rangle$ where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors $$\begin{bmatrix} 1 \\ 0 \end{bmatrix} \text{ and } \begin{bmatrix} 0 \\ 1 \end{bmatrix},$$

respectively, and then the qubit state is represented by $$\begin{bmatrix} \alpha \\ \beta \end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Figure 2B:
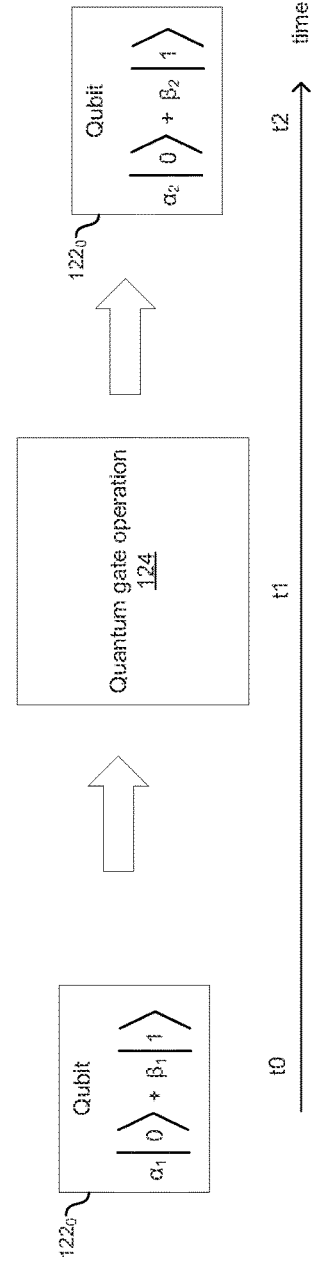

Shown in FIG. 2B is a simple example of a quantum computer configured to store a qubit 122 and apply a single quantum gate operation 124 to the qubit 122. At time t0 the qubit 122 is described by $\alpha_1|0\rangle + \beta_1|1\rangle$, at time t1 the logic operation 104 is applied to the qubit 122, and at time t2 the qubits 122 is described by $\alpha_2|0\rangle + \beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

Figure 2C:
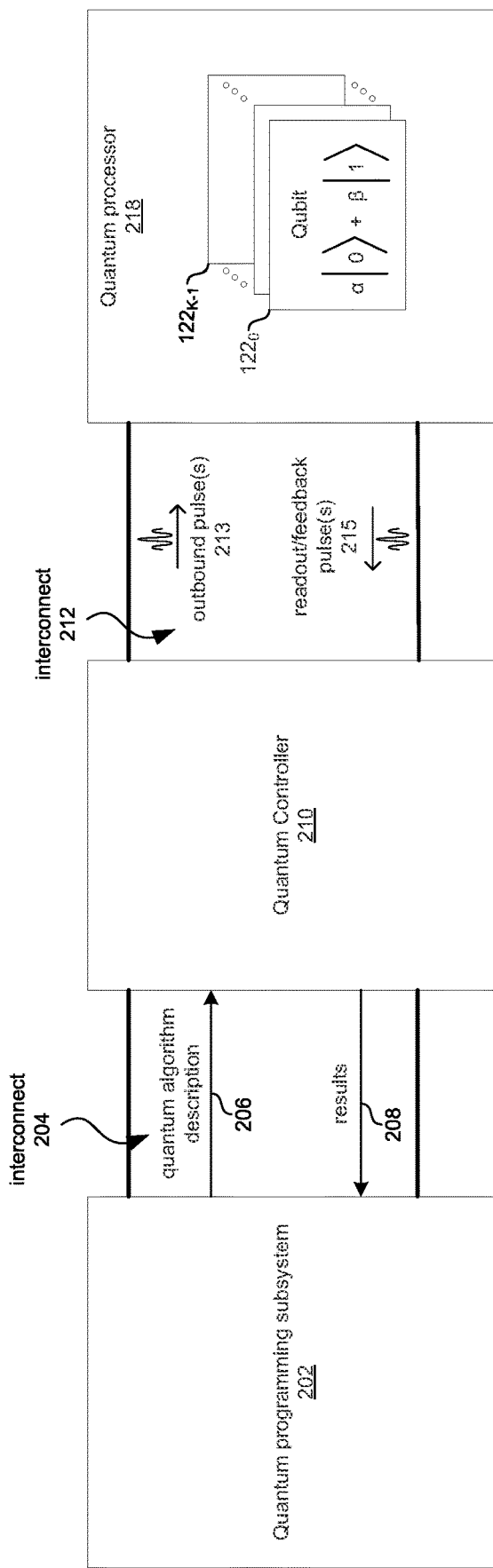
FIG. 2C shows an example use of the pulse orchestration platform for controlling a quantum system.

FIG. 2C shows an example use of the pulse orchestration platform for controlling a quantum system. For this implementation, the system will be referred to as a quantum orchestration platform (QOP), the quantum programming subsystem 202 corresponds to the programming subsystem 252 of FIG. 1, the quantum controller 210 corresponds to the pulse controller 210 of FIG. 1, and the quantum processor 218 corresponds to the target 258 of FIG. 1.

The quantum programming subsystem 202 comprises circuitry operable to generate a pulse program description 206 which configures the quantum controller 210 and includes instructions the quantum controller 210 can execute to carry out the quantum algorithm (i.e., generate the necessary outbound quantum control pulse(s) 213) with little or no human intervention during runtime.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol. The quantum controller 210 comprises circuitry operable to load the machine code pulse program description 206 from the programming subsystem 202 via interconnect 204. Then, execution of the machine code by the quantum controller 210 causes the quantum controller 210 to generate the necessary outbound quantum control pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

The quantum controller 210 is coupled to the quantum processor 218 via interconnect 212 which may comprise, for example, one or more conductors and/or optical fibers. The quantum controller 210 may comprise a plurality of interconnected, but physically distinct quantum control modules (e.g., each module being a desktop or rack mounted device) such that quantum control systems requiring relatively fewer resources can be realized with relatively fewer quantum control modules and quantum control systems requiring relatively more resources can be realized with relatively more quantum control modules.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum control pulses 213 and inbound quantum control pulses 215 between interconnect 212 and the quantum element(s) 122 (e.g., readout resonator(s)). In an example implementation in which the quantum processor comprises readout resonators (or other readout circuitry), K may be equal to the total number of qubits plus the number of readout circuits. That is, if each of Q (an integer) qubits of the quantum processor 218 is associated with a dedicated readout circuit, then K may be equal to 2Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like.

Figure 3A:
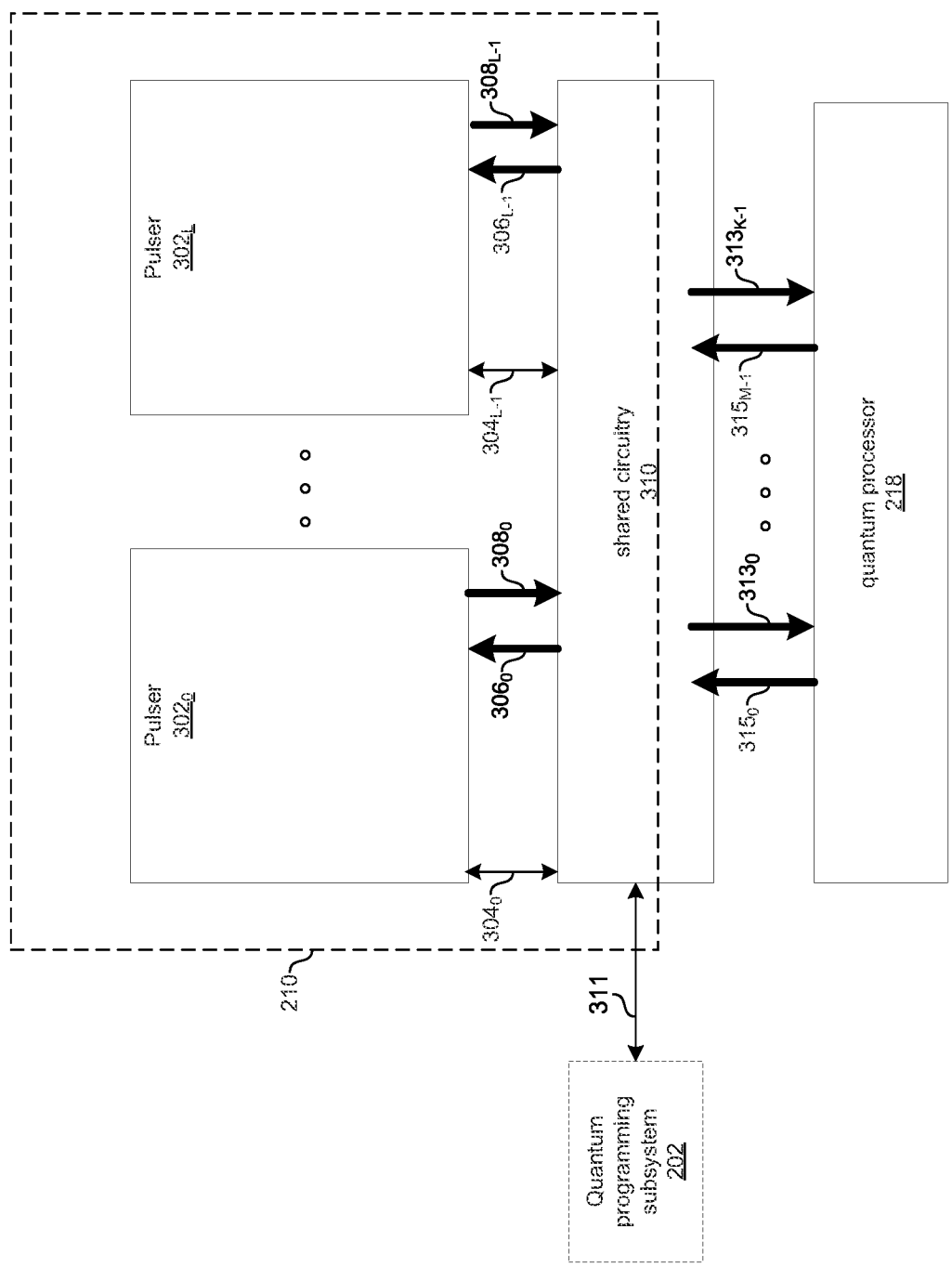
FIG. 3A shows an example quantum orchestration platform (QOP) architecture in accordance with various example implementations of this disclosure.

FIG. 3A shows an example quantum controller architecture in accordance with various example implementations of this disclosure. The quantum controller 210 comprises L (an integer≥1) pulser circuits $302_0$-$302_{L-1}$ and shared circuitry 310.

In the example implementation shown, each pulser circuit $302_l$ (l an integer between 0 and L−1) comprises circuitry for exchanging information over signal paths $304_l$, $306_l$, and $308_l$, where the signal path $308_l$ carries outbound pulses (e.g., 213 of FIG. 2C) generated by the pulser circuit $302_l$ (which may be, for example, control pulses sent to the quantum processor 218 to manipulate one or more properties of one or more quantum elements—e.g., manipulate a state of one or more qubits, manipulate a frequency of a qubit using flux biasing, etc., and/or readout a state of one or more quantum elements), the signal path $306_l$ carries inbound quantum element readout pulses (e.g., 215 of FIG. 2C) to be processed by the pulser circuit $302_l$, and signal path $304_l$ carries control information. Each signal path may comprise one or more conductors, optical channels, and/or wireless channels.

Each pulser circuit $302_l$ comprises circuitry operable to generate outbound pulses on signal path $308_l$ according to quantum control operations to be performed on the quantum processor 218. This involves very precisely controlling characteristics such as phase, frequency, amplitude, slope, chirp rate, duration, and/or timing of the outbound pulses. The characteristics of an outbound pulse generated at any particular time may be determined, at least in part, on inbound pulses received from the quantum processor 218 (via shared circuitry 310 and signal path $306_l$) at a prior time. In an example implementation, the time required to close the feedback loop (i.e., time from receiving a first pulse on one or more of paths $315_1$-$315_L$ (e.g., at an analog to digital converter of the path) to sending a second pulse on one or more of paths $313_0$-$313_{L-1}$ (e.g., at an output of a digital-to-analog converter of the path), where the second pulse is based on the first pulse, is significantly less than the coherence time of the qubits of the quantum processor 218. For example, the time to close the feedback loop may be on the order of 100 nanoseconds. It should be noted that each signal path in FIG. 3A may in practice be a set of signal paths for supporting generation of multi-pulse sets (e.g., two signal paths for two-pulse pairs, three signal paths for three-pulse sets, and so on).

In the example implementation shown, the shared circuitry 310 comprises circuitry for exchanging information with the pulser circuits $302_0$-$302_{L-1}$ over signal paths $304_0$-$304_{L-1}$, $306_0$-$306_{L-1}$, and $308_0$-$308_{L-1}$, where each signal path $308_l$ carries outbound pulses generated by the pulser circuit $302_l$, each signal path $306_l$ carries inbound pulses to be processed by pulser circuit $302_l$, and each signal path $304_l$ carries control information such as flag/status signals, data read from memory, data to be stored in memory, data streamed to/from the quantum programming subsystem 202, and data to be exchanged between two or more pulsers $302_0$-$302_L$. Similarly, in the example shown the shared circuitry 310 comprises circuitry for exchanging information with the quantum processor 218 over signal paths $315_0$-$315_{M-1}$ and $313_1$-$313_{K-1}$, where each signal path 315. (m an integer between 0 and M−1) carries inbound pulses from the quantum processor 218, and each signal path $313_k$ (k an integer between 0 and K−1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller 210 (e.g., residing on one or more of the same field programmable gate arrays or application specific integrated circuits or printed circuit boards); external to the quantum controller (e.g., on a separate FPGA, ASIC, or PCB connected to the quantum controller via one or more cables, backplanes, or other devices connected to the quantum processor 218, etc.); or partially integrated with the quantum controller 210 and partially external to the quantum controller 210.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $302_l$ may be shared among multiple of the K quantum elements circuits. That is, any pulser $302_l$ may generate pulses for different quantum elements at different times. This ability of a pulser $302_l$ to generate pulses for different quantum elements at different times can reduce the number of pulsers $302_0$-$302_{L-1}$ (i.e., reduce L) required to support a given number of quantum elements (thus saving significant resources, cost, size, overhead when scaling to larger numbers of qubits, etc.).

The ability of a pulser $302_l$ to generate pulses for different quantum elements at different times also enables reduced latency. As just one example, assume a quantum algorithm which needs to send a pulse to quantum element $122_0$ at time T1, but whether the pulse is to be of a first type or second type (e.g., either an X pulse or a Hadamard pulse) cannot be determined until after processing an inbound readout pulse at time T1−DT (i.e., DT time intervals before the pulse is to be output). If there were a fixed assignment of pulsers $302_0$-$302_{L-1}$ to quantum elements of the quantum processor 218 (i.e., if $302_0$ could only send pulses to quantum element $122_0$, and pulser $302_1$ could only send pulses to quantum element $122_1$, and so on), then pulser $302_0$ might not be able to start generating the pulse until it determined what the type was to be. In the depicted example implementation, on the other hand, pulser $302_0$ can start generating the first type pulse and pulser $302_1$ can start generating the second type pulse and then either of the two pulses can be released as soon as the necessary type is determined. Thus, if the time to generate the pulse is $T_{lat}$, in this example the example quantum controller 210 may reduce latency of outputting the pulse by $T_{lat}$.

The shared circuitry 310 is thus operable to receive pulses via any one or more of the signals paths $308_0$-$308_{L-1}$ and/or $315_0$-$315_{M-1}$, process the received pulses as necessary for carrying out a quantum algorithm, and then output the resulting processed pulses via any one or more of the signal paths $306_0$-$306_{L-1}$ and/or $313_0$-$313_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the pulse program description 206; and/or dynamically determined (at least in part) during runtime of the pulse program based on classical programs/computations performed during runtime, which may involve processing of inbound pulses. As an example of predetermined pulse generation and routing, a pulse program description 206 may simply specify that a particular pulse with predetermined characteristics is to be sent to signal path $313_1$ at a predetermined time. As an example of dynamic pulse determination and routing, a pulse program description 206 may specify that an inbound readout pulse at time T−DT should be analyzed and its characteristics (e.g., phase, frequency, and/or amplitude) used to determine, for example, whether at time T pulser $302_l$ should output a pulse to a first quantum element or to a second quantum element or to determine, for example, whether at time T pulser $302_l$ should output a first pulse to a first quantum element or a second pulse to the first quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $302_0$-$302_{L-1}$. For example, a function may be desirable to implement in the shared circuitry 310 where the same function is needed by a number of pulser circuits from $302_0$-$302_{L-1}$ and thus may be shared among these pulser circuits instead of redundantly being implemented inside each pulser circuit. As another example, a function may be desirable to implement in the shared circuitry 310 where the function is not needed by all pulser circuits $302_0$-$302_{L-1}$ at the same time and/or on the same frequency and thus fewer than L circuits for implementing the function may be shared among the L pulser circuits $302_0$-$302_{L-1}$ through time and/or frequency division multiplexing. As another example, a function may be desirable to implement in the shared circuitry 310 where the function involves making decisions based on inputs, outputs, and/or state of multiple of the L pulser circuits $302_0$-$302_{L-1}$, or other circuits. Utilizing a centralized coordinator/decision maker in the shared circuitry 310 may have the benefit(s) of: (1) reducing pinout and complexity of the pulser circuits $302_0$-$302_{L-1}$; and/or (2) reducing decision-making latency. Nevertheless, in some implementations, decisions affecting multiple pulser circuits $302_0$-$302_{L-1}$ may be made by one or more of the pulser circuits $302_0$-$302_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
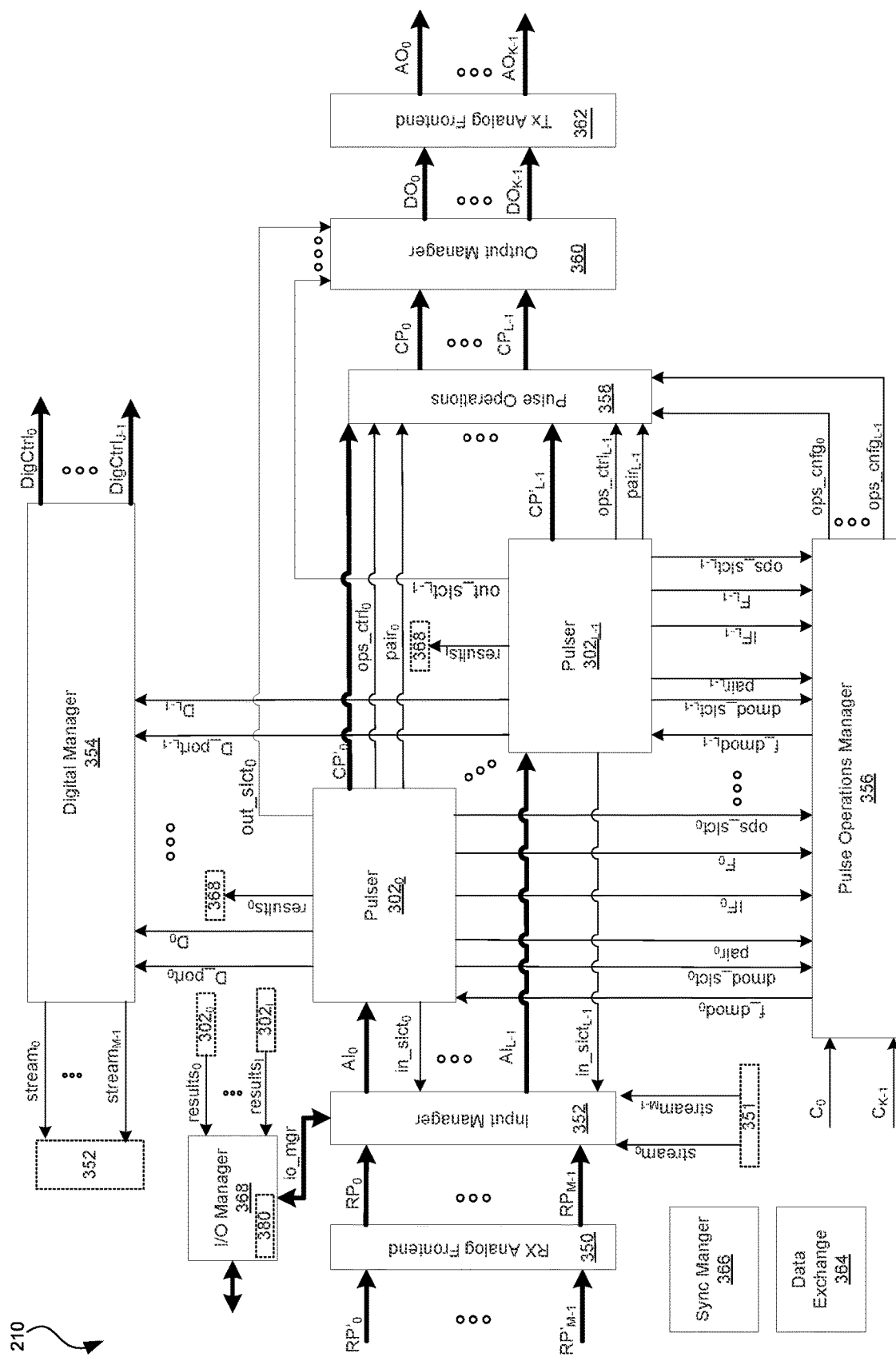
FIG. 3B shows an example implementation of the quantum controller circuitry of FIG. 3A.

FIG. 3B shows an example implementation of the quantum controller of FIG. 2C. The example quantum controller shown comprises pulsers $302_1$-$302_{L-1}$, receive analog frontend 350, input manager 352, digital manager 354, pulse operations manager 356, pulse operations 358, output manager 360, transmit analog frontend 362, data exchange 364, synchronization manager 366, and input/output ("I/O") manager 368. Circuitry depicted in FIG. 3B other than pulser circuits $302_0$-$302_{L-1}$ corresponds to an example implementation of the shared circuitry 310 of FIG. 3A.

The receive analog frontend 350 comprises circuitry operable to concurrently process up to M (an integer≥1) analog inbound signals (RP'$_0$-RP'$_{M-1}$) received via signal paths $315_0$-$315_{M-1}$ to generate up to M concurrent inbound signals (RP$_0$-RP$_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals (RP$_0$-RP$_{M-1}$) to any one or more of pulsers $302_0$-$302_{L-1}$ (as signal(s) AI$_0$-AI$_{L-1}$) and/or to other circuits (e.g. as signal io_mgr to I/O manager 368). In an example implementation, the input manager 352 comprises one or more switch networks, multiplexers, and/or the like for dynamically reconfiguring which signals RP$_0$-RP$_{M-1}$ are routed to which pulsers $302_0$-$302_{L-1}$. This may enable time division multiplexing multiple of the signals RP$_0$-RP$_{M-1}$ onto a single signal AI$_l$ and/or time division demultiplexing components (e.g., time slices) of a signal RP$_m$ onto multiple of the signals AI$_0$-AI$_{L-1}$. In an example implementation, the input manager 352 comprises one or more mixers and/or filters for frequency division multiplexing multiple of the signals RP$_0$-RP$_{M-1}$ onto a single signal AI$_l$ and/or frequency division demultiplexing components (e.g., frequency bands) of a signal RP$_m$ onto multiple of the signals AI$_0$-AI$_{L-1}$. The signal routing and multiplexing/demultiplexing functions performed by the input manager 352 enables: a particular pulser $302_l$ to process different inbound pulses from different quantum elements at different times; a particular pulser $302_l$ to process different inbound pulses from different quantum elements at the same time; and multiple of the pulsers $302_0$-$302_{L-1}$ to processes the same inbound pulse at the same time. In the example implementation shown, routing of the signals RP$_0$-RP$_{M-1}$ among the inputs of the pulsers $302_0$-$302_{L-1}$ is controlled by digital control signals in_slct$_0$-in_slct$_{L-1}$ from the pulsers $302_0$-$302_{L-1}$. In another implementation, the input manager may be operable to autonomously determine the appropriate routing (e.g., where the pulse program description 206 includes instructions to be loaded into memory of, and executed by, the input manager 352). In the example implementation, the input manager 352 is operable to rout input signals RP$_0$-RP$_{M-1}$ to the I/O manager 368 (as signal(s) io_mgr), to be sent to the quantum programing subsystem 202. This routing may, for example, be controlled by signals from the digital manager 354. In an example implementation, for each input signal RP$_m$ there is a digital signal, stream$_m$, from the digital manager 354 to the input manager 352 that controls whether RP$_m$ will be sent from the input manager 352 to the I/O manager 368 and from there to the quantum programing subsystem 202.

Each of the pulsers $302_0$-$302_{L-1}$ is as described above with reference to FIG. 3A. In the example implementation shown, each pulser $302_l$ is operable to generate raw outbound pulses CP'$_l$ ("raw" is used simply to denote that the pulse has not yet been processed by pulse operations circuitry 358) and digital control signals in_slct$_l$, D_port$_l$, D$_l$, out_slct$_l$, ops_ctrl$_l$, ops_slct$_l$, IF$_l$, F$_l$ and dmod_sclt$_l$ for carrying out quantum algorithms on the quantum processor 218, and results$_l$ for carrying intermediate and/or final results generated by the pulser $302_l$ to the quantum programming subsystem 202. One or more of the pulsers $302_0$-$302_{L-1}$ may receive and/or generate additional signals which are not shown in FIG. 3A for clarity of illustration. The raw outbound pulses CP'$_0$-CP'$_{L-1}$ are conveyed via signal paths $308_0$-$308_{L-1}$ and the digital control signals are conveyed via signal paths $304_0$-$304_{L-1}$. Each of the pulsers $302_l$ is operable to receive inbound pulse signal AI$_l$ and signal f_dmod$_l$. Pulser $302_l$ may process the inbound signal AI$_l$ to determine the state of certain quantum element(s) in the quantum processor 218 and use this state information for making decisions such as, for example, which raw outbound pulse CP'$_l$ to generate next, when to generate it, and what control signals to generate to affect the characteristics of that raw outbound pulse appropriately. Pulser $302_l$ may use the signal f_dmod$_l$ for determining how to process inbound pulse signal AI$_l$. As an example, when pulser $302_1$ needs to process an inbound signal AI$_1$ from quantum element $122_3$, it can send a dmod_sclt$_1$ signal that directs pulse operations manager 356 to send, on f_dmod$_1$, settings to be used for demodulation of an inbound signal AI$_1$ from quantum element $122_3$ (e.g., the pulse operations manager 356 may send the value $\cos(\omega_3 * TS * T_{clk1} + \phi_3)$, where $\omega_3$ is the frequency of quantum element $122_3$, TS is amount of time passed since the reference point, for instance the time at which a pulse program started running, and $\phi3$ is the phase of the total frame rotation of quantum element $122_3$, i.e. the accumulated phase of all frame rotations since the reference point).

The pulse operations circuitry 358 is operable to process the raw outbound pulses CP'$_0$-CP'$_{L-1}$ to generate corresponding output outbound pulses CP$_0$-CP$_{L-1}$. This may comprise, for example, manipulating the amplitude, phase, duration, chirp rate, slope, and/or frequency of the raw pulse CP'$_l$. The pulse operations circuitry 358 receives raw outbound pulses CP'$_0$-CP'$_{L-1}$ from pulsers $302_0$-$302_{L-1}$, control signals ops_cnfg$_0$-ops_cnfg$_{L-1}$ from pulse operations manager 356, and ops_ctrl$_0$-ops_ctrl$_{L-1}$ from pulsers $302_0$-$302_{L-1}$.

The control signal ops_cnfg$_l$ configures, at least in part, the pulse operations circuitry 358 such that each raw outbound pulse CP'$_l$ that passes through the pulse operations circuitry 358 has performed on it one or more operation(s) tailored for that particular pulse. To illustrate, denoting a raw outbound pulse from pulser $302_3$ at time T1 as CP'$_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse CP'$_{3,T1}$. Similarly, ops_cnfg$_{4,T1}$ provides the information as to what specific operations are to be performed on pulse CP'$_{4,T1}$, and ops_cnfg$_{3,T2}$ provides the information as to what specific operations are to be performed on pulse CP'$_{4,T1}$.

The control signal ops_ctrl$_l$ provides another way for the pulser $302_l$ to configure how any particular pulse is processed in the pulse operations circuitry 358. This may enable the pulser $302_l$ to, for example, provide information to the pulse operation circuitry 358 that does not need to pass through the pulse operation manager 356. For example, the pulser $302_l$ may send matrix values calculated in real-time by the pulser $302_l$ to be used by the pulse operation circuitry 358 to modify pulse $CP'_l$. These matrix values arrive to the pulse operation circuitry 358 directly from the pulser $302_l$ and do not need to be sent to the pulse operation manager first. Another example may be that the pulser $302_l$ provides information to the pulse operation circuitry 358 to affect the operations themselves (e.g. the signal ops_ctrl$_l$ can choose among several different mathematical operations that can be performed on the pulse).

The pulse operations manager 356 comprises circuitry operable to configure the pulse operations circuitry 358 such that the pulse operations applied to each raw outbound pulse $CP'_l$ are tailored to that particular raw outbound pulse. To illustrate, denoting a first raw outbound pulse to be output during a first time interval T1 as $CP'_{l,T1}$, and a second raw outbound pulse to be output during a second time interval T2 as $CP'_{l,T2}$, then pulse operations circuitry 358 is operable to perform a first one or more operations on $CP'_{l,T1}$ and a second one or more operations on $CP'_{l,T2}$. The first one or more operations may be determined, at least in part, based on to which quantum element the pulse $CP_{1,T1}$ is to be sent, and the second one or more operations may be determined, at least in part, based on to which quantum element the pulse $CP_{1,T2}$ is to be sent. The determination of the first one or more operations and second one or more operations may be performed dynamically during runtime.

The transmit analog frontend 362 comprises circuitry operable to concurrently process up to K digital signals $DO_k$ to generate up to K concurrent analog signals $AO_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths $313_0$-$313_{K-1}$ (FIG. 3A) represents a respective portion of Tx analog frontend circuit 362 as well as a respective portion of interconnect 212 (FIG. 2C) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals $DO_0$-$DO_{K-1}$ as K independent outbound pulses, as K/2 two-pulse pairs, or process some of signals $DO_0$-$DO_{K-1}$ as independent outbound pulses and some signals $DO_0$-$DO_{K-1}$ as two-pulse pairs (at different times and/or concurrently.

The output manager 360 comprises circuitry operable to route any one or more of signals $CP_0$-$CP_{L-1}$ to any one or more of signal paths $313_0$-$313_{K-1}$. As just one possible example, signal path $313_0$ may comprise a first path through the analog frontend 362 (e.g., a first mixer and DAC) that outputs $AO_0$ and traces/wires of interconnect 212 that carry signal $AO_0$; signal path $313_1$ may comprise a second path through the analog frontend 362 (e.g., a second mixer and DAC) that outputs $AO_1$ and traces/wires of interconnect 212 that carry signal $AO_1$, and so on. In an example implementation, the output manager 360 comprises one or more switch networks, multiplexers, and/or the like for dynamically reconfiguring which one or more signals $CP_0$-$CP_{L-1}$ are routed to which signal paths $313_0$-$313_{K-1}$. This may enable time division multiplexing multiple of the signals $CP_0$-$CP_{L-1}$ onto a single signal path $313_k$ and/or time division demultiplexing components (e.g., time slices) of a signal $CP_m$ onto multiple of the signal paths $313_0$-$313_{k-1}$. In an example implementation, the output manager 360 comprises one or more mixers and/or filters for frequency division multiplexing multiple of the signals $CP_0$-$CP_{M-1}$ onto a single signal path $313_k$ and/or frequency division demultiplexing components (e.g., frequency bands) of a signal $CP_m$ onto multiple of the signal paths $313_0$-$313_{K-1}$. The signal routing and multiplexing/demultiplexing functions performed by the output manager 360 enables: routing outbound pulses from a particular pulser $302_l$ to different ones of the signal paths $313_0$-$313_{K-1}$ at different times; routing outbound pulses from a particular pulser $302_l$ to multiple of the signal paths $313_0$-$313_{K-1}$ at the same time; and multiple of the pulsers $302_0$-$302_{L-1}$ generating pulses for the same signal path $313_k$ at the same time. In the example implementation shown, routing of the signals $CP_0$-$CP_{L-1}$ among the signal paths $313_0$-$313_{K-1}$ is controlled by digital control signals out_slct$_0$-out_slct$_{L-1}$ from the pulsers $302_0$-$302_{L-1}$. In another implementation, the output manager 360 may be operable to autonomously determine the appropriate routing (e.g., where the quantum pulse program description 206 includes instructions to be loaded into memory of, and executed by, the output manager 360). In an example implementation, at any given time, the output manager 360 is operable to concurrently route K of the digital signals $CP_0$-$CP_{L-1}$ as K independent outbound pulses, concurrently route K/2 of the digital signals $CP_0$-$CP_{L-1}$ as two-pulse pairs, or route some of signals $CP_0$-$CP_{L-1}$ as independent outbound pulses and some others of the signals $CP_0$-$CP_{L-1}$ as multi-pulse sets (at different times and/or concurrently).

The digital manager 354 comprises circuitry operable to process and/or route digital control signals (DigCtrl$_0$-DigCtrl$_{J-1}$) to various circuits of the quantum controller 210 and/or external circuits coupled to the quantum controller 210. In the example implementation shown, the digital manager receives, from each pulser $302_l$, (e.g., via one or more of signal paths $304_0$-$304_{N-1}$) a digital signal Di that is to be processed and routed by the digital manager 354, and a control signal D_port$_l$ that indicates to which output port(s) of the digital manager 354 the signal D$_l$ should be routed. The digital control signals may be routed to, for example, any one or more of circuits shown in FIG. 3B, switches/gates which connect and disconnect the outputs $AO_0$-$AO_{K-1}$ from the quantum processor 218, external circuits coupled to the quantum controller 210 such as microwave mixers and amplifiers, and/or any other circuitry which can benefit from on real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_l$ to generate digital signals to different destinations and allows different ones of pulsers $302_0$-$302_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers $302_0$-$302_{L-1}$ generate, receive, and process pulses to and from different quantum elements at different times. For example, while carrying out a quantum algorithm, a first pulser circuit $302_1$ and a second pulser circuit $302_2$ may sometimes need to transmit pulses at precisely the same time and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3B. For example, while carrying out a quantum algorithm, a first pulser circuit $302_1$ and a second pulser circuit $302_2$ may sometimes need to exchange information. As just one example, pulser $302_1$ may need to share, with pulser $302_2$, the characteristics of an inbound signal $AI_1$ that it just processed so that pulser $302_2$ can generate a raw outbound pulse $CP'_2$ based on the characteristics of $AI_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202. Machine code quantum pulse program descriptions may be received via the I/O manager 368. Accordingly, the I/O manager 368 may comprise circuitry for loading the machine code into the necessary registers/memory (including any SRAM, DRAM, FPGA BRAM, flash memory, programmable read only memory, etc.) of the quantum controller 210 as well as for reading contents of the registers/memory of the quantum controller 210 and conveying the contents to the quantum programming subsystem 202. The I/O manager 368 may, for example, include a PCIe controller, AXI controller/interconnect, and/or the like. In an example implementation, the I/O manager 368 comprises one or more registers 380 which can be written to and read from via a quantum machine API (an example of which is shown below in Table 6) and via reserved variables in the language used to create pulse program description 206.

Figure 4:
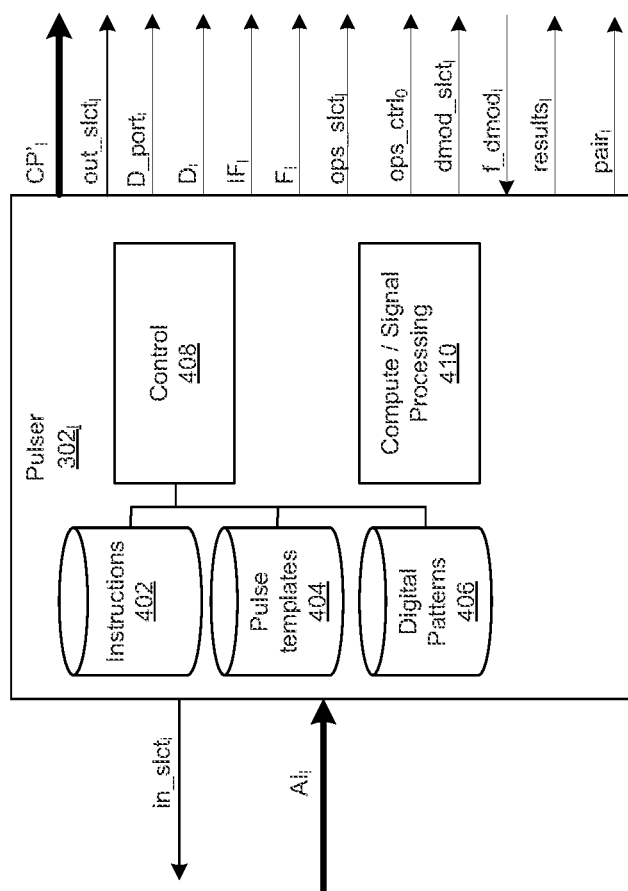
FIG. 4 shows an example implementation of the pulser of FIG. 3B.

FIG. 4 shows an example implementation of the pulser of FIG. 3B. The example pulser $302_l$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_l$ for carrying out its role in a quantum algorithm. Because different pulsers $302_0$-$302_{L-1}$ have different roles to play in any particular quantum algorithm (e.g., generating different pulses at different times), the instructions memory 402 for each pulser $302_l$ may be specific to that pulser. For example, the pulse program description 206 from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $AI_l$, generate raw outbound pulses $CP'_l$, and generate digital control signals $in\_slct_l$, $out\_slct_l$, $D\_port_l$, $D_l$, $IF_l$, $F_l$, $ops\_slct_l$, $ops\_ctrl_l$, $results_l$, $dmod\_slct_l$ and $pair_l$. In the example implementation shown, the processing of the inbound signal $AI_l$ is performed by the CSP circuitry 410 and based (at least in part) on the signal $f\_dmod_l$.

The compute and/or signal processing circuitry (CSP) 410 is operable to perform computational and/or signal processing functions, which may comprise, for example Boolean-algebra based logic and arithmetic functions and demodulation (e.g., of inbound signals $AI_l$). The CSP 410 may comprise memory in which are stored instructions for performing the functions and demodulation. The instructions may be specific to a quantum algorithm to be performed and be generated during compilation of a quantum machine specification and QUA program.

In operation of an example implementation, generation of a raw outbound pulse $CP'_l$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, $pair_l$, $ops\_slct_l$, and $dmod\_slct_l$ to be sent to the pulse operation manager 356 (as predetermined in the pulse program description 206 and/or determined dynamically based on results of computations and/or signal processing performed by the CSP 410); (5) determining the value of $ops\_ctrl_l$ to be sent to the pulse operation circuitry 358; (6) determining the value of $in\_slct_l$ to be sent to the input manager 352; (7) determining a digital pattern to retrieve from memory 406 (as predetermined in the pulse program description 206 and/or determined dynamically based on results of computations and/or signal processing performed by the CSP 410); (8) outputting the digital pattern as Di to the digital manager along with control signal $D\_port_l$ (as predetermined in the pulse program description and/or determined dynamically based on results of computations and/or signal processing performed by the CSP 410); (9) outputting the raw outbound pulse $CP'_l$ to the pulse operations circuitry 358; (10) outputting $results_l$ to the I/O manager.

Figure 5:
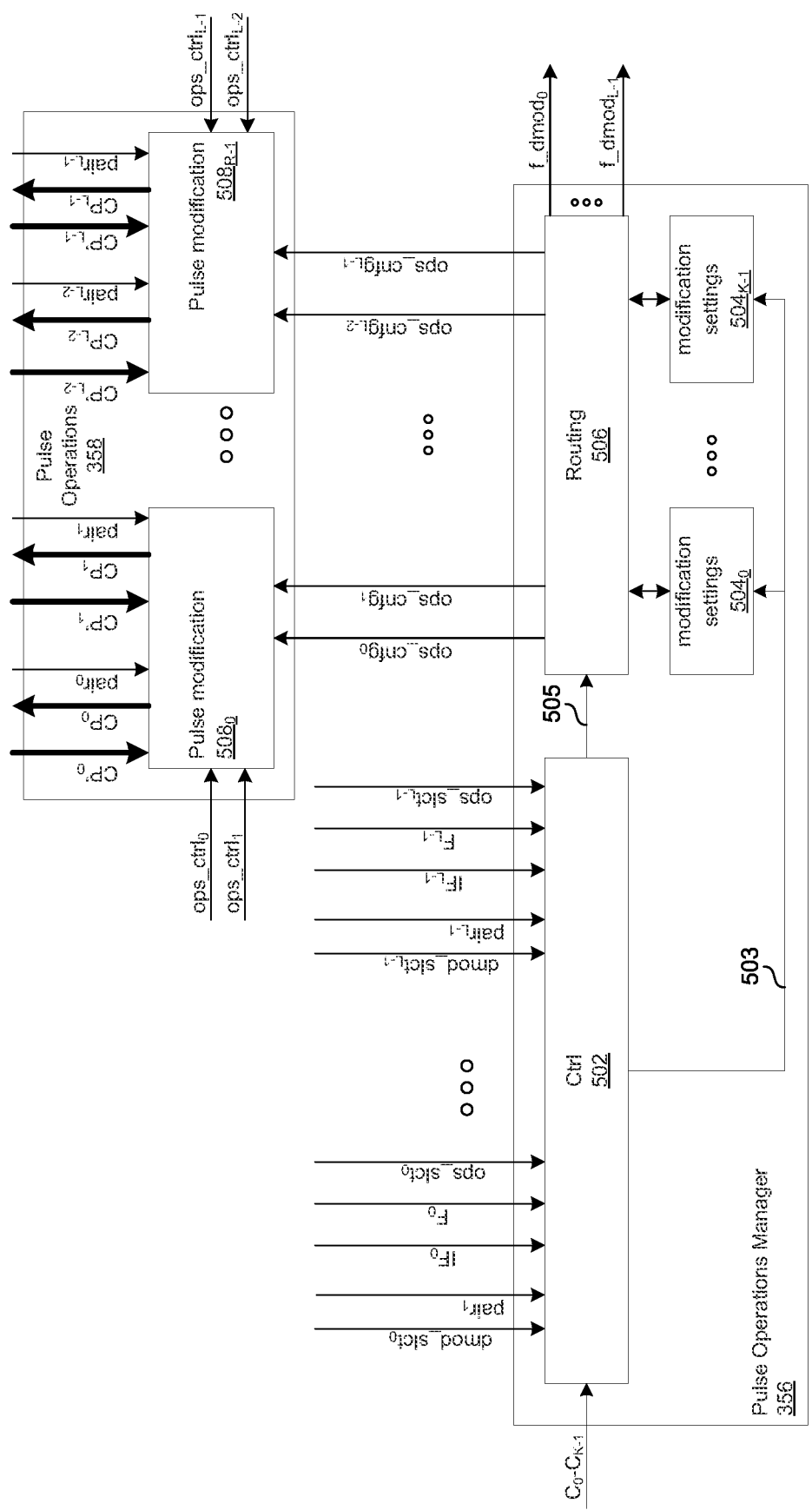
FIG. 5 shows an example implementation of the pulse operations manager and pulse operations circuitry of FIG. 3B.

FIG. 5 shows an example implementation of the pulse operations manager and pulse operations circuitry of FIG. 3B. The pulse operations circuitry 358 comprises a plurality of pulse modification circuits $508_0$-$508_{R-1}$ (R is an integer≥1 in general, and R=L/2 in the example shown). The pulse operations manager 356 comprises control circuitry 502, routing circuitry 506, and a plurality of modification settings circuits $504_0$-$504_{K-1}$.

Although the example implementation has a 1-to-2 correspondence between pulse modification circuits $508_0$-$508_{R-1}$ and pulser circuits $302_0$-$302_{L-1}$, such does not need to be the case. In other implementations there may be fewer pulse modification circuits 508 than pulser circuits 302. Similarly, other implementations may comprise more pulse modification circuits 508 than pulser circuits 302.

As an example, in some instances, two of the pulsers $302_0$-$302_{L-1}$ may generate two raw outbound pulses which are a phase-quadrature pulse pair. For example, assuming $CP_1$ and $CP_2$ are a phase-quadrature pulse pair to be output on path $313_3$. In this example, pulse operations circuitry 358 may process $CP_1$ and $CP_2$ by multiplying a vector representation of $CP'_1$ and $CP'_2$ by one or more 2 by 2 matrices to: (1) perform single-sideband-modulation, as given by $$\begin{pmatrix} CP_1 \\ CP_2 \end{pmatrix} = \begin{pmatrix} \cos(\omega * TS * T_{clck1}) & -\sin(\omega * TS * T_{clck1}) \\ \sin(\omega * TS * T_{clck1}) & \cos(\omega * TS * T_{clck1}) \end{pmatrix} \begin{pmatrix} CP'_1 \\ CP'_2 \end{pmatrix},$$

where ω is the frequency of the single side band modulation and TS is the time passed since the reference time (e.g. the beginning of a certain control protocol); (2) keep track of frame-of-reference rotations, as given by $$\begin{pmatrix} CP_1 \\ CP_2 \end{pmatrix} = \begin{pmatrix} \cos(\phi) & -\sin(\phi) \\ \sin(\phi) & \cos(\phi) \end{pmatrix} \begin{pmatrix} CP'_1 \\ CP'_2 \end{pmatrix},$$

where φ is the total phase that the frame of reference accumulated since the reference time; and/or (3) perform an IQ-mixer correction $$\begin{pmatrix} CP_1 \\ CP_2 \end{pmatrix} = \begin{pmatrix} C_{00} & C_{01} \\ C_{10} & C_{11} \end{pmatrix} \begin{pmatrix} CP'_1 \\ CP'_2 \end{pmatrix},$$

where $C_{00}$, $C_{01}$, $C_{10}$, and $C_{11}$ are the elements of a matrix that corrects for IQ-mixer imperfections. In an example implementation, each modification settings circuit, $504_k$, contains registers that contain the matrix elements of three matrices:

$$C_k = \begin{pmatrix} C_{k00} & C_{k01} \\ C_{k10} & C_{k11} \end{pmatrix},$$

an IQ-mixer correction matrix;

$$S_k = \begin{pmatrix} \cos(\omega_k * TS * T_{clck1}) & -\sin(\omega_k * TS) * T_{clck1} \\ \sin(\omega_k * TS * T_{clck1}) & \cos(\omega_k * TS * T_{clck1}) \end{pmatrix},$$

a single side band frequency modulation matrix; and $$F_k = \begin{pmatrix} \cos(\phi_k) & -\sin(\phi_k) \\ \sin(\phi_k) & \cos(\phi_k) \end{pmatrix},$$

a frame rotation matrix, which rotates the IQ axes around the axis perpendicular to the IQ plane (i.e. the z-axis if I and Q are the x-axis and y-axis). In an example implementation, each modification settings circuit $504_k$ also contains registers that contain the elements of the matrix products $C_k S_k F_k$ and $S_k F_k$.

In the example shown, each pulse modification circuit $508_r$ is operable to process two raw outbound pulses $CP'_{2r}$ and $CP'_{2r+1}$ according to: the modification settings ops_cnfg$_{2r}$ and ops_cnfg$_{2r+1}$; the signals ops_ctrl$_{2r}$ and ops_ctrl$_{2r+1}$; and the signals pair$_{2r}$ and pair$_{2r+1}$. In an example implementation pair$_{2r}$ and pair$_{2r+1}$ may be communicated as ops_ctrl$_{2r}$ and ops_ctrl$_{2r+1}$. The result of the processing is outbound pulses $CP_{2r}$ and $CP_{2r+1}$. Such processing may comprise adjusting a phase, frequency, and/or amplitude of the raw outbound pulses $CP'_{2r}$ and $CP'_{2r+1}$. In an example implementation, ops_cnfg$_{2r}$ and ops_cnfg$_{2r+1}$ are in the form of a matrix comprising real and/or complex numbers and the processing comprises matrix multiplication involving a matrix representation of the raw outbound pulses $CP_{2r}$ and $CP_{2r+1}$ and the ops_cnfg$_{2r}$ and ops_cnfg$_{2r+1}$ matrix.

The control circuitry 502 is operable to exchange information with the pulser circuits $302_0$-$302_{L-1}$ to generate values of ops_cnfg$_0$-ops_cnfg$_{L-1}$ and f_demod$_0$-f_demod$_{L-1}$, to control routing circuitry 506 based on signals ops_slct$_0$-ops_slct$_{L-1}$ and dmod_slct$_0$-dmod_slct$_{L-1}$, and to update pulse modification settings $504_0$-$504_{K-1}$ based on IF$_0$-IF$_{L-1}$ and F$_0$-F$_{L-1}$ such that pulse modification settings output to pulse operations circuitry 358 are specifically tailored to each raw outbound pulse (e.g., to which quantum element 222 the pulse is destined, to which signal path 313 the pulse is destined, etc.) to be processed by pulse operations circuitry 358.

Each modification settings circuit $504_k$ comprises circuitry operable to store modification settings for later retrieval and communication to the pulse operations circuitry 358. The modification settings stored in each modification settings circuit $504_k$ may be in the form of one or more two-dimensional complex-valued matrices. Each signal path $313_0$-$313_{K-1}$ may have particular characteristics (e.g., non-idealities of interconnect, mixers, switches, attenuators, amplifiers, and/or circuits along the paths) to be accounted for by the pulse modification operations. Similarly, each quantum element $122_0$-$122_k$ may have a particular characteristics (e.g. resonance frequency, frame of reference, etc.). In an example implementation, the number of pulse modification settings, K, stored in the circuits 504 corresponds to the number of quantum element $122_0$-$122_{K-1}$ and of signal paths $313_0$-$313_{K-1}$ such that each of the modification settings circuits $504_0$-$504_{K-1}$ stores modification settings for a respective one of the quantum elements $122_0$-$122_{K-1}$ and/or paths $313_0$-$313_{K-1}$. In other implementations, there may be more or fewer pulse modification circuits 504 than signal paths 313 and more or fewer pulse modification circuits 504 than quantum elements 122 and more or fewer signal paths 313 than quantum elements 122. The control circuitry 502 may load values into the modification settings circuit $504_0$-$504_{K-1}$ via signal 503.

The routing circuitry 506 is operable to route modification settings from the modification settings circuits $504_0$-$504_{L-1}$ to the pulse operations circuit 358 (as ops_cnfg$_0$-ops_cnfg$_{L-1}$) and to the pulsers $302_0$-$302_{L-1}$ (as f_dmod$_0$-f_dmod$_{L-1}$). In the example implementation shown, which of the modification settings circuits $504_0$-$504_{K-1}$ has its/their contents sent to which of the pulse modification circuits $508_0$-$508_{R-1}$ and to which of the pulsers $302_0$-$302_{L-1}$ is controlled by the signal 505 from the control circuitry 502.

The signal ops_slct$_l$ informs the pulse operations manager 356 as to which modification settings $504_k$ to send to the pulse modification circuit $508_l$. The pulser $302_l$ may determine ops_slct$_l$ based on the particular quantum element $122_k$ and/or signal path $313_k$ to which the pulse is to be transmitted (e.g., the resonant frequency of the quantum element, frame of reference, and/or mixer correction). The determination of which quantum element and/or signal path to which a particular pulser $302_l$ is to send an outbound pulse at a particular time may be predetermined in the pulse program description 206 or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one or more of the pulse modification circuits $508_0$-$508_{L-1}$.

In an example implementation, the digital signal IF$_l$ instructs the pulse operations manager 356 to update a frequency setting of the modification settings circuit $504_k$ indicated by ops_slct$_l$. In an example implementation, the frequency setting is the matrix $S_k$ (described above) and the signal IF$_l$ carries new values indicating the new $\omega_k$ to be used in the elements of the matrix $S_k$. The new values may, for example, be determined during a calibration routine (e.g., performed as an initial portion of the quantum algorithm) in which one or more of the pulsers $302_0$-$302_{L-1}$ sends a series of outbound pulses CP, each at a different carrier frequency, and then measures the corresponding inbound signals AI.

In an example implementation, the signal $F_l$ instructs the pulse operations manager 356 to update a frame setting of the modification settings circuit $504_k$ indicated by ops_slct$_l$. In an example implementation, the frame setting is the matrix $F_k$ (described above) and the signal $F_l$ carries a rotation matrix $F_l$ which multiplies with $F_k$ to rotate $F_k$. This can be written as $$F_k = F_l F_k = \begin{pmatrix} \cos(\Delta\phi) & -\sin(\Delta\phi) \\ \sin(\Delta\phi) & \cos(\Delta\phi) \end{pmatrix} \begin{pmatrix} \cos(\phi_k) & -\sin(\phi_k) \\ \sin(\phi_k) & \cos(\phi_k) \end{pmatrix} = \begin{pmatrix} \cos(\phi_k + \Delta\phi) & -\sin(\phi_k + \Delta\phi) \\ \sin(\phi_k + \Delta\phi) & \cos(\phi_k + \Delta\phi) \end{pmatrix},$$

where $\phi_k$ is the frame of reference before the rotation and $\Delta\phi$ is the amount by which to rotate the frame of reference. The pulser $302_l$ may determine $\Delta\phi$ based on a predetermined algorithm or based on calculations performed by the pulsers $302_l$ and/or others of the pulsers $302_0$-$302_{L-1}$ during runtime.

In an example implementation, the signal dmod_slct$_l$ informs the pulse operations manager 356 from which of the modification settings circuits $504_k$ to retrieve values to be sent to pulser $302_l$ as f_dmod$_l$. The pulser $302_l$ may determine dmod_slct$_l$ based on the particular quantum element $122_k$ and/or signal path $315_k$ from which the pulse to be processed arrived. The determination of from which quantum element and/or signal path a particular pulser $302_l$ is to process an inbound pulse at a particular time may be predetermined in the pulse program description 206 or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one of the pulsers $302_0$-$302_{L-1}$. For example, when pulse generation circuit $302_l$ needs to demodulate a pulse signal AI$_l$ from quantum element $122_k$, it will send a dmod_slct$_l$ signal instructing the pulse operation manager 356 to rout the element $SF_{k00} = \cos(\omega_k^* \text{time\_stamp} + \phi_k)$ from modification settings circuit $504_k$ to pulser $302_l$ (as f_dmod$_l$).

In the example implementation shown, the digital signals $C_0$-$C_{K-1}$ provide information about signal-path-specific modification settings to be used for each of the signal paths $313_0$-$313_{K-1}$. For example, each signal $C_k$ may comprise a matrix to be multiplied by a matrix representation of a raw outbound pulse $CP'_l$ such that the resulting output outbound pulse is pre-compensated for errors (e.g., resulting from imperfections in mixers, amplifiers, wiring, etc.) introduced as the outbound pulse propagates along signal path $313_k$. The result of the pre-compensation is that output outbound pulse $CP_l$ will have the proper characteristics upon arriving at the quantum processor 218. The signals $C_0$-$C_{K-1}$ may, for example, be calculated by the quantum controller 210 itself, by the programming subsystem 202, and/or by external calibration equipment and provided via I/O manager 368. The calculation of signals may be done as part of a calibration routine which may be performed before a quantum algorithm and/or may be determined/adapted in real-time as part of a quantum algorithm (e.g., to compensate for temperature changes during the quantum algorithm).

Figure 6:
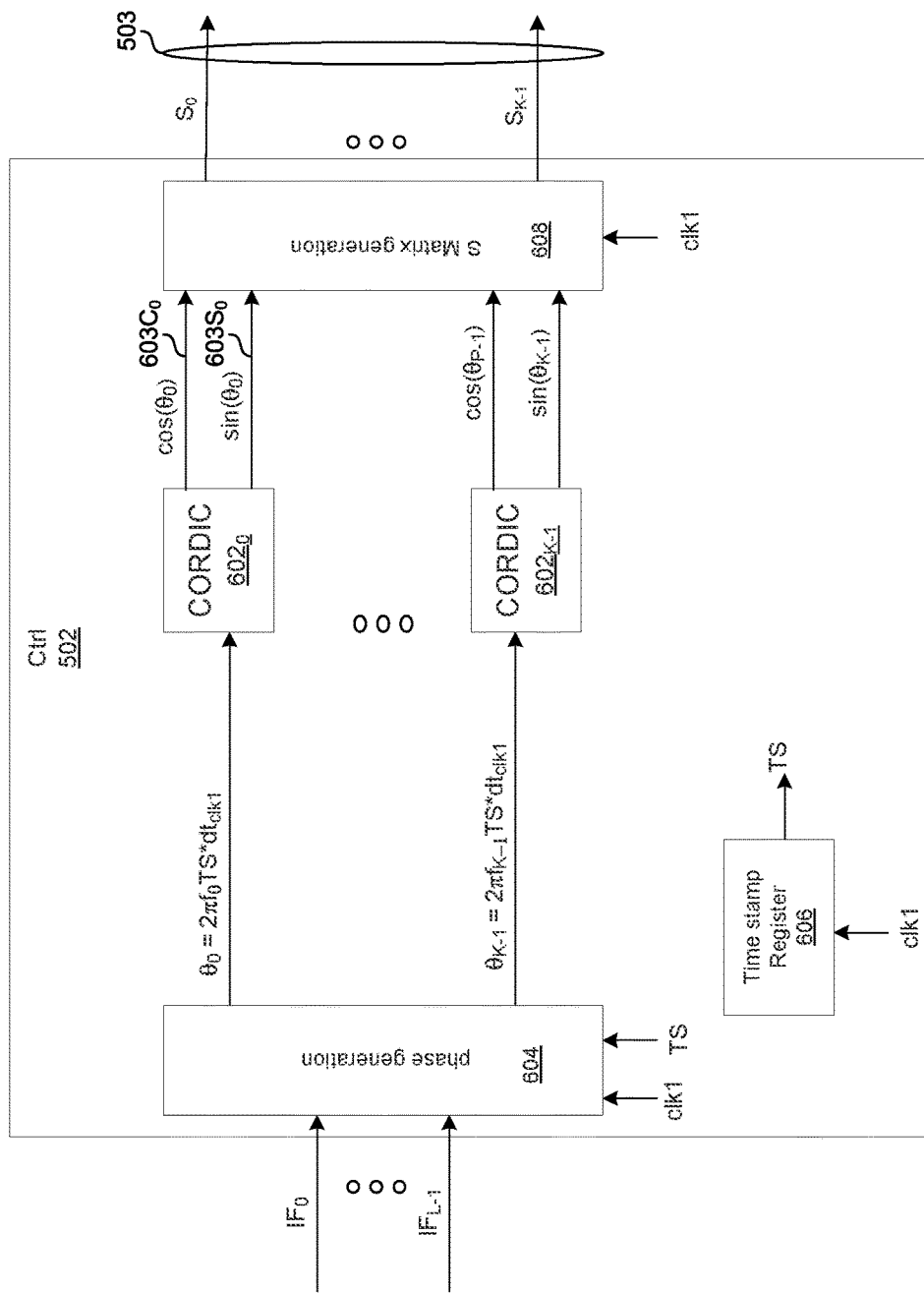
FIG. 6A shows frequency generation circuitry of the quantum controller of FIG. 3B.
FIG. 6B shows example components of the control signal $IF_l$ of FIG. 6A.

FIG. 6A shows frequency generation circuitry of the quantum controller of FIG. 3B. In the example implementation shown, the frequency generation circuitry is part of control circuitry 502 of pulse operations manager circuitry 356. The frequency generation circuitry comprises K coordinate rotation digital computer (CORDIC) circuits $602_0$-$602_{K-1}$, phase generation circuitry 604, timestamp register 606, and S-Matrix generation circuitry 608.

Each CORDIC circuit $602_k$ is operable to compute cosine and sine of its input, $\theta_k$, thus generating two signals $\cos(\theta_k)$ and $\sin(\theta_k)$.

The phase generation circuitry 604 is operable to generate the CORDIC input parameters $\theta_0$-$\theta_{k-1}$ based on: (1) the frequency setting signals $IF_0$-$IF_{L-1}$ from the pulsers $302_0$-$302_{L-1}$; and (2) the contents, TS, of the timestamp register 606.

The timestamp register 606 comprises circuitry (e.g., a counter incremented on each cycle of the clock signal clk1) operable to track the number of cycles of clk1 since a reference point in time (e.g., power up of the quantum controller 210, start of execution of set of instructions of a quantum algorithm by the quantum controller 210, etc.).

In the example shown, the phase generation circuitry 604 sets $\theta_0 = 2\pi f_0 (TS)(dt_{clk1})$, where $f_0$ is a frequency determined from the signal $IF_0$, TS is the number of clock cycles counted from the reference point and $dt_{clk1}$ is the duration of a single clock cycle of clk1. This leads to the CORDIC outputs being a pair of phase-quadrature reference signals, $\cos(2\pi f_0 (TS)(dt_{clk1}))$ and $\sin(2\pi f_0 (TS)(dt_{clk1}))$, as in the example shown, which are used to generate the $S_0$ rotation matrix that rotates at a frequency $f_0$.

As shown in FIG. 6B, the signal $IF_l$ may comprise an update component and an $f_l$ component. In an example implementation, when update$_l$ is asserted then the phase generation circuitry updates one of more of $f_0$-$f_{K-1}$ to be the value of $f_l$.

The S-matrix generation circuitry 608 is operable to build the matrices $S_0$-$S_{K-1}$ from the outputs of the CORDIC circuits $602_0$-$602_{K-1}$. In an example implementation, the S-matrix generation circuit 608 is operable to synchronize changes to the S matrices such that any matrix update occurs on a desired cycle of clock clk1 (which may be determined by the control information $IF_0$-$IF_{L-1}$).

With K CORDIC circuits $602_k$, the frequency generation circuitry is operable to concurrently generate K S-matrices. In instances that more than K frequencies are needed over the course of a set of instructions, the phase generation circuit 604 is operable to change the input parameter $\theta_k$ of one or more of the CORDIC circuits $602_0$-$602_{K-1}$ to stop generating one frequency and start generating the K+1$^{th}$ frequency. In some instances, it may be necessary for the new frequency to start at a phase $\theta$ that would have been the phase if the new frequency was being generated from the initial reference time (e.g., because the new frequency would be used to address a quantum element that has a resonance at the new frequency and that was coherent since the reference point). In some other instances, it might be necessary to start the new frequency from the phase that the old frequency ended in. The phase generation circuit 604 and timestamp register 606 enable both of these possibilities.

Figure 7:
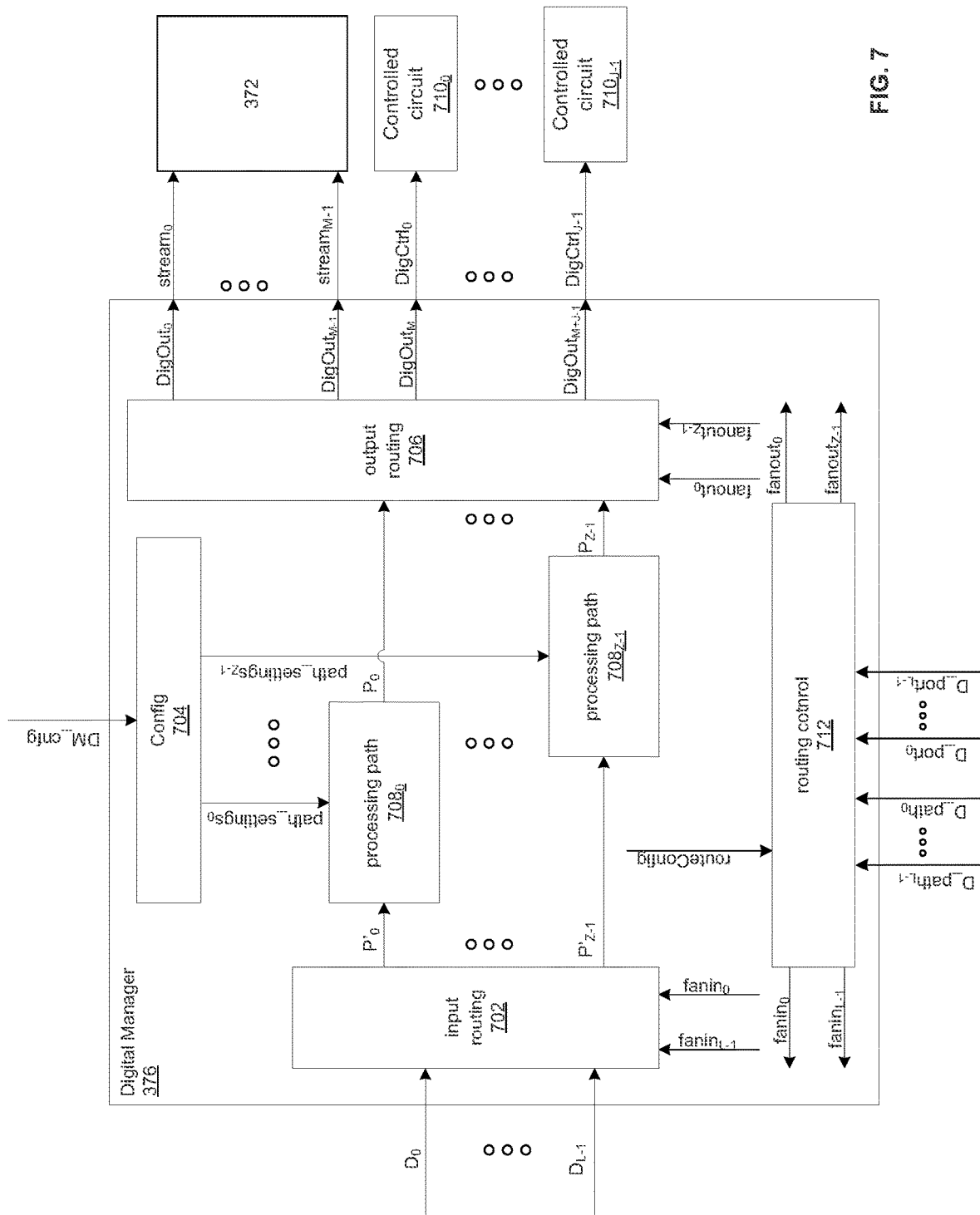
FIG. 7 shows an example implementation of the digital manager of FIG. 3B.

FIG. 7 shows an example implementation of the digital manager of FIG. 3B. Shown in FIG. 7 are the digital manager 376, controlled circuits $710_0$-$710_{J-1}$, and input manager 372.

The example implementation of the digital manager 376 comprises input routing circuit 702, configuration circuit 704, output routing circuit 706, processing paths $708_0$-$708_{Z-1}$ (where Z is an integer), and routing control circuit 712.

The configuration circuit 704 is operable to store configuration settings and use those settings to configure the processing paths $708_0$-$708_{Z-1}$ and/or the routing control circuit 712. The settings may, for example, be loaded via the signal DM_config as part of the pulse program description 206 provided by quantum programming subsystem 202. The settings may comprise, for example, one or more of: a bitmap on which may be based a determination of which of signals $D_0$-$D_{L-1}$ to route to which of signals $P'_0$-$P'_{Z-1}$ for one or more instructions of a pulse program; a bitmap on which may be based a determination of which processing path outputs $P_0$-$P_{Z-1}$ to route to which of DigOut$_0$-DigOut$_{J+M-1}$ for one or more instructions of a pulse program; and one or more bit patterns which processing paths $708_0$-$708_{Z-1}$ may convolve with one or more of the signals $P'_0$-$P'_{Z-1}$ for one or more instructions of a pulse program.

The input routing circuit 702 is operable to route each of the digital signals $D_0$-$D_{L-1}$ to one or more of the processing paths $708_0$-$708_{Z-1}$. At any given time (e.g., for any particular instruction of every pulser $302_l$ of pulsers $302_0$-$302_L$), the input routing circuit 702 may determine to which of the processing paths $708_0$-$708_{Z-1}$ to rout the signal $D_l$ of signals $D_0$-$D_{L-1}$ based on the signal fanin$_l$ of signals fanin$_0$-fanin$_{L-1}$. That is, for a particular instruction, the digital signal $D_l$ may be routed to any one or more of paths $708_0$-$708_{Z-1}$ based on the value of fanin$_l$ for that instruction. For example, fanin$_l$ may be a Z-bit signal and a state of each bit of fanin$_l$ during a particular instruction may indicate whether Di is to be routed to a corresponding one of the Z processing paths $708_0$-$708_{Z-1}$ during that instruction. An example implementation of the input routing circuit 702 is described below with reference to FIG. 8.

The output routing circuit 706 is operable to route each of the digital signals $P_0$-$P_{Z-1}$ to one or more of DigOut$_0$-DigOut$_{J+M-1}$ (In the example shown DigOut$_0$-DigOut$_{J+M-1}$ connect to stream$_0$-stream$_{M-1}$, respectively, and DigOut$_M$-DigOut$_{J+M-1}$ connect to DigCtrl0-DigCtrJ−1, respectively). At any given time (e.g., for any particular instruction of every pulser $302_l$ of pulsers $302_0$-$302_L$), the output routing circuit 706 may determine to which of DigOut$_0$-DigOut$_{J+M-1}$ to rout the signal $P_l$ of the signals $P_0$-$P_{L-1}$ based on the signal fanout$_l$ of signals fanout$_0$-fanout$_{Z-1}$. That is, for a particular instruction, the digital signal $P_z$ (z an integer between 0 and Z) may be routed to any one or more of DigOut$_0$-DigOut$_{J+M-1}$ based on the value of fanout$_z$ for that instruction. For example, values of fanout$_z$ may be (J+M−1) bits and a state of each bit of fanout$_z$ during a particular instruction may indicate whether $P_z$ is to be routed to a corresponding one of the J+M−1 signals DigOut during that instruction. An example implementation of the output routing circuit 706 is described below with reference to FIG. 8.

Each of the processing path circuits $708_0$-$708_{Z-1}$ is operable to manipulate a respective one of signals $P'_0$-$P'_{Z-1}$ to generate a corresponding manipulated signal $P_0$-$P_{Z-1}$. The manipulation may comprise, for example, introducing a delay to the signal such that the resulting one or more of DigOut$_0$-DigOut$_{J+M-1}$ reach(es) its/their destination (a controlled circuit 710 and/or input manager 372) at the proper time with respect to the time of arrival of a corresponding quantum control pulse at the corresponding destination.

Each of the controlled circuits $710_0$-$710_{J-1}$ and input manager 372 is a circuit which, at least some of the time, needs to operate synchronously with quantum control pulses generated by one or more of pulsers $302_0$-$302_{L-1}$ (possibly a reflection/return pulse from a quantum processor in the case of input manager 372). Accordingly, each of the control circuits $710_0$-$710_{J-1}$ receives a respective one of control signals DigOut$_0$-DigCtrl$_{J-1}$ that is synchronized with a respective quantum control pulse. Similarly, input manager 372 receives a plurality of the DigOut signals (one for each stream input).

The routing controller 712 comprises circuitry operable to generate signals fanin$_0$-fanin$_{L-1}$ and fanout$_0$-fanout$_{Z-1}$ based on D_path$_0$-D_path$_{L-1}$, D_port$_0$-D_port$_{L-1}$, and/or information stored in configuration circuit 704.

Figure 8:
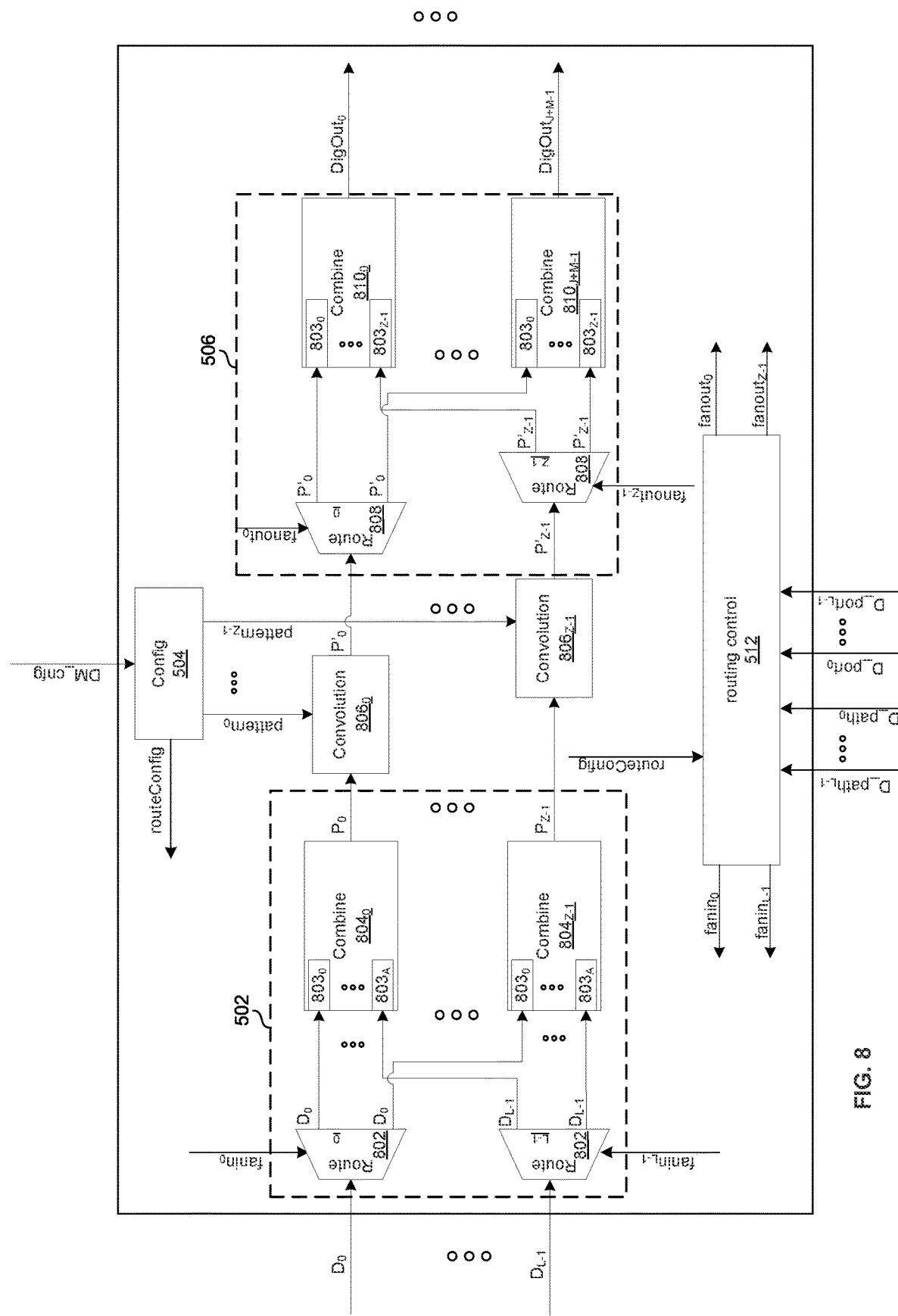
FIG. 8 shows an example implementation of the digital manager of FIG. 3B.

FIG. 8 shows an example implementation of the digital manager of FIG. 3B. The example input routing circuit 502 comprises routing circuits $802_0$-$802_{L-1}$ and combining circuits $804_0$-$804_{L-1}$. The example output routing circuitry 506 comprises circuits routing circuits $808_0$-$808_{Z-1}$ and combining circuits $810_0$-$810_{J-1}$. The example processing path circuits are convolution circuits $806_0$-$806_{Z-1}$.

Each of the routing circuits $802_0$-$802_L$ is operable to route a respective one of signals $D_0$-$D_{L-1}$ to one or more of the combining circuits $804_0$-$804_{Z-1}$. To which of combining circuit(s) $804_0$-$804_{Z-1}$ the signal $D_l$ is routed is determined based on the signal fanin$_l$. In an example implementation, each signal fanin$_l$ is a Z-bits signal and, for a pulser$_l$ instruction, the value of bit z of the signal fanin$_l$ determines whether the signal $D_l$ is to be routed to combining circuit $804_z$ for that instruction. The value of fanin$_l$ may be updated on a per-instruction basis.

Each of combining circuits $804_0$-$804_{L-1}$ is operable to combine up to L of the signals $D_0$-$D_{L-1}$ to generate a corresponding one of signals $P_0$-$P_{Z-1}$. In an example implementation, the combining comprises OR-ing together the values of the up to L signals.

Each of the routing circuits $808_0$-$808_{Z-1}$ is operable to route a respective one of signals $P'_0$-$P'_{Z-1}$ to one or more of the combining circuits $810_0$-$810_{J-1}$. To which of combining circuit(s) $810_0$-$810_{L-1}$ the signal $P'_z$ is routed is determined based on the signal fanout$_z$. In an example implementation, each signal fanout$_z$ is a (J+M−1)-bit signal and the value of bit j+m−1 of the signal fanout$_z$ determines whether the signal $P'_z$ is to be routed to combining circuit $804_{j+m-1}$. In an example implementation the value of fanout$_z$ is preconfigured before the runtime of the pulse program, however, in another implementation it may be updated dynamically (e.g., on a per-instruction basis).

Each combining circuit of combining circuits $810_0$-$810_{J-1}$ is operable to combine up to Z of the signals $P'_0$-$P'_{Z-1}$ (received via inputs $803_0$ to $803_{Z-1}$) to generate a corresponding one of signals DigOut$_0$-DigOut$_{J+M-1}$. In an example implementation, the combining comprises OR-ing together the values of the up to Z signals.

Each convolution circuit $806_z$ is operable to convolve signal $P_z$ with pattern$_z$ to generate signal $P'_z$. In an example implementation, pattern$_z$ is preconfigured before runtime of the pulse program, however, in another implementation it may be updated dynamically. pattern$_z$ may be determined based on: the destination(s) of signal $P_z$ (e.g., to which of controlled circuits 510 and/or input of input manager 352 Pz is intended); characteristics of the corresponding quantum control pulse (e.g., any one or more of its frequency, phase, amplitude, slope, chirp rate, and/or duration); and/or process, temperature, and/or voltage variations.

Figure 9A:
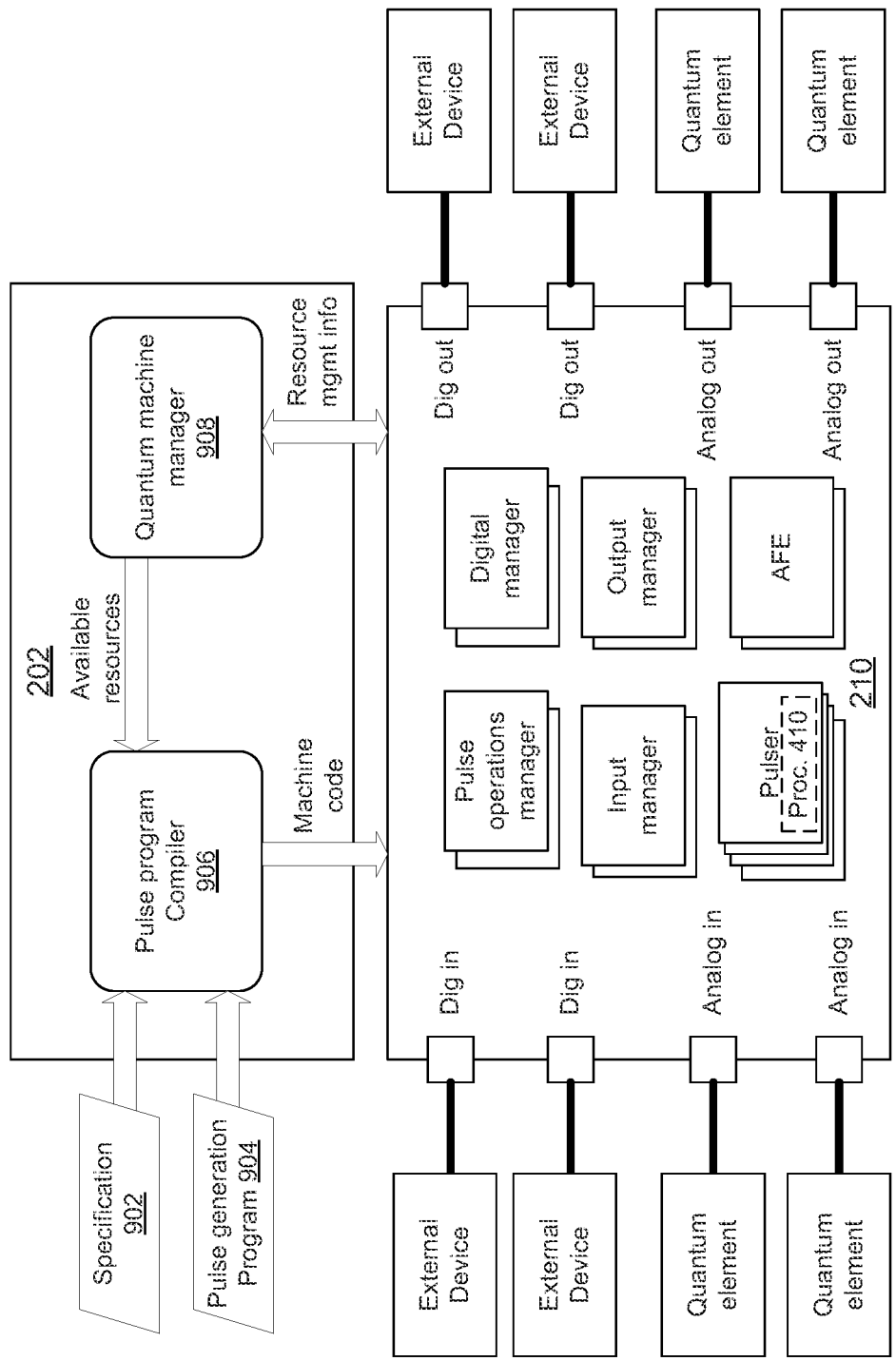
FIG. 9A illustrates configuration and control of the quantum controller via the quantum programming subsystem.

FIG. 9A illustrates configuration and control of the quantum controller via the quantum programming subsystem. In FIG. 9A, the quantum controller 210 comprises one or more instances of various circuits (such as the pulser, input manager, output manager, digital manager, pulse operations manager, and analog front end circuits described above). Connected to the inputs and outputs of the quantum controller 210 may be a plurality of external devices (e.g., oscilloscopes, waveform generators, spectrum analyzers, mixers, amplifiers, etc.) and a plurality of quantum elements. As described in further detail below, these physical circuits can be allocated and deallocated independently of one another such that the physical resources of the quantum controller 210, and the quantum elements and external devices connected to the quantum controller 210 via the analog and digital inputs and outputs, can be organized into one or more "quantum machines."

Also shown in FIG. 9A are a compiler 906 and quantum machines manager 908 of the quantum programming subsystem 202.

The compiler 906 comprises circuitry operable to generate a machine code pulse program description 206 based on: (1) a specification 902; (2) a pulse generation program 904; and (3) a resources management data structure from the quantum machines manager 908.

Figure 9B:
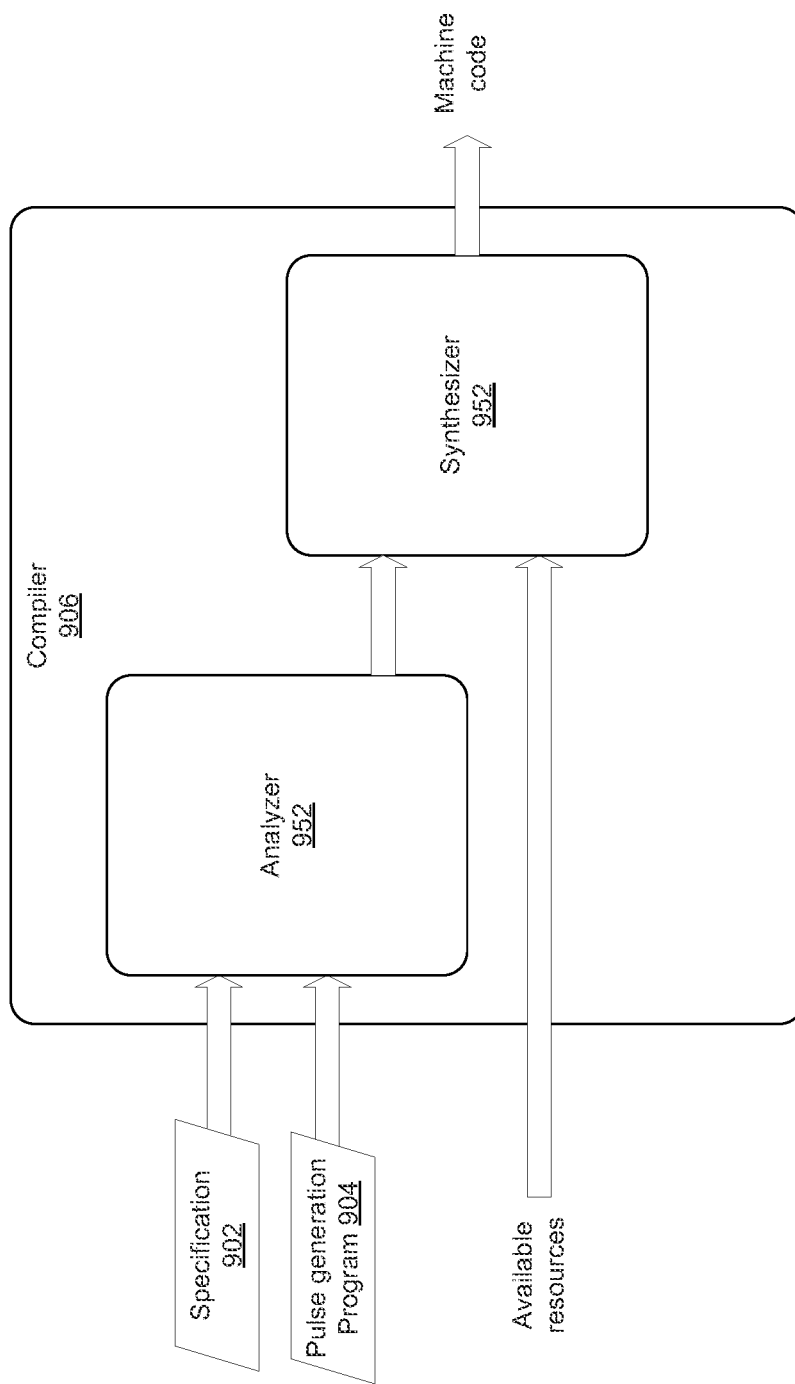
FIG. 9B illustrates an example implementation of the compiler of FIG. 9A.

Referring to FIG. 9B, an example implementation of the compiler 906 comprises analyzer circuitry 952 and synthesizer circuitry 954. The analyzer circuitry 952 is operable to parse the specification 902 and program 904 to generate an intermediate code representation (e.g., a parse tree). The synthesizer circuitry 954 is operable to generate machine code based on the intermediate code representation and the available resources indicated by the quantum machines manager 908.

The specification 902 identifies resources of a quantum machine some of which are mapped to physical circuits during an instantiation of a quantum machines (e.g. input and output ports of the quantum controller 210), and some of which the compiler attaches to physical circuits of the quantum controller 210 during compilation of a Pulse generation Program 904. The compiler 906 may allocate resources for executing the program 904 based on the specification 902, the program 904, and/or the available resources indicated by the quantum machines manager 908. As an example, assume a scenario in which there are five quantum elements in the specification 902 and the program 904 uses only two of the quantum elements; the number of the pulsers $302_0$-$302_L$ allocated may depend on the available resources and the specifics of the program 904. In one case the compiler 906 may allocate a first number (e.g., two) of the pulsers $302_0$-$302_L$ for interfacing with the two quantum elements and in another case the compiler may allocate a second number (e.g., four) for sending pulses to the two quantum elements. Examples of resource definitions which may be present in specification 902 are described below with reference to FIGS. 10A-C. In an example implementation, Python is used as a "host" language for the specification and the specification is a Python dictionary. In this example implementation the Python syntax/constructs can thus be leveraged to create the specification (Python variables, functions, etc.).

The pulse generation program 904 comprises statements that define a sequence of operations to be performed by the quantum machine defined in the specification 902. Such operations typically include the generation of one or more analog pulses to be sent to a controlled element, such as a quantum element. Such operations typically include measuring one or more return pulses from an element. The pulse generation program is also referred to herein as a QUA program. Functions, syntax, etc. of the QUA programming language are described below. In an example implementation, Python is used as a "host" language for the QUA program. This allows leveraging Python syntax/constructs (Python variables, functions, etc.) to generate the QUA program, but it is still a QUA—not Python—program to be compiled by the compiler 906 to generate QOP machine code, and to be executed on the quantum controller/s 210.

In an example implementation, a QUA program defines the sequence of statements for: (1) Generating, shaping and sending pulses to the quantum device; (2) Measuring of pulses returning from the quantum device; (3) Performing real-time classical calculations on the measured data and storing results in classical variables; (4) Performing real-time classical calculations on classical variables; (5) Controlling the flow of the program, including branching statements; and (6) Streaming of data from the quantum controller 210 to the quantum programing system 202 and processing and saving it in the quantum programing system 202.

In addition to the specification of which pulses are played, a QUA program can also specify when they should be played through both explicit and implicit statements and dependency constructs. Thus, a QUA program can define exactly the timing in which pulses are played, down to the single sample level and single clock cycles of the quantum controller 210.

In an example implementation, the pulses syntax defines an implicit pulse dependency, which determines the order of pulse execution. The dependency can be summarized as follows: (1) Each pulse is played immediately, unless dependent on a previous pulse yet to be played; (2) Pulses applied to the same quantum element are dependent on each other according to the order in which they are written in the program In another implementation, timing and ordering or pulses may be set forth explicitly in the QUA program.

Example QUA programming constructs are described below in Table 1.

TABLE 1

| QUA programming constructs |
| --- |
| play(pulse * amp($g_{00}$, $g_{01}$, $g_{10}$, $g_{11}$), qe, duration=None, condition=None, break condition=None ) |
| Play a pulse to an element. |
| The pulse will be modified according to the properties of the element defined in the specification, and then played to the analog output(s) defined in the specification. |
| Parameters: |
|     pulse - name of the pulse, as defined in the quantum machine specification. |
|     qe - name of the quantum element, as defined in the quantum machine specification. |
|     duration - duration of the pulse ("=None" means default is no explicit duration) |
|     $g_{ij}$ - an expression; |
|     amp() - matrix definition; |

TABLE 1-continued

QUA programming constructs condition - if present, the pulse will be played with the condition evaluates to true ("=None" means default is no condition);
break_condition - if present, the pulser will be stopped when the condition evaluates to true ("=None" means default is no break_condition);

It is possible to scale the pulse's amplitude dynamically by using the following syntax:

play('pulse_name' * amp(v), 'element'), where amp(v) = mat(v, 0, 0, v)

where v is a variable.

Moreover, if the pulse is intended for an element that receives a pulse pair and thus is defined with two waveforms, the two waveforms, described as a column vector, can be multiplied by a matrix:

play('pulse_name' * amp([v_00, v_01, v_10, v_11]), 'element'), where v_ij, i,j={0,1}, are variables.

Example:
```
>>> with program() as prog:
>>> v1 = declare(fixed)
>>> assign(v1, 0.3)
>>> play('pulse1', 'qe1')
>>> play('pulse1' * amp(0.5), 'qe1')
>>> play('pulse1' * amp(v1), 'qe1')
>>> play('pulse1' * amp([0.9, v1, -v1, 0.9]), 'qe_iq_pair')
``` wait(duration, *qes)
Wait for the given duration on all provided elements.
During the wait command the quantum controller 210 will output 0.0 to the elements.

Parameters:     duration (int | QUA variable of type int) - time to wait (e.g., in multiples of 4nsec with Range: [4, $2^{24}$] in steps of 1).
*qes (str | sequence of str) - elements to wait on (the asterix denotes there can be 0 or more)

wait_for_trigger(element, pulse_to_play)
Wait for an external trigger on the provided element.
During the wait command the quantum controller 210 will output 0.0 to the elements.

Parameters:     element (str) - element to wait on.
pulse_to_play (str | None) - the name of the pulse to play on the element while waiting for the external trigger. Must be a constant pulse. Can be None to play nothing while waiting.

measure(pulse, qe, Rvar, *outputs)
The measure statement allows operating on a quantum element (which has outputs), by sending a pulse to it, after some time acquiring the returning signal and processing it in various ways
An element for which a measurement is applied must have outputs defined in the quatum machine specification.
A measurement may comprise:
- playing a pulse to the element (identical to a play statement)
- waiting for a duration of time defined as the time_of_flight in the definition of the element, and then sampling the returning pulse. The analog input to be sampled is defined in the definition of the element.
- processing the returned samples using the listed process(es) (if any). The processing could be, for example, demodulation and integration with specified integration parameters, which may produce a scalar or a vector; filtering by a FIR filter, and/or processing by in a neural network.

Parameters
    pulse - name of the pulse, as defined in the quantum machine specification. Pulse must have a measurement operation.
    qe - name of the element, as defined in the quantum machine specification. The element must have outputs.
    Rvar - a result variable reference, a string, or 'None'. If Rvar is a result variable reference, the raw ADC data will be sent to the quantum programing subsystem 202 and processed there according to the result processing section of the QUA program. If Rvar is a string the raw ADC data will be sent to the quantum programming subsystem 202 and saved as it is with the default minimal processing. If Rvar is set to None, raw results will not be sent to quantum programming subsystem 202 and will not be saved. In one implementation, the raw results will be saved as long as the digital pulse that is played with pulse is high.
    outputs - a tuple with the form (processing identifier, params, variable name), where:
       processing reference
          defined in the top-level specification and/or in reserved words of the QUA language and referred to in the pulse definition.
       Params
          parameters passed to the processing reference
       variable name
          the name of a QUA variable to which the processing result is assigned.
    zero or more output tuples may be defined.

Example:
```
>>> with program() as prog:
>>> I = declare(fixed)
>>> Q = declare(fixed)
>>>
>>> # measure by playing 'meas_pulse1' to QE 'rr1', do not save raw results.
>>> # demodulate and integrate using 'cos_weights' and store result in I, and also
>>> # demodulate and integrate using 'sin_weights' and store result in Q
>>> measure('meas_pulse1', 'rr1', None, ('int', 'cos_weights', I), ('int' 'sin_weights', Q))
>>>
```

TABLE 1-continued

QUA programming constructs

```
>>> # measure by playing 'meas_pulse2' to QE 'rr1', save raw results to tag 'samples'.
>>> # demodulate and integrate data from 'out1' port of 'rr1' using the 'optimized_weights'
integration parameters
>>> # store result in I
>>> measure('meas_pulse2', 'rr1', 'samples', ('int', 'optimized_weights', 'out1', I))
``` align(*qes)
    Align several quantum elements together.
    All of the quantum elements referenced in *qes will wait for all the others to finish their
    currently running statement.
    Parameters
    • *qes (str | sequence of str) - a single quantum element, or list of quantum elements pause()
    Pause the execution of the job until QmJob.resume() is called.
    The quantum machines freezes on its current output state.

declare(t)
    Declare a QUA variable to be used in subsequent expressions and assignments.
    Declaration is performed by declaring a python variable with the return value of this function.
    Parameters
    • t - The type of QUA variable. Possible values: int, fixed, bool, where:
        int
            a signed 32-bit number
        fixed
            a signed 4.28 fixed point number
        bool
            either True or False
    Returns
    The variable
    Example:
```
>>> a = declare(fixed)
>>> play('pulse' * amp(a), 'qe')
``` assign(var, _exp)
    Set the value of a given QUA variable.
    Parameters
    • var (QUA variable) - The variable to set (defined by the declare function)
    • _exp (QUA expression) - An expression to set the variable to
    Example:
```
>>> with program() as prog:
>>> v1 = declare(fixed)
>>> assign(v1, 1.3)
>>> play('pulse1' * amp(v1), 'qe1')
``` save(var, tag)
    Save a QUA variable with a given tag.
    The tag will appear later as a field in the saved results object returned by QmJob.get_results().
    The type of the variable determines the python type, according to the following rule:
    • int -> int
    • fixed -> float
    • bool -> bool
    Parameters
    • var (QUA variable) - A QUA variable to save
    • tag (str) - A name to save the value under update_frequency(qe, new_frequency)
    Dynamically update the frequency of the NCO associated with a given quantum element.
    This changes the frequency from the value defined in the quantum machine specification.
    Parameters
    • qe (str) - The quantum element associated with the NCO whose frequency will be
      changed
    • new_frequency (int) - The new frequency value to set in units of Hz. Range: (0 to
      5000000) in steps of 1.
    Example:
```
>>> with program() as prog:
>>> update_frequency("q1", 4000000)
``` z_rotation(angle, *qes)
    Shift the phase of the NCO associated with a quantum element by the given angle.
    This is typically used for virtual z-rotations. Equivalent to z_rot()
    Parameters
    • angle (float) - The angle to add to the current phase (in radians)
    • *qes (str | sequence of str) - A quantum element, or sequence of quantum elements,
      associated with the NCO whose phase will be shifted z_rot(angle, *qes)
    Shift the phase of the NCO associated with a quantum element by the given angle.
    This is typically used for virtual z-rotations. Equivalent to z_rotation()
    Parameters
    • angle (float) - The angle to add to the current phase (in radians)
    • *qes (str | sequence of str) - A quantum element, or sequence of quantum elements,
      associated with the NCO whose phase will be shifted TABLE 1-continued QUA programming constructs set_frame(qes, angle)
    Set the phase of the frame matrix associated with a quantum element to the given angle.
reset_phase(qes, angle)
    Set the total phase of the frequency modulation of a quantum element to zero (both the
    frequency modulation matrix and the frame matrix).
infinite_loop_()
    Infinite loop flow control statement in QUA.
    To be used with a context manager.
    Optimized for zero latency between iterations, provided that no more than a single quantum
    element appears in the loop.
    Note
    In case multiple quantum elements need to be used in an infinite loop, it is possible to add
    several loops in parallel (see example).
    Example:
    >>> with infinite_loop_():
    >>> play('pulse1', 'qe1')
    >>> with infinite_loop_():
    >>> play('pulse2', 'qe2')
for(var=None, init=None, cond=None, update=None)
    For loop flow control statement in QUA.
    To be used with a context manager.
    Parameters
    • var (QUA variable) - QUA variable used as iteration variable
    • init (QUA expression) - an expression which sets the initial value of the iteration variable
    • cond (QUA expression) - an expression which evaluates to a boolean variable, determines
      if to continue to next loop iteration
    • update (QUA expression) - an expression to add to var with each loop iteration
    Example:
    >>> x = declare(fixed)
    >>> with for(var=x, init=0, cond=x<=1, update=x+0.1):
    >>> play('pulse', 'qe')
if(condition)
    If flow control statement in QUA.
    To be used with a context manager.
    The QUA code block following the statement will be executed only if condition evaluates to
    true.
    Parameters
    • condition - A boolean expression to evaluate
    Example:
    >>> x=declare(int)
    >>> with if_(x>0):
    >>> play('pulse', 'qe')
else
    Else flow control statement in QUA.
    To be used with a context manager.
    Must appear after an if() statement.
    The QUA code block following the statement will be executed only if expression in
    preceding if() statement evaluates to false.
    Example:
    >>> x=declare(int)
    >>> with if(x>0):
    >>> play('pulse', 'qe')
    >>> with else():
    >>> play('other_pulse', 'qe')
IO1, IO2
    Reserved variables which operate just like other QUA variables but which refer to dedicated
    registers/memory locations in the I/O Manager 368 that can be read from and written to in
    real time in a pulse program and via the quantum machine manager API (an example of
    which is shown below in Table 6).
    Example usage in a QUA program:
      >>> pause()
      >>> play(pulse1*amp(IO1), qubit2)

The Play statement in QUA instructs the quantum controller 210 to send the indicated pulse to the indicated element. The quantum controller 210 will modify or manipulate the pulse according to the element's properties defined in the quantum machine specification (i.e., the compiler will generate the required pulse modification settings which will then be stared to the appropriate one or more of pulse modification settings circuit(s) $504_0$-$504_{K-1}$), so the user is relieved of the burden of having to specify the modifications/manipulations in each individual Play statement.

If the element has a single input, the pulse sent to it may be defined with a single waveform. For example:

```
'elements': {
    'qubit': {
        'SingleInput': {
            'port': ('con1', 1),
        },
        'intermediate_frequency': 70e6,
        'operations': {
            'pulse1': 'pulse1'
```

```
      },
    },
}
'pulses': {
    'gauss_pulse_in': {
        'operation': 'control',
        'length': 12,
        'waveforms': {
            'single': 'wf1',
        },
    }
},
'waveforms': {
    'wf1': {
        'type': 'arbitrary',
        'samples':[0.49, 0.47, 0.44, 0.41, 0.37,
            0.32, 0.32, 0.37, 0.41, 0.44, 0.47, 0.49]
    },
}
```

Denoting the samples of the waveform as $s_i$, the play statement instructs the quantum controller 210 to modulate the waveform samples with the intermediate frequency of the element:

$$\tilde{s}_i = s_i \cos(\omega_{IF} t + \phi_F)$$

$\omega_{IF}$, is the intermediate frequency defined in the quantum machine specification of the element and $\phi_F$ is the frame phase, initially set to zero (see z_rot statement specifications for information on $\phi_F$) The quantum controller 210 then plays $s_i$ to the analog output port defined in the definition of the element (in the above example, port 1).

If the element has two mixed inputs (i.e. two output ports of the quantum controller 210 are connected to the element via an IQ mixer), in addition to the intermediate frequency, a mixer and a lo_frequency may be defined in the quantum machine specification. For example:

```
'elements': {
    'qubit': {
        'mixedInputs': {
            'I': ('con1', 1),
            'Q': ('con1', 2),
            'mixer': 'mixer1',
            'lo_frequency': 5.1e9,
        },
        'intermediate_frequency': 70e6,
        'operations': {
            'pulse1': 'pulse1'
        },
    },
},
```

A pulse that is sent to such element may be defined with two waveforms. For example:

```
'pulses': {
    'pulse1': {
        'operation': 'control',
        'length': 12,
        'waveforms': {
            'I': 'wf_I',
            'Q': 'wf_Q',
        },
    },
},
'waveforms': {
    'wf_I': {
        'type': 'arbitrary',
        'samples':[0.49, 0.47, 0.44, 0.41, 0.37,
            0.32, 0.32, 0.37, 0.41, 0.44, 0.47, 0.49]
    },
```

```
    },
    'wf_Q': {
        'type': 'arbitrary',
        'samples': [0.02, 0.03, 0.03, 0.04, 0.05,
            0.00, 0.05, 0.04, 0.03, 0.03, 0.02, 0.02]
    },
}
```

In addition, a mixer can be defined with a mixer correction matrix that corresponds to the intermediate_frequency and the lo_frequency. For example:

```
'mixers': {
    'mixer1': [
        {
            'intermediate_frequency': 70e6,
            'lo_frequency': 5.1e9,
            'correction': [0.9, 0.003, 0.0, 1.05]
        }
    ],
```

Denoting the samples of the waveforms by $I_i$ and $Q_i$ the play statement instructs the quantum controller 210 to modulate the waveform samples with the intermediate frequency of the element and to apply the mixer correction matrix in the following way:

$$\begin{pmatrix} \tilde{I}_i \\ \tilde{Q}_i \end{pmatrix} = \begin{pmatrix} C_{00} & C_{01} \\ C_{10} & C_{11} \end{pmatrix} \begin{pmatrix} \cos(\omega_{IF} t + \phi_F) & -\sin(\omega_{IF} t + \phi_F) \\ \sin(\omega_{IF} t + \phi_F) & \cos(\omega_{IF} t + \phi_F) \end{pmatrix} \begin{pmatrix} I_i \\ Q_i \end{pmatrix}$$

$\omega_{IF}$, is the intermediate and the $C_{ij}$'s are the matrix elements of the correction matrix defined in the mixer for the relevant intermediate_frequency and lo_frequency. As mentioned above, $\phi_F$ is the frame phase, initially set to zero (see z_rot statement specifications for information on $\phi_F$). The quantum controller 210 then plays $I_i$ and $Q_i$ to the analog output ports defined in the definition of the element (in the above example, port 1 and port 2, respectively).

An element could have digital inputs as well as analog inputs. Each digital input of an element may be defined with three properties: port, delay, and buffer. For example:

```
'elements': {
    'qubit': {
        'mixedInputs': {
            'I': ('con1', 1),
            'Q': ('con1', 2),
            'mixer': 'mixer1',
            'lo_frequency': 5.1e9,
        },
        'intermediate_frequency': 70e6,
        'digital_inputs':
            'digital_input1':
                'port': (con1, 1)
                'delay': 144
                'buffer': 8
            'digital_input2':
                'port': (con1, 2)
                'delay': 88
                'buffer': 20
        'operations': {
            'pulse1': 'pulse1'
        },
    },
},
```

For a simple example, a pulse that is played to such quantum element could include a single digital marker which points to a single digital waveform. For example:

```
'pulses': {
    'pulse1': {
        'operation': 'control',
        'length': 40,
        'waveforms': {
            'I': 'wf_I',
            'Q': 'wf_Q',
        },
        'digital_marker': 'digital_waveform_high'
    },
},
'digital_waveforms': {
    'digital_waveform_high': {
        'samples': [(1, 0)]
    },
}
```

The coding of the digital waveform may be a list of the form: [(value, length), (value, length), . . . , (value, length)], where each value is either 0 or 1 indicating the digital value to be played (digital high or low). Each length may be an integer (e.g., divisible by 4 in one example implementation) indicating for how many nanoseconds the value should be played. A length 0 indicates that the corresponding value is to be played for the remaining duration of the pulse. In the example above, the digital waveform is a digital high.

When such pulse is played to the element, via the play or the measurement command, the digital waveform may be sent to all the digital inputs of the element. For each digital input, however, the quantum controller 210 may: (1) Delay the digital waveform by the delay that is defined in the definition of the digital input (e.g., given in ns); (2) Convolve the digital waveform with a digital pattern that is high for a duration which is, for example, twice the buffer that is defined in the definition of the digital input (e.g., given in ns in a "buffer"); and (3) Play the digital waveform to the digital output of the quantum controller 210 that is indicated in the quantum machine specification to be connected to the digital input. In other implementations, the digital pattern with which the digital waveform to be convolved may be more complex than a simple high value. In one such example, the "buffer" object may comprise "duration" and "pattern" properties.

In the example above a play(pulse1, qubit) command would play: (1) A digital waveform to digital output 1, which starts 144 ns after the analog waveforms and which is high for 56 ns (the length of the pulse plus 2×8 ns); and (2) A digital waveform to digital output 2, which starts 88 ns after the analog waveforms and which is high for 80 ns (the length of the pulse plus 2×20 ns).

A measurement can be done for an element that has outputs defined in the quantum machine specification. For example:

```
'elements': {
    'resonator': {
        'mixedInputs': {
            'I': ('con1', 3),
            'Q': ('con1', 4),
            'mixer': 'mixer1',
            'lo_frequency': 7.3e9,
        },
```

-continued

```
        'intermediate_frequency': 50e6,
        'outputs': {
            'out1': : ('con1', 1),
        },
        'time_of_flight': 196,
        'smearing': 20,
    },
},
```

As seen in the above example, when a quantum element has outputs, two additional properties may be defined: time_of_flight and smearing. The pulse used in a measurement statement may also be defined as a measurement pulse and may have integration_weights defined. For example:

```
'pulses': {
    'pulse1': {
        'operation': 'measurement',
        'length': 400,
        'waveforms': {
            'I': 'meas_wf_I',
            'Q': 'meas_wf_Q',
        },
        'integration_weights': {
            'integ1': 'integW1',
            'integ2': 'integW2',
        }
'integration_weights': {
    'integW1': {
        'cosine': [0.0, 0.5, 1.0, 1.0, ..., 1.0, 0.5, 0.0]
        'sine': [0.0, 0.0, ..., 0.0]
    },
    'integW2': {
        'cosine': [0.0, 0.0, ..., 0.0]
        'sine': [0.0, 0.5, 1.0, 1.0, ...,1.0, 0.5, 0.0]
    },
}
```

A measurement statement, such as the one shown above, instructs the quantum controller 210 to: (1) Send the indicated pulse to the indicated element, manipulating the waveforms in the same manner that is described in the play statement section above; (2) After a time period time_of_flight (e.g., given in ns), samples the returning pulse at the quantum controller 210 input port/s that is/are connected to the output/s of the element. It saves the sampled data under stream_name (unless stream_name=None, in which case the sampled data will not be saved). The sampling time window will be of a duration that is the duration of the pulse plus twice the smearing (e.g., given in ns). This accounts for the returning pulse that is longer than the sent pulse due to the response of the quantum device, as well as for the cables and other elements in the pulse's path; and (3) Process the sampled data according to the parameters specified in the measure statement.

An example of processing the sampled data according to a measure statement is demodulation of the sampled data with a frequency intermediate_frequency, defined in the definition of the element, weighted integration of the demodulated data with integration parameters ("integration_weights") that are defined in the quantum machine specification and are specified in the measure statement, and storing of the result in the indicated variable. The quantum controller 210 can perform multiple (e.g., 10 or more) demodulations and integrations at any given point in time, which may or may not be a part of the same measurement statement. The precise mathematical operation on the sampled data is:

$$\text{variable} = \sum_i s_i[w_c^i \cos(\omega_{IF} t_i + \phi_F) + w_s^i \sin(\omega_{IF} t_i + \phi_F)]$$

where $s_i$ is the sampled data, $\omega_{IF}$ is the intermediate_frequency, $\phi_F$ is the frame phase discussed in the z_rot statement below, and $w_c^i$ and $w_s^i$ are the cosine and sine integration_weights. In an example implementation, the integration_weights are defined in a time resolution of 4 ns, while the sampling is done with time resolution of 1 ns (1 GSa/Sec sampling rate):

$$w_{c/s}^{4i} + w_{c/s}^{4i+1} + w_{c/s}^{4i+2} + w_{c/s}^{4i+3}$$

In the above example, the integration parameters consist of a vector of integration weights (which may be a vector with single integration weight to be used as a constant integration weight) and the received samples of the measurement pulse are integrated to generate a scalar result. In another implementation, the integration parameters may comprise an integration weights vector and other parameters to be used for specifying how to perform a series of integrations to generate a vector of integration results rather than a scalar. For simplicity, the following examples use integrations that results in two-element vectors, but other implementations may generate vectors with three or more elements.

For example, the integration parameters may specify a first set of integration weights to be used for a first plurality of samples of the received measurement pulse (e.g., a first 100 ns of the pulse), and a second set of integration weights to be used for a second plurality of samples of the received measurement pulse (e.g., a second 100 ns of the pulse). The parameters may also indicate whether the integration of each portion should start from zero (referred to here as "chunked integration") or accumulated with the result from the previous portion (referred to here as "accumulated" integration).

Another option is the integration parameters may indicate the integration is to generate a moving average. The integration parameters may specify a length an offset of integration windows on which chunked integration is to be performed using those windows. For example, the parameters may specify 100 ns windows offset by 40 ns and then chunked integration may be performed on samples of the measurement pulse from 0 to 100 ns, from 40 ns to 140 ns, from Sons to 180 ns, and so on for the duration of the pulse.

Another example of processing the sampled data according to a measure statement is processing of the data by a neural network with parameters defined in the quantum machine specification and/or specified in the measure statement and storing of the result in the indicated variable which can be a scalar or a vector.

Another example of processing the sampled data according to a measure statement is when the element's output is a digital output and thus the sampled data is digital. One example processing of this data can be counting of the number of digital pulses that arrive to the relevant controller's input in a given time window. Another example may be the time tagging of the arrival of pulses that arrive in a given time window relative to the beginning of the window.

Compilation may include allocating specific resources of the quantum controller 210 to that quantum machine and then generating machine code that, when executed by quantum controller 210, will use those allocated resources.

Figure 13A:
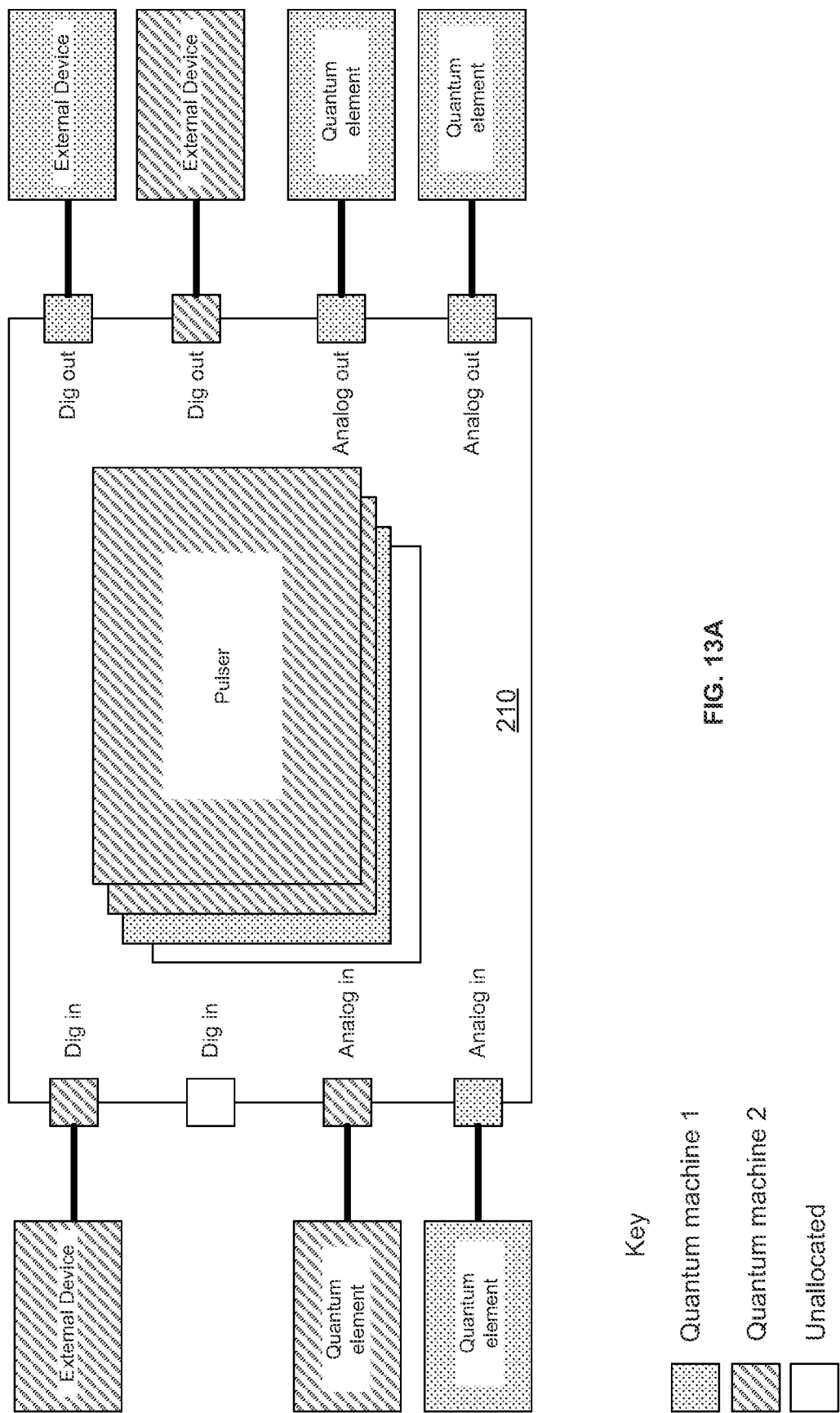
FIGS. 13A and 13B illustrate the modular and reconfigurable nature of the QOP.

The quantum machines manager 908 comprises circuitry operable to determine resources present in the quantum controller 210 and the availability of those resources at any given time. To determine the resources, the quantum machines manager 908 may be operable to read one or more configuration registers of the quantum controller 210, inspect a netlist of one or more circuits of the quantum controller 210, and/or parse hardware description language (HDL) source code used to define circuits of the quantum controller 210 and/or other files used to describe various configurations of the hardware and software components. Once the resources are determined, the quantum machines manager 908 may keep track of which resources are in use and which are available based on which quantum machines are "open" (i.e., in a state where some resources are reserved for that machine regardless of which, if any, pulse program that quantum machine is executing at that time), and/or which pulse programs are loaded into and/or being executed by the quantum controller 210 at that time. For example, referring briefly to FIG. 13A, during a time period where two quantum machines are open, each executing one of a first two pulse programs ("Program 1" and "Program 2"), the system may be configured as shown in FIG. 13A and a data structure managed by the quantum machines manager 908 may reflect the situation as shown in Table 2.

TABLE 2

Example data structure maintained by quantum machines manager

| Resource | Status | Resource | Status |
|---|---|---|---|
| Pulsar 1 | Allocated to program 2 | Port 3 | Allocated to QM2 |
| Pulsar 2 | Allocated to program 2 | Port 4 | Allocated to QM1 |
| Pulsar 3 | Allocated to program 1 | Port 5 | Allocated to QM1 |
| Pulsar 4 | Available | Port 6 | Allocated to QM2 |
| Port 1 | Allocated to QM2 | Port 7 | Allocated to QM1 |
| Port 2 | Available | Port 8 | Allocated to QM1 |

Figure 13B:
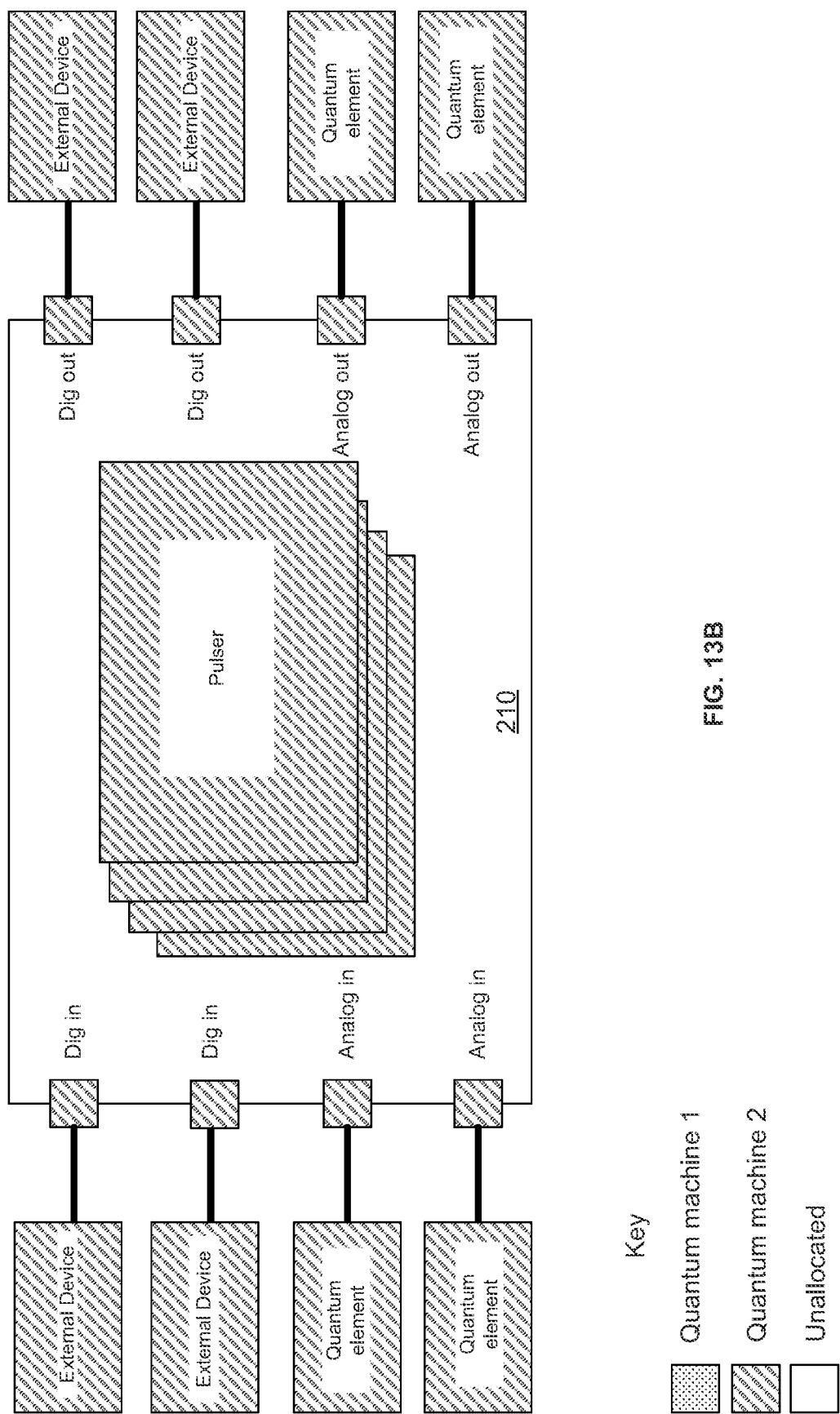

During another time period where a single quantum machine is open and executing a third pulse program ("Program 3"), the system may be configured as shown in FIG. 13B. The data structure managed by the quantum machines manager 908 may reflect the situation as shown in Table 3.

TABLE 3

Example data structure maintained by quantum machines manager

| Resource | Status | Resource | Status |
|---|---|---|---|
| Pulsar 1 | Allocated to program 3 | Port 3 | Allocated to QM3 |
| Pulsar 2 | Allocated to program 3 | Port 4 | Allocated to QM3 |
| Pulsar 3 | Allocated to program 3 | Port 5 | Allocated to QM3 |
| Pulsar 4 | Allocated to program 3 | Port 6 | Allocated to QM3 |
| Port 1 | Allocated to QM3 | Port 7 | Allocated to QM3 |
| Port 2 | Allocated to QM3 | Port 8 | Allocated to QM3 |

Table 4 below shows an example schema which uses Python as a host language the quantum machine specification is one or more Python dictionaries.

TABLE 4

| | Example quantum machine specification schema |
|---|---|
| version | integer <int32> |
| | schema version. |
| controllers | object |
| | A collection of controllers. Each controller represents a control and computation resource on the quantum controller 210 hardware. |
|   property name* | object (controller) |
| | specification of a single quantum control module. Here we define its static properties. |
|     analog_outputs | object |
| | a collection of analog output ports and the properties associated with them |
|       property name* | object (quantum control module analog output port) |
| | specification of the properties of a physical analog output port of the quantum control module. |
|         offset | number |
| | DC offset to output, range: (−0.5, 0.5). Will be applied only when program runs. |
|     digital_outputs | object |
|       property name* | object (quantum control module digital port) |
| | specification of the properties of a physical digital output port of the quantum control module. |
|         offset | number |
|     analog | object |
| | a collection of analog output ports and the properties associated with them. |
|       Property name* | object (quantum control module analog output port) |
| | specification of the properties of a physical analog output port of the quantum control module. |
|         offset | number |
| | DC offset to output, range: (−0.5, 0.5). Will be applied only when program runs. |
|     type | string |
| | Default: "opx1" |
|     analog_inputs | object |
|       Property name* | object (quantum control module analog input port) |
| | specification of the properties of a physical digital input port of the quantum control module. |
|         Offset | number |
| elements | object |
| | A collection of quantum elements and/or external devices. Each quantum element represents and describes a controlled entity which is connected to the ports (analog input, analog output and digital outputs) of the quantum control module. |
|   property_name* | object (quantum element (QE)) |
| | specification of a single element. Here we define to which port of the quantum control module the element is connected, what is the RF frequency of the pulses sent and/or received from this element |
|     frequency | integer <int32> |
| | resonance frequency [Hz]. Actual carrier frequency output by the quantum control module to the input of this QE is frequency - lo_frequency. |
|     mixInputs | object (mixer input) |
| | specification of the input of a QE which is driven by an IQ mixer |
|       I | string |
| | (tuple) of the form ((string) controller name, (int) controller output/input port) |
|       Q | string |
| | (tuple) of the form ((string) controller name, (int) controller output/input port) |
|       mixer | string |
| | the mixer used to drive the input of the QE, taken from the names in mixers entry in the main quantum machine specification |
|       lo_frequency | integer <int32> |
| | the frequency of the local oscillator which drives the mixer |
|     outputs | object |
| | collection of up to two output ports of QE. Keys: "out1" and "out2". |
|       property_name* | string |
| | (tuple) of the form ((string) controller name, (int) controller output/input port) |
|     intermediate_frequency | integer <int32> |
| | intermediate frequency [Hz]. The actual frequency to be output by the quantum control module to the input of this element |

TABLE 4-continued

Example quantum machine specification schema

| | |
|---|---|
| measurement_qe | String<br>A reference to an element that has outputs (and thus can be measured using the measurement command). This can be specified for any element that does not have outputs so that whenever a measurement command is used to measure this elements, the actual measurement will be of the referenced element. |
| smearing | integer <int32><br>padding time, in nsec, to add to both the start and end of the raw data streaming window during a measure command. |
| time_of_flight | integer <int32><br>delay time [nsec] from start of pulse until output of QE reaches quantum control module. Minimal value: 180. Used in measure command, to determine the delay between the start of a measurement pulse and the beginning of the demodulation and/or raw data streaming window. |
| singleInput | object (single input)<br>specification of the input of a QE which has a single input port |
|   port | string<br>(tuple) of the form ((string) controller name, (int) controller output/input port) |
|   operations | object<br>A collection of all pulse names to be used in play and measure commands |
|     property_name* | string<br>the name of the pulse as it appears under the "pulses" entry in the quantum machine specification |
| digitalInputs | object |
|   property_name* | object (digital input)<br>specification of the digital input of a QE |
|     port | string<br>(tuple) of the form ((string) controller name, (int) controller output/input port) |
|     delay | integer <int32><br>the digital pulses played to this QE will be delayed by this amount [nsec] relative to the analog pulses.<br>An intinsic negative delay of 143+−2nsec exists by default |
|     output | string<br>(tuple) of the form ((string) controller name, (int) controller output/input port) |
|     buffer | integer <int32><br>all digital pulses played to this QE will be convolved with a digital pulse of value 1 with this length [nsec] |
| pulses | object<br>A collection of pulses to be played to the quantum elements. In the case of a measurement pulse, the properties related to the measurement are specified as well. |
|   property_name* | object (pulse)<br>specification of a single pulse. Here we define its analog and digital components, as well as properties related to measurement associated with it. |
|     integration_weights | object<br>if measurement pulse, a collection of integration weights associated with this pulse,<br>to be applied to the data output from the QE and sent to the controller.<br>Keys: name of integration weights to be used in the measurement command. |
|       property_name* | string<br>the name of the integration weights as it appears under the "integration_weigths" entry in the quantum machine specification |
|     waveforms | object<br>a specification of the analog waveform to be played with this pulse.<br>If associated element has singleInput, key is "single".<br>If associated element has "mixInputs", keys are "I" and "Q". |
|       property_name* | string<br>name of waveform to be played at the input port given in associated keys |
|     digital_marker | string<br>name of the digital marker to be played with this pulse |
|     operation | string<br>type of operation. Possible values: control, measurement |
|     length | integer <int32><br>length of pulse [nsec]. Possible values: 16 to 4194304 in steps of 4 |

TABLE 4-continued

Example quantum machine specification schema

| | |
|---|---|
| waveforms | object |
| | A collection of analog waveforms to be output when a pulse is played. Here we specify their defining type (constant, arbitrary or compressed) and their actual datapoints. |
|   property_name | arbitrary waveform (object) or constant waveform (object) or compressed waveform (object) |
|     type | 'arbitrary' \| 'constant' \| 'compressed' |
|     samples | If type = 'arbitrary': |
| |   Array of numbers <float> |
| |   list of values of arbitrary waveforms, range: (−0.5, 0.5) |
| | If type = 'constant': |
| |   number <float> |
| |   value of constant, range: (−0.5, 0.5) |
| | If type = 'compressed': |
| |   Array of numbers <float> |
| |   Integer <int32> |
| digital_waveforms | object |
| | A collection of digital waveforms to be output when a pulse is played. Here we specify their actual datapoints. |
|   property_name* | object (digital waveform) |
| | raw data samples of a digital waveform |
|     samples | Array of strings |
| | (list of tuples) specifying the analog data according to following code: |
| | The first entry of each tuple is 0 or 1 and corresponds to the digital value, and the second entry is the length in nsec to play the value, in steps of 1. If value is 0, the value will be played to end of pulse. |
| integration_weights | object |
| | A collection of integration weight vectors used in the demodulation of pulses returned from a quantum element. |
|   property_name* | object (integration weights) |
| | specification of a set of measurement integration weights. |
| | Result of integration will be: |
| | sum over i of (W_cosine[i]cos[wt[i]] + W_sine[i]sin[wt[i]])analog[i]. |
| | Here: |
| | w is the angular frequency of the quantum element, and analog[i] is the analog data acquired by the controller. |
| | W_cosine, W_sine are the vectors associated with the 'cosine' and 'sine' keys, respectively. |
| | Note: the entries in the vector are specified in 4nsec intervals, and each entry is repeated four times during the demodulation. |
| | Example: |
| | W_cosine = [2.0], W_sine = [0.0] will lead to the following demodulation operation: |
| | 2.0(cos[wt[0]]analog[0] + cos[wt[1]]analog[1] + [cos][wt[2]]analog[2] + cos[wt[3]]analog[3]) |
|     sine | Array of numbers <float> |
| | W_sine, a fixed-point vector of integration weights, range: [−2048, 2048] in steps of 2**−15 |
|     cosine | Array of numbers <float> |
| | W_cosine, a fixed-point vector of integration weights, range: range: [−2048, 2048] in steps of 2**−15 |
| mixers | object |
| | A collection of IQ mixer calibration properties, used to post-shape the pulse to compensate for imperfections in the mixers used for upconverting the analog waveforms. |
|   property_name* | Array of objects (mixer) |
|     intermediate_frequency | integer <int32> |
| | intermediate frequency associated with correction matrix |
|     lo_freq | integer <int32> |
| | local oscillator (LO) frequency associated with correction matrix |
|     correction | string |
| | (tuple) a 2×2 matrix entered as a four-element tuple specifying the correction matrix |

Elements of the quantum processor, (e.g. qubits, resonators, flux lines, gates, etc.), external devices (e.g., oscilloscopes, spectrum analyzers, waveform generators, etc.), and/or any other element which is a part of a quantum machine and is connected to output and/or input ports of the controller 210, are defined using one or more of the other properties described in Table 4 and/or other similar properties which may be used in other implementations.

An example of other properties which may be used to specify an element are properties of a neural network that processes pulses sent to the element. For example, an element specification may specify that pulses sent to it are to be generates and/or processed by a neural network and the element definition may include one or more parameters specifying the number of layers of the neural network, the number of neurons of the neural network, the weights and biases for each neuron of the neural network, and/or other parameters familiar to those working with neural networks. The neural network having the specified parameters may then be trained during a calibration routine (e.g., at the beginning of execution of a QUA program).

For each element defined in a specification 902, the controller output and/or input ports to which it is connected are defined. During compilation, pulse modification settings for manipulating pulses intended for an element may be generated (for loading into pulse modification settings circuits 504) and the pulse modification setting circuit(s) 504 to which they will be loaded before execution may be chosen and may be allocated to the quantum machine on which the program is to be executed. Similarly, parameters and configurations of operations that will be performed on input signals related to an element (e.g. readout/measurement pulses) may be generated during compilation (for loading into compute and signal processing circuits 410). Likewise, the compute and signal processing circuit 410 in which they will be used may be chosen during compilation and may be allocated to the quantum machine on which the program is to be executed during compilation.

One example of an element that a quantum machine may contain is an IQ mixer that is connected to two output ports of the controller 210. To correct for mixer imbalances, the in-phase/quadrature (IQ) waveforms of the pulse can be multiplied by a 2×2 mixer correction matrix before being sent to the output ports. This mixer correction matrix, determined via a calibration routine, may be frequency dependent. Thus, a mixer definition may include the mixer's name and a list of one or more frequencies and the correction matrix to be used at each frequency. In one example implementation, the correction matrix is loaded into corresponding pulse modification circuit during compilation. Similarly, an element definition may include an intermediate frequency with which every pulse sent to the element is to be modulated.

An example quantum machine specification file is described below with reference to FIGS. 10A-10C. While the example implementations we show here (including the one Table 4 refers to) show some possible properties that can be defined and specified in the quantum machine specification, it is not limited to these examples. For example, various filters and their parameters may be defined (e.g. FIR filter) to be performed on pulses to be played to certain elements and/or on input signals to the controller.

Pulses available for transmission by a quantum machine may be defined using one or more of the properties described in Table 4 and/or other similar properties which may be used in other implementations. Each pulse has a length. Each pulse is made of one or more waveforms. In one implementation there are two types of pulses: control pulses that are pulses that are only sent to the quantum system and will not be measured, and measurement pulses that are sent to the quantum system and will be measured upon return. The definition of a measurement pulse may specify parameters to be used for processing the measurement pulse upon its return from the element to which it was sent. Such parameters may include, for example, integration weights, integration method (e.g., normal, chunked, accumulated, moving average, etc.), parameters (e.g., number of layers, number of neurons, weights and biases, and/or the like) of a neural network, parameters (e.g., number of taps and tap coefficients) of a FIR filter, and/or the like. During compilation, pulse definitions may be used to, for example: generate pulse templates to load into pulse template memory 404; generate instructions to be loaded into instruction memory 402 and/or compute and signal processing circuit 410 for retrieving and manipulating the contents of pulse template memory 404 to achieve the defined pulses; and/or generate one or more classical processor programs to be executed by compute and signal processing circuit 410 for processing readout/measurement pulses.

FIGS. 10A-10C show an example quantum machine specification. The example shown uses Python as a host language. The example quantum machine specification is a Python dictionary with a key of "config" and a value that comprises a plurality of nested objects, some of which are key-value pairs and some of which are nested dictionaries.

The "version" key-value pair which indicates the version of the quantum machine specification schema being used.

The "controllers" object is used to specify the number of modules/units that make up the quantum controller 210 of the quantum machine. The example shown specifies just a single quantum control module named "con1", which is of type "opx1" (different opx types may, for example, indicated different hardware and/or configuration of the hardware). For each controller 210, the output and input ports that are used in the quantum machine are specified. For analog outputs and inputs, DC offset voltage is specified as well.

The "elements" object is used to specify elements that are connected to output and input ports of the controller 210. Such elements may include quantum elements (e.g., qubits, readout resonators, flux lines, etc.), external devices (e.g., test equipment such as oscilloscopes, spectrum analyzers, signal generators, etc.), and/or any other element connected to the output and/or input ports of the controller. The example shown in FIG. 10A specifies a qubit named "qubit" and a readout resonator named "RR". The "qubit" element comprises "mixinputs", "operations", and "frequency" objects. The "mixinputs" object comprises "I", "Q", "lo_frequency", and "mixer" objects. The "I" and "Q" objects specify the corresponding output ports of "con1" to which the inputs of the element are connected. The "intermediate_frequency" object specifies the intermediate frequency with which pulses sent to the qubit are to be modulated (e.g., determined from a qubit calibration routine). The "mixer" object refers to mixer object "mixer_quibit," which is defined later in the quantum machine specification. The "operations" object specifies a "gauss-pulse" which refers to the "gauss_pulse_in" object is defined later in the quantum machine specification. The "RR" element comprises "mixinputs", "operations", "outputs", "frequency", "time_of_flight", and "smearing" objects. The "mixinputs" object comprises "I", "Q", "lo_frequency", and "mixer" objects. The "I" and "Q" objects specify the corresponding ports of "con1". The "frequency" object specifies the frequency of the readout_resonator (e.g., determined from a qubit calibration routine). The "mixer" object refers to mixer object "mixer_res," which is defined later in the quantum machine specification. The "operations" object specifies a "meas_pulse" which refers to the "meas_pulse_in" object is defined later in the quantum machine specification. The "time_of_flight" and "smearing" objects specify those values for the readout resonator. The "outputs" object specifies an output on the element "out1" and the corresponding input port of "con1" to which it is connected.

The "Pulses" object is used to specify pulses available for transmission by the quantum machine. The example shown specifies two pulses: "means_pulse_in" and "gauss_pulse_in." The "means_pulse_in" object in turn comprises "operation", "length", "waveforms", "integration_weights", and "digital_marker" objects. The "operation" object specifies it as a "measurement" pulse. The "I" and "Q" objects of the "waveforms" object refer to the "exc_wf" and "zero_wf" objects which are defined later in the quantum machine specification. The "integration_weights" object refers to the integration weights objects "integW1" and "integW2" which are defined later in the specification. The "digital_marker" object refers to the "marker1" object defined later in the specification.

The "gauss_pulse_in" object comprises "operation", "length", and "waveforms" objects. The "operation" object specifies it is a "control" pulse. The "I" and "Q" objects of the "waveforms" object refer to the "gauss_wf" and "zero_wf" objects which are defined later in the quantum machine specification.

The "waveforms" object defines the "zero_wf", "gauss_wf", and "exc_wf" objects ("exc_wf" not shown) using "type" and "samples" objects.

The "digital_waveforms" defines the "marker1" object using a "samples" object.

The "integration_weights" object defines the objects "integW1" and "integW2" using "cosine" and "sine" objects.

The "mixers" object defines the "mixer_res" and "mixer_qubit" objects using "freq", "lo_freq", and "correction" objects.

Figure 11:
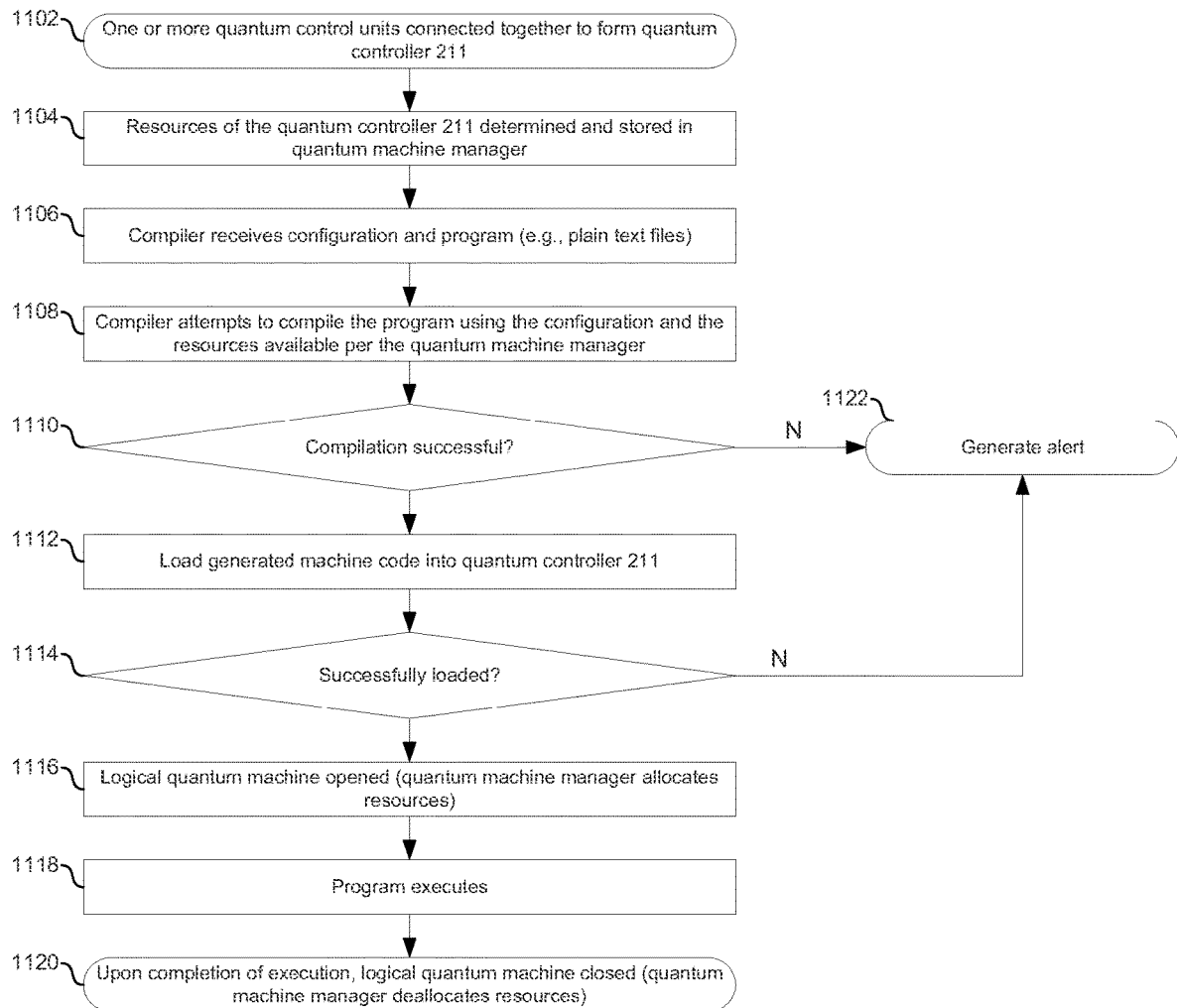
FIG. 11 is a flow chart showing an example operation of the QOP.

FIG. 11 is a flaw chart showing an example process for operation of the quantum orchestration platform. The process begins in block 1102 in which one or more quantum control modules are connected together to form quantum controller 210 and the quantum controller 210 is connected to a quantum system. In this regard, the quantum controller 210 is modular and extendable enabling use of as many units as desired/necessary for the quantum algorithm to be performed. Each of the modules may, for example, comprise one or more of each of the circuits shown in FIG. 3B.

In block 1103, a quantum machine with a certain specification is instantiated by a user. This may be done via a Quantum Machines Manager API. In an example of such an API, shown in Table 5, this may include a call to the open_qm( ) function or the open_qm_from_file( ) function.

TABLE 5

Quantum Machines Manager API

Class QuantumMachinesManager (host=None, port=None, **kargs)
  close_all_quantum_machines( )
    Closes ALL open quantum machines
  get_controllers( )
    Returns a list of all the quantum control modules that are available
  get_qm(machine_id)
    Gets an open quantum machine object with the given machine id
    Parameters
      machine_id - The id of the open quantum machine to get
    Returns
      A quantum machine obj that can be used to execute programs
  list_open_quantum_machines( )

TABLE 5-continued

Quantum Machines Manager API

Return a list of open quantum machines. (Returns only the ids, use get_qm(...) to get the machine object)
    Returns
      The ids list
  open_qm(config, close_other_machines=True) → qm.QuantumMachine.QuantumMachine
    Opens a new quantum machine
    Parameters
      • config - The config that will be used by the name machine
      • close_other_machines - Flag whether to close all other running machines
    Returns
      A quantum machine obj that can be used to execute programs
  open_qm_from_file(filename, close_other_machines=True)
    Opens a new quantum machine with config taken from a file on the local file system
    Parameters
      • filename - The path to the file that contains the config
      • close_other_machines - Flag whether to close all other running machines
    Returns
      A quantum machine obj that can be used to execute programs
  perform_healthcheck(strict=True)
    Perform a health check against the QM programming subsystem.
    Parameters
      strict - Will raise an exception if health check failed
  version( )
    Returns
      The QM programming subsystem version In block 1104, the quantum machines manager 908 attempts to allocate machine resources (i.e., resources allocated to a particular quantum machine regardless of whether a pulse program is currently executing on that quantum machine) of the quantum controller 210 to the new quantum machine according to the specification.

In block 1105, the quantum machines manager 908 determines whether the allocation and instantiation is successful. If not, then in block 1122 an alert is generated for the user (e.g., to inform the user that there are currently insufficient resources available to instantiate the required quantum machine), If allocation is successful, then in block 1106 the allocated resources are stored in quantum machines manager 908, which updates its data structure of available resources to reflect the allocation of resources to the quantum machine, the new quantum machine is instantiated, and the process advances to block 1107.

In block 1107, a user requests to execute a QUA program on the quantum machine. This may be done via a Quantum Machine API. In an example of such an API, shown in Table 6, this may include a call to the execute( ) function. Prior to the request to execute the QUA program, and/or during the execution of the QUA program, the user can use a Quantum Machine API, such as the one shown below in table 6, to alter any parameter that was set in the specification 902. This is advantageous where, for example, something (e.g., temperature, voltage, equipment in use, and/or any other factor that may impact a quantum experiment), has changed since the time the specification 902 was generated.

TABLE 6

Quantum Machine API

Class QuantumMachine (machine_id, pb_config, config, manager)
  close( )
  Closes the quantum machine.
    Returns
      True if the close request succeeded, Raises an exception otherwise.
  execute(program, duration_limit=1000, data_limit=20000, force_execution=

TABLE 6-continued

Quantum Machine API

False, dry_run=False, **kwargs) → qm.QmJob.QmJob
    Executes a program and returns a job object to keep track of execution and get results.
    Parameters
    • program - A program( ) object generated in QUA to execute
    • duration_limit (int) - Maximal time (in msec) for which results will be collected.
    • data_limit (int) -
      Maximal amount of data sends for which results will be collected.
      Here data sends is either:
        1. 4 ADC samples, in case raw data is transferred
        2. a single save operation
    • force_execution (bool) - Execute program even if warnings occur (verify this)
    • dry_run (bool) - compile program but do not run it (verify this)
    No new results will be available to the returned job object When duration_limit
    is reached, or when data_limit is reached, whichever occurs sooner.
    Returns
    A QmJob object that can be used to keep track of the execution and get results
get_config( )
    Gives the current config of the qm
    Returns
    A dictionary with the qm's config
get_dc_offset_by_qe(qe, input)
    get the current DC offset of the quantum control module analog output channel
    associated with a quantum element.  remove  note: not currently implemented.
    Parameters
    • qe - the name of the element to get the correction for
    • input - the input name as appears in the element's config be more specific here
      Returns
    the offset, in normalized output units
get_digital_buffer(qe, digital_input)
    get the buffer for digital waveforms of the quantum element
    Parameters
    • qe (str) - the name of the element to get the buffer for
    • digital_input (str) - the digital input name as appears in the element's config
      Returns
    the buffer
get_digital_delay(qe, digital_input)
    Parameters
    • qe - the name of the element to get the delay for
    • digital_input - the digital input name as appears in the element's config
      Returns
    the delay
    get_io1_value( )
    Gives the data stored in IO1, which is a reserved variable that refers to
    a first IO register in the I/O manager 368.
    No inference is made on type.
    Returns
    A dictionary with data stored in IO1 . (Data is in all three format: int, float, bool)
get_io2_value( )
    Gives the data stored in IO2, which is a reserved variable that refers to
    a first IO register in the I/O manager 368
    No inference is made on type.
    Returns
    A dictionary with data from the second IO register. (Data is in
    all three format: int, float, and bool)
get_io_values( )
    Gives the data stored in both IO1 and IO2
    No inference is made on type.
    Returns
    A list that contains dictionaries with data from the IO registers.
    (Data is in all three format: int, float, and bool)
get_smearing(qe)
    get the smearing associated with a measurement quantum element.
    This is a broadening of the raw results acquisition window, to account
    for dispersive broadening in the measurement elements (readout resonators
    etc.) The acquisition window will be broadened by this amount on both sides.
    Parameters
    qe (str) - the name of the element to get smearing for
    Returns
    the smearing, in nsec.
get_time_of_flight(qe)
    get the time of flight, associated with a measurement quantum element.
    This is the amount of time between the beginning of a measurement
    pulse applied to quantum element and the time that the data is
    available to the controller for demodulation or streaming.
    Parameters
    qe (str) - the name of the element to get time of flight for
    Returns
    the time of flight, in nsec TABLE 6-continued Quantum Machine API list_controllers( )
    Gives a list with the defined controllers in this qm
    Returns
    The names of the controllers configured in this qm
save_config_to_file(filename)
    Saves the qm current config to a file
    Parameters
    filename: The name of the file where the config will be saved
set_correction(qe, values)
Sets the correction matrix for correcting gain and phase
imbalances of an IQ mixer associated with a quantum element.
Parameters
• qe (str) - the name of the element to update the correction for
• values (tuple) - 4 value tuple which represents the correction matrix
set_dc_offset_by_qe(qe, input, offset)
    set the current DC offset of the quantum control module analog
    output channel associated with a quantum element.
    Parameters
    • qe (str) - the name of the element to update the correction for
    • input (str) - the input name as appears in the element config. Options:
        'single'
            for an element with single input
        'I' or 'Q'
            for an element with mixer inputs
    • offset (float) - the dc value to set to, in normalized output units.
      Ranges from $-0.5$ to $0.5 - 2^{-16}$ in steps of $2^{-16}$.
set_digital_buffer(qe, digital_input, buffer)
    set the buffer for digital waveforms of the quantum element
    Parameters
    • qe (str) - the name of the element to update buffer for
    • digital_input (str) - the digital input name as appears in the element's config
    • buffer (int) - the buffer value to set to, in nsec. Range: 0 to (255 − delay) / 2, in
      steps of 1
set_digital_delay(qe, digital_input, delay)
    Sets the delay of the digital waveform of the quantum element
    Parameters
    • qe (str) - the name of the element to update delay for
    • digital_input (str) - the digital input name as appears in the element's config
    • delay (int) - the delay value to set to, in nsec. Range: 0 to 255 − 2 * buffer, in
      steps of 1
set_frequency(qe, freq)
    Sets the frequency of an element, at the output of the mixer,
    taking LO frequency into account.
    Parameters
    • qe (str) - the name of the element to update the correction for
    • freq (float) - the frequency to set to the given element
set_intermediate_frequency(qe, freq)
    Sets the intermediate frequency of the quantum element:
    Parameters
    • qe (str) - the name of the element to update the intermediate frequency for
    • freq (float) - the intermediate frequency to set to the given element
set_io1_value(value_1)
    Sets the value od IO1.
    This can be used later inside a QUA program as a QUA variable IO1 without declaration.
    The type of QUA variable is inferred from the python type passed to value_1, according
    to the following rule:
    int −> int float −> fixed bool −> bool
    Parameters
    value_1 (float | bool | int) - the value to be placed in IO1
set_io2_value(value_2)
    Sets the value of IO1
    This can be used later inside a QUA program as a QUA variable IO2 without declaration.
    The type of QUA variable is inferred from the python type passed to value_2, according
    to the following rule:
    int −> int float −> fixed bool −> bool
    Parameters
    value_1 (float | bool | int) - the value to be placed in IO1
set_io_values(value_1, value_2)
    Sets the value of IO1 and IO2
    This can be used later inside a QUA program as a QUA variable IO1, IO2 without
    declaration. The type of QUA variable is inferred from the python type passed to
    value_1, value_2 according to the following rule:
    int −> int float −> fixed bool −> bool
    Parameters
    • value_1 (float | bool | int) - the value to be placed in IO1
    • value_2 (float | bool | int) - the value to be placed in IO2
set_smearing(qe, smearing)
    set the smearing associated with a measurement quantum element.

TABLE 6-continued

Quantum Machine API

This is a broadening of the raw results acquisition window, to account for dispersive
broadening in the measurement elements (readout resonators etc.) The acquisition
window will be broadened by this amount on both sides.
Parameters
• qe (str) - the name of the element to set smearing for
• smearing (int) - the time, in nsec, to broaden the acquisition window. Range: 0 to
(255 − time of flight)/2, in steps of 1.
set_time_of_flight(qe, time_of_flight)
set the time of flight, associated with a measurement quantum element.
This is the amount of time between the beginning of a measurement pulse applied to
quantum element and the time that the data is available to the controller for
demodulation or streaming.
This time also accounts for processing delays, which are typically 176nsec.
Parameters
• qe (str) - the name of the element to set time of flight for
• time_of_flight (int) - the time of flight to set, in nsec. Range: 0 to 255 − 2 *
smearing, in steps of 4.

In block 1108, compiler 906 receives the quantum machine specification and the QUA program (e.g., in the form of two plain text files).

In block 1109, compiler 906 attempts to compile the program using the quantum machine specification and the resources of the quantum controller 210 that the quantum machines manager 908 indicates are available for program execution. During compilation, the compiler determines and allocates the program resources of the quantum controller 210 that will be used in the program.

In block 1110, the compiler 906 determines whether compilation is successful. If not, then in block 1122 an alert is generated for the user (e.g., to inform the user that there are currently insufficient resources available to execute the program). If compilation is successful, then the process advances to block 1112. If compilation is successful the compiler outputs the machine code to be loaded to the quantum controller for program execution.

In block 1112, the programming system 202 loads machine code generated by the compiler 906 based on the program, the quantum machine specification, and the available resources into quantum controller 210 (e.g., via I/O Manager 368).

In block 1114, the programming subsystem 202 determines whether the machine code has been successfully loaded into the quantum controller 210. If not, then in block 1122 an alert is generated for the user. If the machine code is successfully loaded, then the process advances to block 1116.

In block 1116, the program is executed on the quantum controller and the quantum machines manager 908 updates its data structure of available resources to reflect the allocation of resources to the program.

Either while the program is executing and/or after the program execution is over, the user may change the configuration/specification of the quantum machine. This may be done via a Quantum Machine API, an example implementation of which is shown in Table 6. An example of changing the configuration/specification of the quantum machine may be that the user uses the call to the set_frequency(qe, freq) function, which changes the frequency of the specified element to the specified frequency. Another example is using the quantum machine API to set the value of an IO register in the I/O Manager 368. For example, the following shows waiting for a QUA program to reach a pause instruction, then IO1 is set to a new value via the quantum machine API, and then the QUA program resumes.

```
job = qm.execute(program)
while job.isPaused( ) != True
    wait(0.1)
qm.set_IO1([new value])
job.resume( )
```

In another example implementation such quantum machines API may include commands for changing any parameter defined in the specification (e.g. an API command may allow to change the definition of the samples of a specified waveform, change the parameters of a neural network associated with an element or a pulse, etc.) If the specification is changed while a program is running on the quantum machine, this may include writing to registers and/or memory of the quantum controller 210 while the program is executing as well as changing the specification in the quantum machines manager. If the specification is changed while no program is running of the quantum machine, this may include only changing the specification in the quantum machines manager. The ability to alter characteristics of the quantum machine without closing the quantum machine and even during execution of a QUA program on the quantum machine enables, for example, altering the quantum machine based on calculations performed on the quantum programming subsystem 202. As an example, during execution of a QUA program, results may be streamed from the quantum controller 210 to the quantum programming subsystem 202, the quantum programming subsystem 202 may perform some calculations using the results (e.g., resource-intensive calculations not possible or desirable to perform on the quantum controller 210) and then update the quantum machine based on the calculations. The update may impact the currently running QUA program or a successive run of the same QUA program or a different QUA program without having to close the quantum machine for reconfiguration (which may be desirable to, for example, avoid having to repeat a calibration).

In block 1118, upon completing execution of the instructions, the program ends and the quantum machines manager 908 updates its data structure to deallocate the program resources that were allocated to that program and updates the available resources.

In block 1120, the process can advance either back to block 1107 again in which a user a user requests to execute a QUA program on the quantum machine, or to block 1124 in which a user closes the quantum machine. If the user closes the quantum machine the process advances to block 1126.

In block 1126 the quantum machines manager 908 deallocate the machine resources that were allocated to that quantum machine and updates the available resources.

In an example implementation, the pulse generation program 904 is written using the QUA programming language.

To aid understanding of the QOP's unique approach to quantum control, a use case example of Power Rabi Calibration will now be described, end-to-end. The use case begins by discussing the theoretical background of the experiment and its goals and showing a typical setup on which it is implemented. It is then shown, step by step, how to program the QOP to perform this experiment, how to execute it, and how to retrieve the results.

The purpose of Power Rabi Calibration is to measure Rabi oscillations—oscillations of the qubit state that are driven by a control signal. Assume that the qubit is initially in the ground state (state 0), a drive pulse is applied to rotate the qubit on the Bloch sphere around a rotation axis in the x-y plane. The qubit is then measured by calculating the effect of the resonator (that is coupled to the qubit) on a measurement pulse. The rotation angle, and consequently the probability to find the qubit in the excited state (1), depends on the amplitude of the drive pulse. The protocol is repeated with varying amplitudes (a). For each amplitude, the protocol is repeated many times for averaging, which allows extracting the probability of the qubit to be in the excited state after the drive pulse is applied. This probability is then plotted as a function of the drive amplitude, from which the rotation angle, as a function of the amplitude, can be extracted. This experiment provides an important tool for calibrating quantum gates. For example, the amplitude at which the qubit reaches a rotation of 180 degrees gives us the required amplitude for performing an X-gate (the quantum NOT gate). Similarly, this program can be run to identify the amplitude required to perform a $\pi/2$-rotation.

Figure 12A:
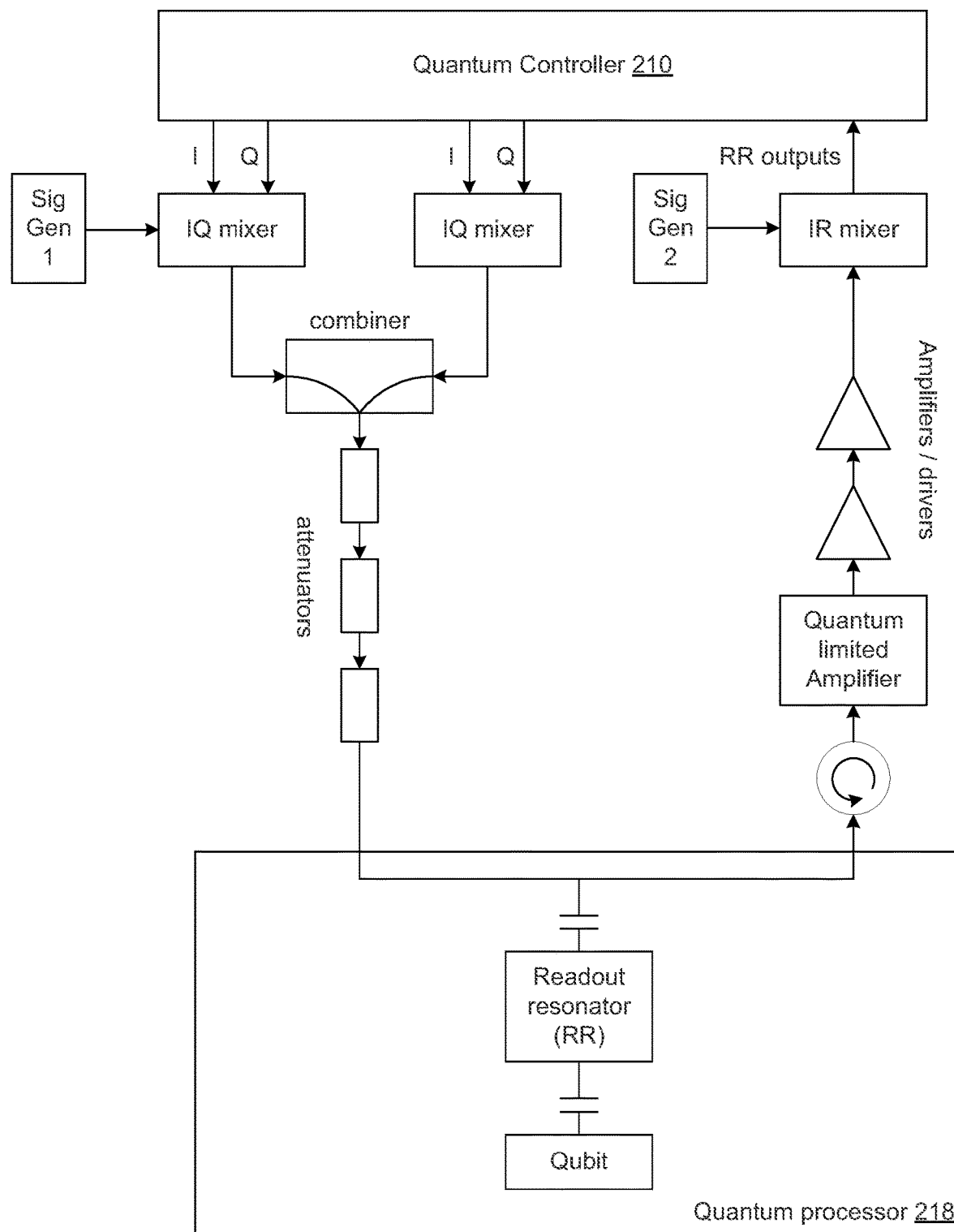
FIG. 12A shows a portion of a quantum machine configured to perform a Power Rabi calibration.

The example experiment setup is shown in FIG. 12A. The quantum device is a superconducting circuit composed of a single, fixed frequency qubit and a readout resonator, with the following Hamiltonian:

$$H = \frac{\hbar}{2}\omega_Q \sigma_Z + \hbar\omega_R a^\dagger a + \hbar g(a^\dagger \sigma^- + a\sigma^+).$$

Since the interaction between the qubit and resonator is dispersive ($|\omega_R - \omega_Q|$), an approximation can be made that leads to the following form of the Hamiltonian:

$$H = \frac{\hbar}{2}\left(\omega_Q + \frac{g^2}{\Delta}\right)\sigma_Z + \hbar\left(\omega_R + \frac{g^2}{\Delta}\sigma_Z\right)a^\dagger a$$

Where $\Delta = \omega_Q - \omega_R$. Finally, the qubit driving term can be explicitly included, which leads to the Hamiltonian:

$$H = H_0 + \hbar s(t)\sigma_x + \frac{m(t)}{2}[a^\dagger e^{-i\omega t} + a e^{i\omega t}]$$

Here it is assumed that the frequencies of both the qubit and the resonator were calibrated in advance.

A signal, at the resonance frequency of the qubit, of the form $$s(t) = A\cos(\omega_Q t + \varphi)$$

rotates the Bloch vector of the qubit at a rate A around the axis which is on the x-y plane and is rotated by an angle $\varphi$ from the x-axis.

If the parameters A(t) and $\varphi$(t) are varied slowly compared to $\omega_Q$, then this still holds at each point in time. Thus, if a pulse is sent (i.e. a signal that is finite in time) to the qubit of the form $$s(t) = A(t)\cos(\omega_Q t + \varphi)$$

where A(t) varies slowly compared to $\omega_Q$, the Bloch vector will be rotated around the above axis by a total angle which is given by the integral of A(t):

$$\theta = \int_{t_0}^{t_0 + \tau} A(t) dt.$$

Here $t_0$ is the time at which the pulse starts and $\tau$ is the duration of the pulse.

In a typical Power Rabi Oscillations experiment, the shape and duration of the pulse A(t) are fixed (e.g. a 20-nanosecond gaussian pulse) and only its amplitude is varied in order to get different rotation angles $\theta$. The experiment performed by repeating the following basic sequence:

(1) Initialize the qubit to the ground state, 0.

(2) Apply a pulse with amplitude a (e.g. A(t) is a Gaussian shaped pulse with peak amplitude a, which rotates the qubit by $\theta$ so that the qubit is in the state $$\cos(\theta_a)|0\rangle + e^{i\varphi}\sin(\theta_a)|1\rangle.$$

(3) Apply a resonant pulse to the readout resonator, and from the phase of the reflected pulse, deduce the state of the qubit.

Figure 12B:
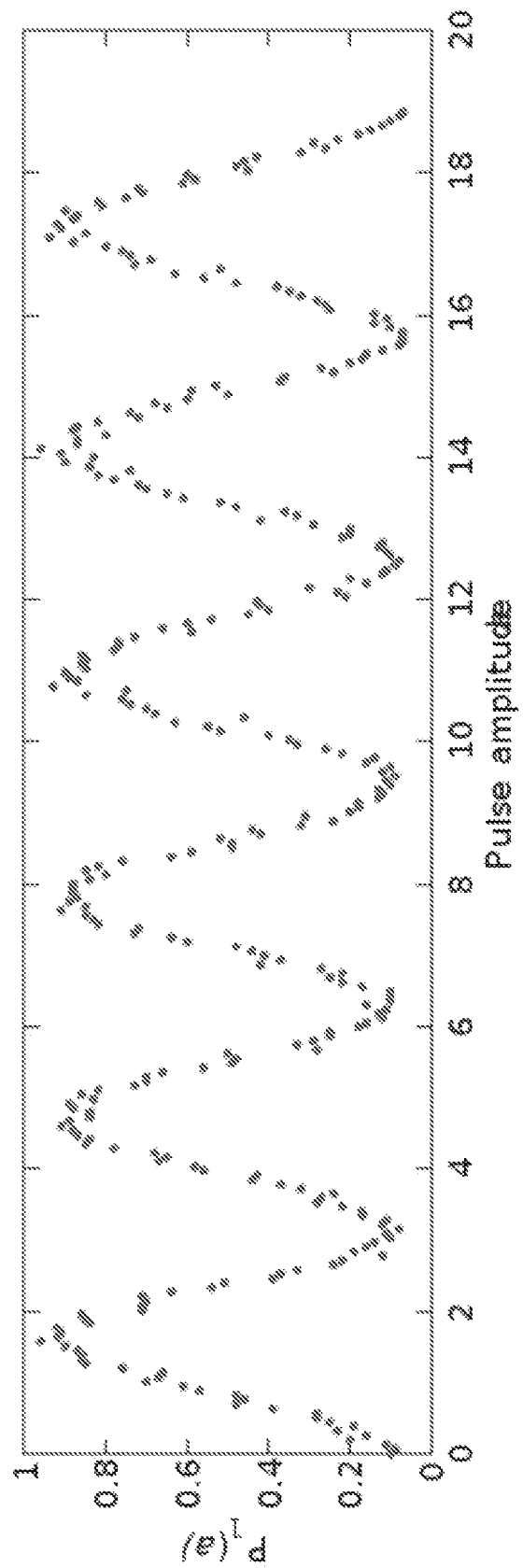
FIG. 12B shows the result of a Power Rabi calibration.

This basic sequence is repeated in the program for a series of amplitudes (i.e., many values of a), where for each amplitude, a, it is repeated N times (i.e. N identical basic sequences with the same a). N identical measurements are required because of state collapse. The measurement at the end of each basic sequence gives a binary result (0 or 1) for the state of the qubit, even if before the measurement the qubit was in a superposition state. However, when the results of the N identical basic sequences are averaged, the average will be $\sim\sin^2(\theta)$. Denote this average as $P_{|1\rangle}(a)$ since it reflects the probability of measuring the qubit in the $|1\rangle$ state for a given amplitude, a. The results of the whole experiment can be summarized by plotting $P_{|1\rangle}(a)$ as a function of a (see FIG. 12B).

This can be used to calibrate any single qubit rotation gate that rotates the qubit by an angle $\theta$, around a rotation axis that is on the x-y plane and is rotated $\varphi$ from the x-axis. Such a gate is denoted by $R_{\varphi(\theta)}$. In fact, one of the typical goals of the Power Rabi Oscillations experiment is to calibrate the amplitude of a given pulse so that it performs $\pi$-rotation (X-gate) or $\pi/2$-rotation. $\varphi$, however, cannot be determined from the Rabi oscillations and must be determined by other means (e.g. tomography).

An example implementation of the Power Rabi experiment in the QOP will now be described.

The experiment is implemented on the QOP as follows: (1) Defining a quantum machine specification; (2) Opening an interface to the quantum machine; (3) Writing the program; (4) Running the program; (5) Saving the results As discussed above, the quantum machine specification is a description of the physical elements present in the experimental setup and their properties, as well as the connectivity between the elements and the quantum control module(s). The physical elements that are connected to the quantum control module(s) are denoted in the quantum machine specification as elements, which are discrete entities such as qubits, readout resonators, flux lines, gate electrodes, etc.

Each of these has inputs and in some cases outputs, connected to the quantum control module(s). The properties of the elements and their connectivity to the quantum control module(s) are used by the QOP to interpret and execute QUA programs correctly (e.g. a pulse played to a certain qubit is modulated by the quantum control module with the intermediate frequency defined for this element). The quantum machine specification in FIGS. 10A-10C is used for this particular example.

The pulses applied to the elements are also specified in the quantum machine specification, where each pulse is defined as a collection of temporal waveforms. For example, a pulse to an element with two analog inputs and one digital input will specify the two waveforms applied to the analog inputs of the element and the digital pulse applied to its digital input.

Also defined in the quantum machine specification are the properties of any auxiliary components that affect the actual output of the controller, such as IQ mixers and local oscillators.

After defining the quantum machine specification, an interface to a new quantum machine can be opened with the following command:
  my_qm=qmManager.open_qm(my_config)

After having defined the quantum machine specification, write the QUA program. Below is the power Rabi program.
  with program( ) as powerRabiProg:

```
I = declare(fixed)
Q = declare(fixed)
a = declare(fixed)
Nrep = declare(int)
with for_(Nrep, 0, Nrep < 100, Nrep + 1):
    with for_(a, 0.00, a <= 1.0, a + 0.01):
        play('gauss_pulse'*amp(a), 'qubit')
        align("qubit", "RR")
        measure('meas_pulse', 'RR', 'samples',
            ('integW1',I), ('integW2',Q))
        save(I, 'I')
        save(Q, 'Q')
        save(a, 'a')
```

The program is very intuitive to someone who knows the theory of the Power Rabi calibration, which illustrates one of the benefits of the QOP: the ability for people (e.g., quantum physicists) to rapidly design and run quantum experiments without first having to become expert programmers or computer systems designers. This is in stark contrast to current systems which, for example, require quantum physicists to learn a hardware description language such as VHDL or Verilog to be able to run their quantum experiments/algorithms.

This program: (1) Defines the variables a (amplitude) and Nrep (number of repetitions), as well as the variables I and Q, which store the demodulation result; and (2) Performs 100 repetitions (the loop over Nrep), where in each scan loops over 100 values of a, from 0-1 in increments of 0.01 and for each value of a performs the Rabi sequence: playing a pulse with amplitude a to the qubit, then measuring the resonator response and extracting from it the state of the qubit. This is done by sending a measurement pulse to the resonator and demodulating and integrating the returning pulse using the indicated integration weights.

The raw data sampled at the quantum control module's input is also streamed and saved with the label 'samples.' Finally, the demodulation and integration results, I and Q, are saved as well as the corresponding amplitude.

This Python code block creates an object named powerRabiProg, which is a QUA program that can be executed on an open quantum machine.

The program is run on a quantum machine "my_qm" defined in the quantum machine specification using the following command which saves the results in the job object "my_job."
  myjob=my_qm.execute(powerRabiProg)

After the program is executed, the results can be pulled:
  my_powerRabi_results=job.get_results( )

This command pulls the results from "my_job" to the results object "my_powerRabi_results".

The data in "my_powerRabi_results" is a Python object which contains the variables saved during the program, as well as all the raw data sampled at the input of the quantum control module. Here, "my_powerRabi_results" will have: (1) my_powerRabi_results.variable_results, which will be a dictionary containing three keys: 'I', 'Q' and 'a'. The value for each key will be a dictionary containing the saved data and the time stamp for each saved data point; (2) my_powerRabi_results.raw_results, which will be a dictionary containing a single key and its value will be a dictionary containing the sampled input data and the timestamp of each data point.

In accordance with an example implementation of this disclosure, a system comprises a pulse program compiler circuit (e.g., 906) comprising circuitry operable to analyze a pulse program (e.g., 904) that comprises a pulse operation statement that (e.g., a play or measure statement of table 1) that specifies a first pulse to be generated, and specifies a target of the first pulse (e.g., a qubit, antenna, and/or any other device or circuit to or at which pulses are transmitted). The compiler is operable to generate, based on the pulse program, machine code that, if loaded into a pulse generation and measurement circuit (e.g., 260), configures the pulse generation and measurement circuit to generate the first pulse and send the first pulse to the target. The pulse program may comprises a first declaration statement that defines a first variable, and the pulse operation statement may reference the first variable. The first variable may be part of an expression that determines one or more characteristics (e.g., phase, frequency, amplitude, duration, time of generation, and/or the like) of the first pulse. Loading the machine code into the pulse generation and measurement circuit may configure the pulse generation and measurement circuit to determine (e.g., in a CSP 410) a value to be assigned to the first variable during runtime of the machine code. The pulse operation statement may specify parameters to be used for processing of a return signal resulting from transmission of the first pulse (e.g., a return from a readout resonator that was the target of the first pulse or a reflection of the first pulse off of a physical object), and loading the machine code into the pulse generation and measurement circuit may configure the pulse generation and measurement circuit to perform the processing of the return signal. The processing of the return signal may comprise integration of the return signal, and the parameters may specify integration weights to use for the integration. The integration weights may be specified as one or more vectors. The parameters may comprise parameters of a neural network to be used for the processing of the return signal. The processing of the return signal may comprises integration of the return signal, and the parameters may specify time parameters to use for the integration (e.g., duration of a window over which to perform the integration, a length of an offset of window, and/or the like). The processing of the return signal may comprise demodulation of the return signal. The parameters may specify the frequency of a local oscillator to use for the demodulation. The return signal may comprise a series of pulses and the processing of the return signal may comprise counting the number of pulses in a given time window. The return signal may comprises a series of pulses and the processing of the return signal may comprise identifying the arrival time of each pulse relative to the beginning of a specified time window. The pulse operation statement may specify that a result of processing of a return signal resulting from transmission of the first pulse is to be associated with the first variable and stored to memory (e.g., in 260 and/or 252), and loading the machine code into the pulse generation and measurement circuit may configure the pulse generation and measurement circuit to associate the result with the first variable and store the result to memory. The pulse operation statement may specify an expression to be used for processing of the first pulse by the pulse generation and measurement circuit (e.g., in a pulser 302 and/or pulse operations circuit 358) before the pulse generation and measurement circuit sends the first pulse to the target. Loading the machine code into the pulse generation and measurement circuit may configure the pulse generation and measurement circuit to perform the processing of the first pulse before sending the first pulse to the target. The pulse program may comprise a first declaration statement that defines a first variable. The pulse operation statement may references the first variable. The expression may reference the first variable. Loading the machine code into the pulse generation and measurement circuit may configure the pulse generation and measurement circuit to determine the value of the first variable during runtime of the machine code. The pulse operation statement may specify a condition expression that is to be evaluated during runtime by the pulse generation and measurement circuit, and that must evaluate to a determined value before the first pulse is sent to the target. Loading the machine code into the pulse generation and measurement circuit may configure the pulse generation and measurement circuit to evaluate the condition expression during runtime of the machine code, and send the first pulse to the target only when the condition expression evaluates to the determined value. The pulse program comprises a phase alteration statement that specifies the target and an expression for the angle by which to alter a phase of a local oscillator of the pulse generation and measurement circuit that is associated with the target. Loading the machine code into the pulse generation and measurement circuit may configure the pulse generation and measurement circuit to evaluate the expression during runtime of the machine code, and alter the phase of the local oscillator generation circuit based on a result of the evaluation of the expression. The pulse program may comprises a update frequency statement that specifies the target and an expression for the frequency to which to set a local oscillator of the pulse generation and measurement circuit that is associated with the target. Loading the machine code into the pulse generation and measurement circuit may configure the pulse generation and measurement circuit to: evaluate the expression during runtime of the machine code; and set the frequency of the local oscillator generation circuit based on a result of the evaluation of the expression. The pulse program may comprises a flow control statement (e.g., a trigger wait, a wait or wait_for_trigger statement). The trigger wait statement is able to stop the program execution until a trigger is received. Such a trigger may be generated by software or hardware. Loading the machine code comprising the flow control statement into the pulse generation and measurement circuit may configure the pulse generation and measurement circuit to wait for a signal before resuming execution of the pulse program. The pulse program comprises a conditional statement (e.g., if statement, loop statement, etc.) that specifies a condition expression and one or more conditioned statements. Loading the machine code into the pulse generation and measurement circuit may configure the pulse generation and measurement circuit to: evaluate the condition expression; and execute instructions corresponding to the one or more condition statements only if the condition expression evaluates to a determined value (e.g., true or false). The compiler may be operable to parse a machine specification (e.g., 902) that comprises a definition of the first pulse and a definition of the target; and generate the machine code based on the parsed machine specification. The pulse operation statement may specifies a break condition. Loading the machine code into the pulse generation and measurement circuit may configure the pulse generation and measurement circuit to: evaluate the break condition expression; and stop generation of the first pulse when the break condition evaluates to a determined value. The pulse program may comprise an align statement that specifies a plurality of pulse targets. Loading the machine code into the pulse generation and measurement circuit may configure the pulse generation and measurement circuit to wait for execution of instructions involving any of the plurality of pulse targets to complete before beginning execution of subsequent instructions involving any of the plurality of pulse targets. The pulse program may comprises a wait statement that specifies a target and an amount of time to wait before sending a pulse to the target. Loading the machine code into the pulse generation and measurement circuit may configures the pulse generation and measurement circuit to wait the specified amount of time. The pulse program may comprise a variable assignment statement that assigns an expression to a variable (e.g., IO1) that is associated with a register that can be read from and/or written to by a programming subsystem during runtime of the machine code, and the pulse operation statement may references the variable (e.g., as a parameter and/or in an expression). The pulse program may comprise a variable declaration statement that assigns a first variable to a second variable, where the second variable (e.g., IO1) is a reserved variable reference to a register that can be read from and/or written to by a programming subsystem during runtime of the machine code, and the pulse operation statement may references the second variable.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A method comprising:
receiving, by a pulse program compiler, a pulse program comprising a pulse operation statement that specifies a first pulse to be generated, a characteristic of the first pulse, and a target of the first pulse;
generating, by the pulse program compiler, machine code according to the pulse program;
loading the machine code into a pulse generation and measurement circuit; and
configuring the pulse generation and measurement circuit, according to the machine code, to generate the first pulse and send the first pulse to the target.

2. The method of claim 1, wherein:
the pulse program comprises a first declaration statement that defines a first variable; and
the pulse operation statement references the first variable.

3. The method of claim 2, wherein the first variable is part of an expression that determines the characteristic of the first pulse.

4. The method of claim 1, wherein the characteristic is an amplitude of the first pulse.

5. The method of claim 1, wherein the characteristic is a duration of the first pulse.

6. The method of claim 3, wherein:
configuring the pulse generation and measurement circuit comprises determining a value to be assigned to the first variable during runtime of the machine code.

7. The method of claim 1, wherein:
the pulse operation statement does not specify an intermediate frequency of the first pulse; and
generating the machine code comprises setting the intermediate frequency of the first pulse according to the target.

8. The method of claim 1, wherein:
the pulse operation statement specifies parameters to be used for processing a return signal resulting from transmission of the first pulse; and
the method comprises configuring the pulse generation and measurement circuit to process of the return signal.

9. The method of claim 8, wherein:
processing the return signal comprises an integration of the return signal; and
the parameters specify integration weights to use for the integration.

10. The method of claim 9, wherein the integration weights are specified as one or more vectors.

11. The method of claim 8, wherein the parameters comprise parameters of a neural network to be used for processing the return signal.

12. The method of claim 8, wherein:
processing the return signal comprises an integration of the return signal; and
the parameters specify time parameters to use for the integration.

13. The method of claim 8, wherein:
processing the return signal comprises a demodulation of the return signal; and
the parameters specify a frequency to use for the demodulation.

14. The method of claim 8, wherein:
the return signal comprises a series of pulses; and
processing the return signal comprises counting a number of pulses in a given time window.

15. The method of claim 8, wherein:
the return signal comprises a series of pulses; and
processing the return signal comprises identifying an arrival time of each pulse relative to a beginning of a specified time window.

16. The method of claim 1, wherein:
the pulse program comprises a first declaration statement that defines a first variable;
the pulse operation statement references the first variable;
the pulse operation statement specifies that a result of processing a return signal resulting from transmission of the first pulse is to be associated with the first variable and stored to memory; and
the method comprises associating the result with the first variable and storing the result to memory.

17. The method of claim 1, wherein:
the pulse operation statement specifies an expression to be used for processing the first pulse by the pulse generation and measurement circuit before the pulse generation and measurement circuit sends the first pulse to the target; and the method comprises processing the first pulse before sending the first pulse to the target.

18. The method of claim 17, wherein:

the pulse program comprises a first declaration statement that defines a first variable;

the expression references the first variable; and the method comprises determining a value of the first variable during runtime of the machine code.

19. The method of claim 18, wherein the method comprises:

processing a return signal; and determining a value of the first variable according to the processing of the return signal.

20. The method of claim 19, wherein the value of the first variable is a fixed point or floating point number.

21. The method of claim 1, wherein:

the pulse operation statement specifies a condition expression that:

is to be evaluated during runtime by the pulse generation and measurement circuit, and must be evaluated to a determined value before the first pulse is sent to the target; and the method comprises:

evaluating the condition expression during runtime of the machine code, and sending the first pulse to the target only when the condition expression evaluates to the determined value.

22. The method of claim 1, wherein:

the pulse program comprises a phase alteration statement that specifies the target and an expression for an angle for altering a phase of a local oscillator associated with the target; and the method comprises:

evaluating the expression during runtime of the machine code, and altering the phase of the local oscillator according to a result of the evaluation of the expression.

23. The method of claim 1, wherein:

the pulse program comprises an update frequency statement that specifies the target and an expression for the frequency of a local oscillator associated with the target; and the method comprises:

evaluating the expression during runtime of the machine code, and setting the frequency of the local oscillator according to a result of the evaluation of the expression.

24. The method of claim 1, wherein:

the pulse program comprises a flow control statement; and the method comprises waiting for a signal before resuming execution of the pulse program.

25. The method of claim 1, wherein:

the pulse program comprises a conditional statement that specifies a condition expression and one or more conditioned statements; and the method comprises:

evaluating the condition expression; and executing instructions corresponding to the one or more conditioned statements only if the condition expression evaluates to a determined value.

26. The method of claim 25, wherein:

the conditioned expression comprises a variable; and the method comprises:

processing a return signal, and determining a value of the variable according to the processing of the return signal.

27. The method of claim 26, wherein the value of the variable is a fixed point or floating point number.

28. The method of claim 1, wherein:

the pulse program comprises a conditional statement that specifies a condition expression, a first conditioned statement, and a second conditioned statement; and the method comprises:

evaluating the condition expression; and executing instructions corresponding to the first conditioned statements only if the condition expression evaluates to a first value, and executing instructions corresponding to the second conditioned statement only if the condition expression evaluates to a second value.

29. The method of claim 28, wherein the first conditioned statement is a second pulse operation statement and the second conditioned statement is a third pulse operation statement.

30. The method of claim 1, wherein the method comprises:

parsing a machine specification that comprises a definition of the first pulse and a definition of the target; and generating the machine code according to the machine specification.

31. The method of claim 1, wherein:

the pulse operation statement specifies a break condition; and the method comprises:

evaluating the break condition, and stopping generation of the first pulse when the break condition evaluates to a determined value.

32. The method of claim 1, wherein:

the pulse program comprises an align statement that specifies a plurality of pulse targets; and the method comprises waiting for an execution of instructions involving any of the plurality of pulse targets to complete before beginning an execution of subsequent instructions involving any of the plurality of pulse targets.

33. The method of claim 1, wherein:

the pulse program comprises a wait statement that specifies a target and an amount of time to wait before sending a pulse to the target; and the method comprises waiting the specified amount of time.

34. The method of claim 1, wherein:

the pulse program comprises a variable assignment statement that assigns an expression to a variable that is associated with a register that can be read from and/or written to by a programming subsystem during runtime of the machine code;

the pulse operation statement references the variable.

35. The method of claim 1, wherein:

the pulse program comprises a variable declaration statement that assigns a first variable to a second variable, where the second variable is a reserved variable reference to a register that can be read from and/or written to by a programming subsystem during runtime of the machine code; and the pulse operation statement references the second variable.

36. The method of claim 1, wherein the characteristic is a slope of the first pulse.

37. The method of claim 1, wherein the characteristic is a chirp rate of the first pulse.

38. The method of claim 1, wherein the pulse program comprises a trigger wait statement operable to stop the program execution until a trigger is received.

39. The method of claim 38, wherein the trigger is generated by software.

40. The method of claim 38, wherein the trigger is generated by hardware.

* * * * *